US011842177B2

(12) United States Patent
Fitzsimons et al.

(10) Patent No.: US 11,842,177 B2
(45) Date of Patent: Dec. 12, 2023

(54) SYSTEMS AND METHODS FOR UNIFIED COMPUTING ON DIGITAL AND QUANTUM COMPUTERS

(71) Applicant: Horizon Quantum Computing PTE. LTD., Singapore (SG)

(72) Inventors: Joseph Francis Fitzsimons, Singapore (SG); Si-Hui Tan, Gentofte (DK)

(73) Assignee: HORIZON QUANTUM COMPUTING PTE. LTD., Singapore (SG)

(*) Notice: Subject to any disclaimer, the term of this patent is extended or adjusted under 35 U.S.C. 154(b) by 145 days.

(21) Appl. No.: 17/337,873

(22) Filed: Jun. 3, 2021

(65) Prior Publication Data

US 2021/0286601 A1 Sep. 16, 2021

Related U.S. Application Data

(63) Continuation-in-part of application No. PCT/SG2020/050728, filed on Dec. 9, 2020.
(Continued)

(30) Foreign Application Priority Data

Dec. 9, 2020 (WO) ................ PCT/SG2020/050728

(51) Int. Cl.
*G06F 8/41* (2018.01)
*G06N 10/00* (2022.01)
*G06F 8/72* (2018.01)

(52) U.S. Cl.
CPC ................ *G06F 8/44* (2013.01); *G06F 8/447* (2013.01); *G06F 8/72* (2013.01); *G06N 10/00* (2019.01)

(58) Field of Classification Search
CPC .. G06F 8/40–53; G06F 8/72; G06N 10/00–80
(Continued)

(56) References Cited

U.S. PATENT DOCUMENTS 5,247,696 A * 9/1993 Booth .................... G06F 8/443
717/160
10,872,021 B1 * 12/2020 Tezak .................... G06N 10/00
(Continued)

FOREIGN PATENT DOCUMENTS

| CN | 110187885 A | 8/2019 |
| JP | 5921856 B2 | 5/2016 |
| WO | WO 2021/118464 | 6/2021 |

OTHER PUBLICATIONS

JavadiAbhari, Ali, et al., ScaffCC: A Framework for Compilation and Analysis of Quantum Computing Programs, CF '14: Proceedings of the 11th ACM Conference on Computing Frontiers, May 2014, 10 pages, [retrieved on Mar. 25, 2023], Retrieved from the Internet: <URL:http://dl.acm.org/>.*
(Continued)

*Primary Examiner* — Geoffrey R St Leger
(74) *Attorney, Agent, or Firm* — Brett A. Lovejoy; Morgan, Lewis & Bockius LLP

(57) ABSTRACT

Computer systems and methods are provided for compiling a computer program to run on a quantum processor comprising a plurality of qubits, qudits or quantum continuous variables. A compiler obtains the program in a unified language, that is effectively a classical language, as opposed to a quantum language, and performs code refactoring on all or a portion of the program to form a refactored code and converts the refactored code into a first code. The compiler compiles the first code into a second code comprising a plurality of data elements in one or more quantum data structures. The compiler converts the second code to a third code expressed in a quantum gate-level language in accor-
(Continued)

dance with an instruction set and gate locality constraints of the target quantum processor.

32 Claims, 40 Drawing Sheets

Related U.S. Application Data

(60) Provisional application No. 62/945,434, filed on Dec. 9, 2019.

(58) Field of Classification Search
USPC .................................................. 717/136–161
See application file for complete search history.

(56) References Cited

U.S. PATENT DOCUMENTS

2009/0249318 A1* 10/2009 Ayguade ............... G06F 8/4442
                                                        711/E12.017
2021/0012233 A1*  1/2021 Gambetta ................. G06F 8/44

OTHER PUBLICATIONS

International Search Report, Written Opinion dated Mar. 10, 2021 in related PCT International Application No. PCT/SG20/50728 (WO 2021/118464).

Häner T. et al., A software methodology for compiling quantum programs. *Quantum Science and Technology*, Feb. 21, 2018, vol. 3, No. 2, pp. 1-18.

\* cited by examiner

A language that can be compiled and run on classical or quantum processors

HYDROGEN CODE

```
1   # Prepare two qubits
2   qubit -> a
3   qubit -> b
4
5   # Entangle qubits
6   h[a]
7   cnot[a,b]
8
9   # Measure first qubit
10  h[a]
11  measure[a] -> u
12
13  # Measure second qubit
14  rz(0.3927)[b]
15  measure[b] -> v
```

 Fully customizable gate-level language

 Focused specifically on quantum processing

 Gates and operations defined by structured text

 Compiler handles qudit routing and gate bridging

 Inbuilt gate synthesis to convert between gate sets

 Designed to integrate custom characterization to maximize performance

Figure 8

BERYLLIUM CODE

```
1  # A simple function to measure qubits
2  
3  function   ([reg,angle] ->
4  (output) {
5  
6  qubits(reg.length) ->
7  
8  for k in [reg.length] {
9    [ancilla(k)] <- 0
10   rz[angle(k)][reg(k)]
11   cnot[reg(k),ancillas(k)]
12   measure[ancillas(k)] -> output(k)
13  }
14 }
```

- Extends Hydrogen with C-like features
- Compiles down to Helium
- if( ) elseif( ) else( ) conditionals
- for and while breakable loops
- Functions
- Pointer support
- Support for classes and structs

Figure 15

Pointers

| POINTERS | |
|---|---|
| 1 | rz(-0.9817)[1] |
| 2 | cnot[2,1] |
| 3 | rz(-0.5806)[1] |
| 4 | cnot[3,1] |
| 5 | rz(0.1963)[1] |
| 6 | cnot[2,1] |
| 7 | rz(-0.1963)[1] |
| 8 | cnot[3,1] |
| 9 | rz(-0.1963)[2] |
| 10 | cnot[3,2] |
| 11 | rz(0.1963)[2] |
| 12 | cnot[3,2] |
| 13 | rz(-0.1963)[3] |
| 14 | h[3] |
| 15 | rz(0.7854)[3] |
| 16 | h[3] |
| 17 | cnot[2,1] |
| 18 | cnot[3,1] |
| 19 | rz(0.5236)[1] |
| 20 | cnot[2,1] |
| 21 | cnot[3,1] |
| 22 | rz(-0.5236)[3] |
| 23 | h[3] |

Memory locations can be passed directly as parameters, with the bit string at the memory location interpreted as an input parameter for the gate.

| 1 | rz[a,b][c] |

↑

The compiler generates a unitary quantum circuit to realize this operation.

Figure 16

CODE REFACTORING

```
1  heat_map=zeros(10000,10000);
2
3  for i=2:9999
4      for j=2:9999
5          heat_map(i,j)=(heat_map(i-1,j)/4)+(heat_map(i+1,j)/4)+(heat_map(i,j-1)/4)+(heat_map(i,j+1)/4);
6      end
7  end
8
9  extrema=0;
10 where_hottest=0;
11 row_to_search=5000;
12
13 for i=1:10000
14     heat_map_value=heat_map(row_to_search,i);
15     if heat_map_value>extrema
16         extrema=heat_map_value;
17         where_hottest=i;
18     end
19 end
20
21
22
23
24 for i=1:10000
25     if heat_map(i,i)>5
26         break;
27     end
28 end
```

Figure 19

CODE REFACTORING

```
1   heat_map=zeros(10000,10000);
2
3   for i=2:9999
4       for j=2:9999
5           heat_map(i,j)=(heat_map(i-1,j)/4)+(heat_map(i+1,j)/4)+(heat_map(i,j-1)/4)+(heat_map(i,j+1)/4);
6       end
7   end
8
9   extrema=0;
10  where_hottest=0;
11  row_to_search=5000;
12
13  for i=1:10000
14      heat_map_value=heat_map(row_to_search,i);
15  end
16
17  for i=1:10000
18      if extrema<heat_map(row_to_search,i);
19          extrema=heat_map(row_to_search,i);
20          where_hottest=i;
21      end
22  end
23
24  for i=1:10000
25      if 5<heat_map(i,i)
26          break;
27      end
28  end
```

Loop split and simplified

Reordered comparisons

Figure 20

CODE REFACTORING

```
1  heat_map=zeros(10000,10000);                                    Definition
2
3  for i=2:9999
4      for j=2:9999
5          heat_map(i,j)=(heat_map(i-1,j)/4)+(heat_map(i+1,j)/4)+(heat_map(i,j-1)/4)+(heat_map(i,j+1)/4);
6      end
7  end                                                             Exponential speed-up
8
9  extrema=0;
10 where_hottest=0;                                                Analytically solved
11 row_to_search=5000;
12
13 for i=1:10000
14     heat_map_value=heat_map(row_to_search,i);
15 end                                                             Exponential speed-up
16
17 for i=1:10000                                                   Max value search
18     if extrema<heat_map(row_to_search,i);
19         extrema=heat_map(row_to_search,i);
20         where_hottest=i;
21     end
22 end                                                             Polynomial speed-up
23
24 for i=1:10000                                                   Sequential search
25     if 5<heat_map(i,i)
26         break;
27     end
28 end                                                             Polynomial speed-up
```

```
td {
    dim_in: 2
    dim_out: 2
    kraus: [1 0; 0 0.7071067811865475-0.7071067811865475i]
}
s {
    dim_in: 2
    dim_out: 2
    kraus: [1 0; 0 i]
}
sd {
    dim_in: 2
    dim_out: 2
    kraus: [1 0; 0 -i]
}
h {
    dim_in: 2
    dim_out: 2
    kraus: [0.7071067811865475 0.7071067811865475; 0.7071067811865475 -0.7071067811865475]
}
cnot {
    dim_in: 2 2
    dim_out: 2 2
    kraus: [1 0 0 0; 0 1 0 0; 0 0 0 1; 0 0 1 0]
}
```

Figure 32A

```
cz {
  dim_in: 2 2
  dim_out: 2 2 kraus: [1 0 0 0; 0 1 0 0; 0 0 1 0; 0 0 0 -1]
} swap {
  dim_in: 2 2
  dim_out: 2 2 kraus: [1 0 0 0; 0 0 1 0; 0 1 0 0; 0 0 0 1]
} toffoli {
  dim_in: 2 2 2
  dim_out: 2 2 2 kraus: [1 0 0 0 0 0 0 0; 0 1 0 0 0 0 0 0; 0 0 1 0 0 0 0 0; 0 0 0 1 0 0 0 0; 0 0 0 0 1 0 0 0; 0 0 0 0 0 1 0 0; 0 0 0 0 0 0 0 1; 0 0 0 0 0 0 1 0]
} fredkin {
  dim_in: 2 2 2
  dim_out: 2 2 2 kraus: [1 0 0 0 0 0 0 0; 0 1 0 0 0 0 0 0; 0 0 1 0 0 0 0 0; 0 0 0 1 0 0 0 0; 0 0 0 0 1 0 0 0; 0 0 0 0 0 0 1 0; 0 0 0 0 0 1 0 0; 0 0 0 0 0 0 0 1]
}
```

Figure 32B

```
qubit {
    dim_in: 1
    dim_out: 2 kraus: [1; 0]

static: generate_qubit_label
} measure {
    dim_in: 2
    dim_out: 1 kraus: [1 0] -> 0
    kraus: [0 1] -> 1
} vnmeasure {
    dim_in: 2
    dim_out: 2 kraus: [1 0; 0 0] -> 0
    kraus: [0 0; 0 1] -> 1
}
```

Figure 32C

```
# HELIUM_web_test_prog0.q
qubit -> a
qubit -> b
qubit -> c increment k to 12
        h[k]
        cnot[k,6]
        t[k]
        rz(k)[k]
next 9 -> u measure[a] -> v
```

Figure 33A

```
# HELIUM_web_test_prog1.q
qubit -> a
qubit -> b
qubit -> c

9 -> u increment k to u
        h[k]
next measure[a] -> v gosub test gosub test2 sub test
        h[b]
        rz(u)[c]
        h[c]
Endsub sub test2
        cnot[2,3]
        h[4]
endsub
```

```
rz {
    dim_in: 2
    dim_out: 2
    params : 1 kraus: @rz
} h {
    dim_in: 2
    dim_out: 2 kraus:
[0.7071067811865475
0.7071067811865475;
0.7071067811865475 -
0.7071067811865475]
} cnot {
    dim_in: 2 2
    dim_out: 2 2 kraus: [1 0 0 0; 0 1 0 0;
0 0 0 1; 0 0 1 0]
} qubit {
    dim_in: 1
    dim_out: 2 kraus: [1; 0]

static:
generate_qubit_label
} measure {
    dim_in: 2
    dim_out: 1 kraus: [1 0] -> 0
    kraus: [0 1] -> 1
}
```

1006

```
rx {
    dim_in: 2
    dim_out: 2
    params : 1 kraus: @rx
} ry {
    dim_in: 2
    dim_out: 2
    params : 1 kraus: @ry
} xy {
    dim_in: 2 2
    dim_out: 2 2 kraus: @xy
} qubit {
    dim_in: 1
    dim_out: 2 kraus: [1; 0]

static:
generate_qubit_label
} measure {
    dim_in: 2
    dim_out: 1 kraus: [1 0] -> 0
    kraus: [0 1] -> 1
}
```

1008

```
qubit -> 1
qubit -> 2
ry(0.785398)[1]
rx(1.570796)[1]
rx(-0.000003)[2]
ry(0.785398)[2]
rx(-2.356194)[2]
xy(3.141592653589793)[1,2]
ry(0.785398)[1]
rx(0.785398)[1]
rx(0.785398)[2]
ry(0.785398)[2]
rx(2.356194)[2]
xy(3.141592653589793)[1,2]
rx(2.356194)[1]
ry(0.300000)[1]
rx(-0.785398)[1]
rx(-1.570793)[2]
measure[1]->1
measure[2]->2
```

Figure 34

```
┌─ 1004 ─────────────────┐  ┌─ 1006 ─────────────────┐  ┌─ 1008 ─────────────────┐
│ rz {                   │  │ rx {                   │  │ qubit -> 1             │
│    dim_in: 2           │  │    dim_in: 2           │  │ qubit -> 2             │
│    dim_out: 2          │  │    dim_out: 2          │  │ ry(0.785398)[1]        │
│    params : 1          │  │    params : 1          │  │ rx(1.570796)[1]        │
│                        │  │                        │  │ rx(-0.000003)[2]       │
│    kraus: @rz          │  │    kraus: @rx          │  │ ry(0.785398)[2]        │
│ }                      │  │ }                      │  │ rx(-2.356194)[2]       │
│                        │  │                        │  │ iswap[1,2]             │
│ h {                    │  │ ry {                   │  │ ry(0.785398)[1]        │
│    dim_in: 2           │  │    dim_in: 2           │  │ rx(0.785398)[1]        │
│    dim_out: 2          │  │    dim_out: 2          │  │ rx(0.785398)[2]        │
│                        │  │    params : 1          │  │ ry(0.785398)[2]        │
│    kraus:              │  │                        │  │ rx(2.356194)[2]        │
│ [0.7071067811865475    │  │    kraus: @ry          │  │ iswap[1,2]             │
│ 0.7071067811865475;    │  │ }                      │  │ rx(2.356194)[1]        │
│ 0.7071067811865475 -   │  │                        │  │ ry(0.300000)[1]        │
│ 0.7071067811865475]    │  │ iswap {                │  │ rx(-0.785398)[1]       │
│ }                      │  │    dim_in: 2 2         │  │ rx(-1.570793)[2]       │
│                        │  │    dim_out: 2 2        │  │ measure[1]->1          │
│                        │  │                        │  │ measure[2]->2          │
│ cnot {                 │  │    kraus: [1 0 0 0; 0 0 (1j) │  │                  │
│    dim_in: 2 2         │  │ 0; 0 (1j) 0 0; 0 0 0 1]│  │                        │
│    dim_out: 2 2        │  │ }                      │  │                        │
│                        │  │                        │  │                        │
│    kraus: [1 0 0 0; 0 1 0 0;│ qubit {            │  │                        │
│ 0 0 0 1; 0 0 1 0]      │  │    dim_in: 1           │  │                        │
│ }                      │  │    dim_out: 2          │  │                        │
│                        │  │                        │  │                        │
│                        │  │    kraus: [1; 0]       │  │                        │
│ qubit {                │  │                        │  │                        │
│    dim_in: 1           │  │    static:             │  │                        │
│    dim_out: 2          │  │ generate_qubit_label   │  │                        │
│                        │  │ }                      │  │                        │
│    kraus: [1; 0]       │  │                        │  │                        │
│                        │  │ measure {              │  │                        │
│    static:             │  │    dim_in: 2           │  │                        │
│ generate_qubit_label   │  │    dim_out: 1          │  │                        │
│ }                      │  │                        │  │                        │
│                        │  │    kraus: [1 0] -> 0   │  │                        │
│ measure {              │  │    kraus: [0 1] -> 1   │  │                        │
│    dim_in: 2           │  │ }                      │  │                        │
│    dim_out: 1          │  │                        │  │                        │
│                        │  │                        │  │                        │
│    kraus: [1 0] -> 0   │  │                        │  │                        │
│    kraus: [0 1] -> 1   │  │                        │  │                        │
│ }                      │  │                        │  │                        │
└────────────────────────┘  └────────────────────────┘  └────────────────────────┘
```

Figure 35

One set of echo for qubits of Aspen 7 qubit -> 1
qubit -> 2
qubit -> 3
qubit -> 4
qubit -> 5
qubit -> 6
qubit -> 7
qubit -> 8
qubit -> 9
qubit -> 10
qubit -> 11
qubit -> 12
qubit -> 13
qubit -> 14
qubit -> 15
qubit -> 16
qubit -> 17
qubit -> 18
qubit -> 19
qubit -> 20
qubit -> 21
qubit -> 22
qubit -> 23
qubit -> 24
qubit -> 25
qubit -> 26
qubit -> 27
qubit -> 28
qubit -> 29
qubit -> 30
qubit -> 31
qubit -> 32
qubit -> 33
qubit -> 34
qubit -> 35
qubit -> 36
qubit -> 37

0.5 -> Thalf wait(Thalf)[33]
x[33]
wait(Thalf)[33]
x[33]

measure[33] -> 33

Figure 36

Echo by parity for qubits of Aspen 7 qubit -> 1
qubit -> 2
qubit -> 3
qubit -> 4
qubit -> 5
qubit -> 6
qubit -> 7
qubit -> 8
qubit -> 9
qubit -> 10
qubit -> 11
qubit -> 12
qubit -> 13
qubit -> 14
qubit -> 15
qubit -> 16
qubit -> 17
qubit -> 18
qubit -> 19
qubit -> 20
qubit -> 21
qubit -> 22
qubit -> 23
qubit -> 24
qubit -> 25
qubit -> 26
qubit -> 27
qubit -> 28
qubit -> 29
qubit -> 30
qubit -> 31
qubit -> 32
qubit -> 33
qubit -> 34
qubit -> 35
qubit -> 36
qubit -> 37

Figure 37A

```
1 -> Tfull
0.5 -> Thalf wait(Thalf)
Apply decoupling sequence on odd qubits
x[1]
x[3]
x[5]
x[7]
x[9]
x[11]
x[13]
x[15]
x[17]
x[19]
x[21]
x[23]
x[25]
x[27]
x[29]
x[31]
x[33]
x[35]
x[37]
wait(Thalf)
Apply decoupling sequence on odd qubits
x[1]
x[3]
x[5]
x[7]
x[9]
x[11]
x[13]
x[15]
x[17]
x[19]
x[21]
x[23]
x[25]
x[27]
x[29]
x[31]
x[33]
x[35]
x[37]

measure[33] -> 33
```

Figure 37B

SYSTEMS AND METHODS FOR UNIFIED COMPUTING ON DIGITAL AND QUANTUM COMPUTERS

CROSS REFERENCE TO RELATED APPLICATIONS

This application claims priority to PCT Application No. PCT/SG2020/050728, entitled "Systems and Methods for Unified Computing on Digital And Quantum Computers," filed Dec. 9, 2020, which claims priority to U.S. Provisional Patent Application No. 62/945,434, entitled "Systems and Methods for Unified Computing on Digital and Quantum Computers," filed Dec. 9, 2019, each of which is hereby incorporated by reference in its entirety.

TECHNICAL FIELD

The present disclosure relates generally to a compilation of code that affords unified computing across both classical and quantum processors.

BACKGROUND

Utilizing quantum computations require different considerations than classical computations. One such consideration is that an architecture of quantum computers differs considerably from architectures of classical computers. As such, an aspect of this consideration is the differences in available computational models for quantum computers and classical computers. For instance, when utilizing quantum computers, an error may occur due to an inherent aspect of a quantum system. As one example, a user can provide an operational command as input anticipating a first operation executed at a gate, but actually observe that the gate conducts a second operation other than the first operation in response to the input. When further considering the number of subjects skilled in the art of quantum algorithms in comparison to the number of subjects skilled in the art of conventional, digital software algorithms, access to quantum computing is relatively limited.

One solution to promote access to quantum computer includes open source development tools that encourage subjects to use a particular platform with a goal that this will lead to a boom in quantum computing algorithms. Despite this, to date, the number of subjects skilled in the art of quantum algorithms remains small. By way of example, in terms of quantum computing, a majority of implementations provided by these subjects include variational techniques— being relatively similar and simple in nature. As such, these subjects rarely lead to an emergence of fundamentally new algorithms that are not already known to one of skill in the art of quantum computing. While those skilled in the art of quantum computing produce novel algorithms in quantum computing, others that are skilled in other areas of computer science have not necessarily been adopting quantum computing platforms nor contributing new applications for quantum computing.

Accordingly, what is needed in the art are computing approaches in which source code, written in a unified computing language, is compiled to be run on quantum computers and/or conventional digital computers.

SUMMARY

The present disclosure addresses the above-identified shortcomings by introducing a quantum compiler that compiles source code, written in a unified computing language, such that the source code can be run on quantum computers and/or conventional digital computers. While the architectures of quantum and classical computers are indeed different, it is the differences in the underlying computational model that motivated the basis for approach taken in the systems and methods of the present disclosure. In order to gain a computational advantage from a quantum computer, it is necessary to take advantage of interference between different computational branches, which is not a notion that exists in conventional computing and is quite counter-intuitive. The motivation for the disclosed system and methods is to address this problem by allowing users to program in a language they are familiar with while the system automatically takes advantage of the interference to accelerate the computation.

One aspect of the present disclosure provides a computer system for compiling a computer program that can be run on a target quantum computer, such as a first target quantum computer comprising a plurality of qudits, qubits, or quantum continuous variables (QCVs) and a digital computer. The computer system includes one or more processors, a memory, and one or more programs in the form of a compiler. The compiler comprises a unified level module that obtains a computer program written in a unified language (e.g., carbon).

When configured to produce code that can be run on a digital computer, rather than a target quantum computer, the unified level module converts the computer program written in the unified language into source code that can be compiled or interpreted for digital computers directly (e.g., in the form of Matlab, Octave C, C++, Fortran, etc.) using conventional tools.

When configured to produce code that can be run on a quantum computer, the unified level module is capable of performing code refactoring on all or a portion of the computer program and converting the refactored code into a first code in a high level quantum language (e.g., beryllium language). In some embodiments, this refactoring is achieved by first replacing some combination of a plurality of loops and/or other programming structures in the refactored code with one or more calls to a plurality of specialized functions that produce the same output, or substantially the same output, which can be accelerated using some combination of classical and quantum processing. In addition, in some embodiments, one or more operations on various abstract data types in the unified level code is implemented using one or more quantum data structures and/or quantum algorithms. Furthermore, in some embodiments, the unified level module performs a refactoring function on all or a portion of the computer program associated with one or more recursive functions and function calls. Accordingly, in such embodiments, the unified level module performs refactoring on the one or more recursive functions and function calls into a sequence of simpler function calls. Furthermore, the unified level module further classifies each of the one or more recursive functions and function calls and replaces the one or more recursive functions and function calls with a more efficient procedure that achieves the same, or substantially the same, end result.

The first code, in the high level quantum language, replaces the computer program written in the unified language. The high level quantum language provides one or more quantum data structures that are determined from the one or more classical data types in the first code. In some embodiments, the high level quantum language provides support for functions, loops, recursion, pointers, and/or data structure ("struct") and object ("class") definitions.

In some embodiments, lower levels of the compiler break down these operations into simpler operations until the code consists of individual gate operations.

In some embodiments, the compiler further comprises a high level module that receives the first code for instance in the form of an internal data structure, that implements functions and data types used by the unified level source code, and produces a second code in a low level quantum language (e.g., helium) In some embodiments, this occurs in the form of an abstract syntax tree with some ancillary information. In some embodiments, the second code includes a plurality of data elements in one or more quantum data structures determined by the high level module from one or more classical datatypes in the first code. In some embodiments, the compiler further comprises a low level module that receives the second code, optionally optimizes the code to improve performance, and converts the optimized second code (e.g., in the form of an optimized abstract syntax tree) to a series of gate level operations, thereby forming a third code. This third code is typically not flat code, but rather an internal representation of the parsed second code. The compiler further comprises a gate level module that compiles the second code or the third code into fourth code, optionally implementing error mitigation procedures and gate synthesis, where the fourth code is expressed in a quantum gate-level language in accordance with the constraints of the instruction set and gate locality constraints of the target quantum computer. While the system has been described as having four discrete modules (a unified level module, a high level module, a low level module, and a gate level module), it will be appreciated that the features in any of these modules can be moved to another of the modules, that modules can be merged together, or that additional modules that have some of the detailed in the present disclosure can be added to the disclosed four modules. That is, one of skill in the art will appreciate that it would be possible to add an extra module or to combine the functionality of multiple modules in order to reduce the number of modules (levels) and that all such variations are within the scope of the present disclosure.

Another aspect of the present disclosure provides a digital computer system for compiling a computer program for a target quantum processor comprising a plurality of qubits, qudits, or quantum continuous variables. The computer system comprises one or more digital processors, a memory, and one or more programs in the form of a compiler. The compiler comprises a unified level module that obtains a computer program written in a unified language (e.g., carbon) and performs code refactoring on all or a portion of the computer program to form a refactored code and converts the refactored code into a first code (e.g., beryllium). The compiler further comprises a high level module that compiles the first code (e.g., beryllium) into a second code (e.g., helium). The second code includes a plurality of data elements in one or more quantum data structures determined by the high level module from one or more classical datatypes in the first code. In some embodiments, the compiler further comprises a low level module that receives the second code (helium) and converts the second code to a third code (hydrogen) comprising a series of quantum gate level operations. The compiler further comprises a gate level module that compiles the second code (beryllium) or the third code (hydrogen) into a fourth code expressed in a quantum gate-level language in accordance with the instruction set and gate locality constraints of the target quantum processor. In some embodiments the unified level module, the high level module, the low level module, and the gate level module are in the form of less than four distinct modules. For instance, in some embodiments, the unified level module and the high level module are a single module. In some embodiments the unified level module, the high level module, the low level module, and the gate level module are in the form of more than four distinct modules. For instance, in some embodiments, the high level module is in fact two or more component modules, where some of the features disclosed herein for the high level module are distributed in the two or more component modules.

Yet another aspect of the present disclosure provides a computer system for compiling a computer program for a target quantum processor. The target quantum processor includes a plurality of qubits, qudits, and/or quantum continuous variables. The computer system includes one or more digital processors, a memory, and one or more programs in the form of a compiler. The compiler includes a unified level module that obtains a computer program written in a unified language and performs code refactoring on all or a portion of the computer program to form a refactored code and converts the refactored code into a first code. The compiler further includes a high level module that compiles the first code into a second code. The second code includes a plurality of data elements in one or more quantum data structures determined by the high level module from one or more classical datatypes in the first code. Additionally, the compiler includes a gate level module that compiles the third code into a fourth code expressed in a quantum gate-level language in accordance with the instruction set and gate locality constraints of the target quantum processor.

In some embodiments, the unified level module performs code refactoring by replacing a source loop in the computer program written in the unified language with a plurality of loops that collectively accomplish a result of the source loop, where a complexity (e.g., number of instructions) of each loop in the plurality of loops is less than that of the source loop.

In some embodiments, the unified level module performs code refactoring by replacing a source loop in the computer program written in the unified language with a plurality of loops that collectively accomplish a result of the source loop. In such embodiments, a complexity (e.g., number of instructions) of each loop in the plurality of loops is initially greater than that of the source loop and then less than that after the source loop after performing the code refactoring.

In some embodiments, the unified level module performs code refactoring by analytically solving a source loop in the computer program written in the unified language.

In some embodiments, the unified level module performs code refactoring by replacing a loop in the plurality of loops with an object constructer call.

In some embodiments, the unified level module performs code refactoring by encoding a portion of the computer program written in the unified language to perform a quantum algorithm that performs a function of the portion of the computer program. In some such embodiments, the quantum algorithm is an amplitude amplification-based quantum algorithm.

In some embodiments, the high level module provides access to quantum gate level commands specified in the first code, and supports pointers that are encoded on qubits, qudits, or quantum continuous variables in the plurality of qubits, qudits, or quantum continuous variables, functions, loops that cannot be unrolled, recursion, pointers, data structure definitions, and/or class object definitions located in the first code, or any combinations thereof.

In some embodiments, the first code defines a quantum data structure. In some embodiments, the compiler implements data types using quantum means using either quantum states to store the data or manipulating classical data structures using quantum algorithms. One example of this in accordance with the present disclosure is the implementation of matrix operations not as they would be performed on a classical computer, but rather in a uniquely quantum way that allows for better performance than is possible classically (in order to achieve better performance trade-offs between operations for the data types supported). For matrix algebra, this is done by storing a procedure to generate the (i,j)-th entry of the matrix, and then defining quantum procedures to perform various matrix operations based on this.

In some embodiments, the unified language is limited to digital instructions (i.e., purely classical instructions).

In some embodiments, the second code is written in a gate level language that is augmented with a conditional and the second code includes a conditional. In some such embodiments, the conditional is an "if" condition or "repeat" condition in which an action is repeated until a predetermined condition is achieved. In some such embodiments, the predetermined condition is a classical measurement outcome for one or more qubits, qudits, or continuous quantum variables defined by the second code.

In some embodiments, the gate level language is augmented with support for one or more subroutine, in which one portion of the second code is repeatedly called by another portion of the second code until a predetermined outcome is achieved. In some such embodiments, the one or more subroutines include measurement subroutines. In some such embodiments, the measurement subroutine makes use of ancilla qubits or qudits in the plurality of qubits or qudits to improve a measurement outcome. In some embodiments, the predetermined outcome is a measurement outcome for one or more qubits or qudits defined by the second code.

In some embodiments, the conditional is an increment loop, also known as a "for" loop in languages such as "C". In some embodiments, the conditional is a parameter of the increment loop, such as an exit condition parameter of the increment loop.

In some embodiments, the low level module converts the second code to the third code at least in part by optimizing code within the conditional to form an optimized conditional, where an iteration of a code sequence specified by the optimized conditional has fewer instructions than an iteration of a code sequence specified by the conditional, unrolling the optimized conditional into a series of quantum gates, and incorporating the series of quantum gates into the third code. It will be appreciated that, in typical instances, not all code can be optimized to reduce the number of instructions, since some code is already optimal and some optimizations are computationally difficult to determine.

In some embodiments, the low level module converts the second code to the third code at least in part by optimizing a quantum operation that serves to perform a portion of the second code, thereby reducing a number of gates or a number of qubits, qudits, and/or quantum continuous variables in the third code that are needed to perform the quantum operation.

In some embodiments, the second code defines a qubit or a qudit within the target quantum processor. In some embodiments, the second code defines a register of qubits or a register of qudits within the target quantum processor.

In some embodiments, the gate level language supports qubit, qudit, or quantum continuous variable measurement.

In some embodiments, the quantum gate-level language uses a plurality of different gates. In some embodiments, each respective gate in the plurality of different gates is defined in a different data structure that includes a name of the respective gate, a first dimension of a respective input of a respective subsystem-gate (in terms of a number of qubits, qudits, or quantum continuous variables) and/or a second dimension of a respective output of the respective subsystem-gate (in terms qubits, qudits, or quantum continuous variables), and a corresponding plurality of Kraus operators for the respective gate. In some such embodiments, the corresponding plurality of Kraus operators for the respective gate is specified by a function handle. In other embodiments, a subset of the corresponding plurality of Kraus operators for the respective gate is specified by a function handle.

In some embodiments, the third code supports general positive operator-valued measures of one or more qubits, qudits, or quantum continuous variables in the plurality of qubits, qudits, or quantum continuous variables.

In some embodiments, the gate level model compiles the third code into the fourth code at least in part by performing gate synthesis in which a sequence of ideal gates, which implement at least a portion of the third code, are swapped with a sequence of gates that differ from the sequence of ideal gates but will perform the function, substantially the function, or approximately the function, of the sequence of ideal gates on the target quantum processor. In other embodiments, the sequence of gates that differ from the sequence of ideal gates perform a substantially or approximately similar function of the sequence of ideal gates on the target quantum processor. Moreover, in such embodiments, the performance of the substantially or approximately similar function is approximated to within a predetermined threshold of the function of the sequence of ideal gates. In some such embodiments, the sequence of gates that differ from the sequence of ideal gates are identified by a stored hardware characterization of the target quantum processor.

In some embodiments, the compiler further comprises instructions for circuit embedding of the fourth code while adhering to locality constraints of the target quantum processor.

In some embodiments, the instructions for circuit embedding of the fourth code while adhering to locality constraints of the target quantum processor further comprises taking into account a determined quality of the target quantum processor at performing 2-subsystem gates.

In some embodiments, the compiler further comprises instructions for counting a number of gates, qubits, qudits, quantum continuous variables or wall clock time (the real time taken to perform a computation as it would be measured by a watch or clock as opposed to simple gate counts or circuit depth counts) needed to implement the computer program on the target quantum processor.

In some embodiments, the compiler further comprises instructions for implementing a first portion of the computer program on the target quantum processor and a second portion of the computer program on a digital central processing unit or a graphical processing unit of a digital computer system.

In some embodiments, the compiler further comprises instructions for simulating quantum code generated by the compiler on a digital central processing unit or a graphical processing unit of a digital computer system.

Another aspect of the present disclosure provides a method of compiling a computer program that can be run on a target quantum processor, comprising a plurality of qubits qudits, and/or quantum continuous variables. The method is performed at a digital computer system comprising one or more digital processors and a memory, where the memory comprises non-transitory instructions configured to perform a procedure using the one or more digital processors. This procedure comprises obtaining, with a unified level module, a computer program written in a unified language. The procedure further comprises performing, with the unified level module, code refactoring on all or a portion of the computer program to form a refactored code. The procedure further comprises converting the refactored code into a first code (which includes one or more classical data types). The procedure further comprises compiling, (e.g., with a high level module), the first code into a second code, where the high level module supports loops, subroutines and flow control instructions within the first code. The procedure further comprises converting, (e.g., with a low level module), the second code to a third code comprising a series of quantum gate level operations and compiling, (e.g., with a gate level module), the third code into a fourth code expressed in a quantum gate-level language in accordance with the instruction set and gate locality constraints of the target quantum processor. In some embodiments the unified level module, the high level module, the low level module, and the gate level module are in the form of less than four distinct modules. For instance, in some embodiments, the unified level module and the high level module are a single module. In some embodiments the unified level module, the high level module, the low level module, and the gate level module are in the form of more than four distinct modules. For instance, in some embodiments, the high level module is in fact two or more component modules, where some of the features disclosed herein for the high level module are distributed in the two or more component modules.

Another aspect of the present disclosure provides a non-transitory computer readable storage medium storing one or more programs. The one or more programs comprise instructions, which when executed by a digital computer system with one or more digital processors, cause the digital computer system to perform a procedure. The procedure comprises obtaining, (e.g., with a unified level module), a computer program written in a unified language. The procedure further comprises performing, (e.g., with the unified level module), code refactoring on all or a portion of the computer program to form a refactored code. The procedure further comprises converting the refactored code into a first code. The procedure further comprises compiling, (e.g, with a high level module), the first code into a second code. This aspect of the procedure supports loops, subroutines and flow control instructions within the first code. The procedure further comprises converting, (e.g., with a low level module), the second code to a third code comprising a series of quantum gate level operations. The procedure further comprises compiling, (e.g., with a gate level module), the third code into a fourth code expressed in a quantum gate-level language in accordance with the instruction set and gate locality constraints of the target quantum processor. In some embodiments the unified level module, the high level module, the low level module, and the gate level module are in the form of less than four distinct modules. For instance, in some embodiments, the unified level module and the high level module are a single module. In some embodiments the unified level module, the high level module, the low level module, and the gate level module are in the form of more than four distinct modules. For instance, in some embodiments, the high level module is in fact two or more component modules, where some of the features disclosed herein for the high level module are distributed in the two or more component modules.

BRIEF DESCRIPTION OF DRAWINGS

FIG. 8 illustrates the features of the gate level of a quantum compiler architecture for compiling unified computing language code into code that can be run on quantum computers and/or digital computers in accordance with an embodiment of the present disclosure.

FIG. 15 illustrates the features of the high level of a quantum compiler architecture for compiling unified computing language code into code that can be run on quantum computers and/or digital computers in accordance with an embodiment of the present disclosure.

FIG. 16 illustrates support for a pointer in a quantum compiler architecture for compiling unified computing language code into code that can be run on quantum computers and/or digital computers in accordance with an embodiment of the present disclosure.

FIG. 19 illustrates source code that can be refactored using a quantum compiler architecture in accordance with an embodiment of the present disclosure.

FIG. 20 illustrates breaking up the source code of FIG. 19 into discrete segments using the disclosed compiler architecture in accordance with an embodiment of the present disclosure.

FIG. 21 illustrates refactoring the code of FIG. 20 for quantum computation using the disclosed compiler architecture in accordance with an embodiment of the present disclosure.

FIGS. 32A, 32B, and 32C illustrate the definition of gates in accordance with an embodiment of the present disclosure.

FIGS. 33A and 33B illustrate example helium programs in accordance with an embodiment of the present disclosure.

FIG. 34 illustrates gate synthesis where the target quantum system includes continuously parameterized gates (there is a parameter such as an angle which can take on a continuous range of values), where the gates themselves in this example act on qubits in accordance with an embodiment of the present disclosure.

FIG. 35 illustrates gate synthesis where the gate set is discrete (there are only finitely many possible gates, no continuous parameters), where the gates act on qubits, in accordance with an embodiment of the present disclosure.

FIG. 36 illustrates a spin-echo error mitigation strategy as implemented in accordance with an embodiment of the present disclosure.

FIGS. 37A and 37B illustrate echo-by-parity error mitigation strategy as implemented in accordance with an embodiment of the present disclosure.

Like reference numerals refer to corresponding parts throughout the several views of the drawings.

DETAILED DESCRIPTION

Figure 1:
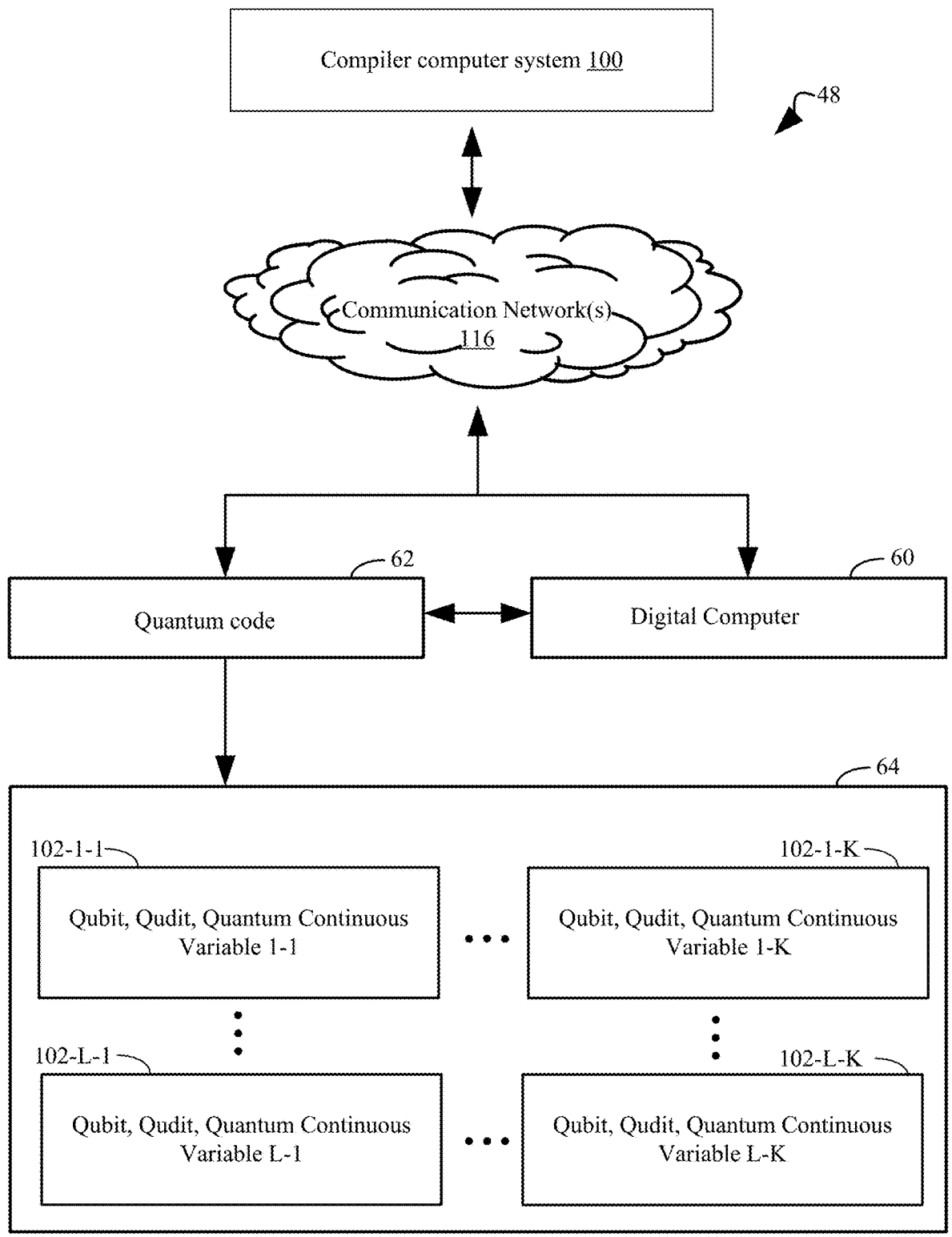
FIG. 1 is a schematic diagram showing aspects of an example system that includes both a digital computer system and a quantum computer, in accordance with an embodiment of the present disclosure.

Disclosed are computer systems and methods for compiling a computer program that can be run on a target quantum computer, comprising a plurality of qubits, qudits or quantum continuous variables, and/or a digital computer. The disclosed compiler obtains a computer program written in a unified language and performs code refactoring on all or a portion of the computer program to form a refactored code and converts the refactored code into a first code. The compiler compiles the first code into a second code, where the second code allows for loops, subroutines and flow control instructions. The compiler converts the second code to a third code comprising a series of quantum gate level operations. The compiler compiles the third code into a fourth code expressed in a quantum gate-level language in accordance with the instruction set and gate locality constraints of the target quantum computer.

Reference will now be made in detail to embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, components, circuits, and networks have not been described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first code could be termed a second code, and, similarly, a second code could be termed a first code, without departing from the scope of the present disclosure. The first code and the second code are both code, but they are not the same code.

The terminology used in the present disclosure is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

FIG. 1 illustrates a computer system topology 48 for providing a unified language that can be compiled and run on either digital computer 60 or a quantum computer 64 comprising a plurality of qubits, qudits, or quantum continuous variables 102. Referring to FIG. 1, in typical embodiments, the topology includes a compiler computer system 100 that is in electronic communication with a quantum computer 64 including a plurality of qubits, qudits, or quantum continuous variables 102 and a digital computer 60. In some embodiments, the compiler computer system 100 and the digital computer 60 are the same computer or same computer system. In some embodiments the electronic communication between the compiler computer system 100 and the quantum computer 64 is over a communication network 116. In some embodiments, the compiler computer system 100 applies suitable quantum codes 62 to the quantum computer 64 once the quantum codes 62 have been compiled.

For purposes of illustration in FIG. 1, the compiler computer system 100 and the digital computer system 60 are each represented as a single respective computer that includes all of the functionality of digital computer systems. However, the disclosure is not so limited. The functionality of the compiler computer system 100 and/or digital computer 60 may be spread across any number of networked computers and/or reside on each of several networked computers. One of skill in the art will appreciate that a wide array of different computer topologies is possible for the compiler computer system 100 and all such topologies are within the scope of the present disclosure.

Figure 2:
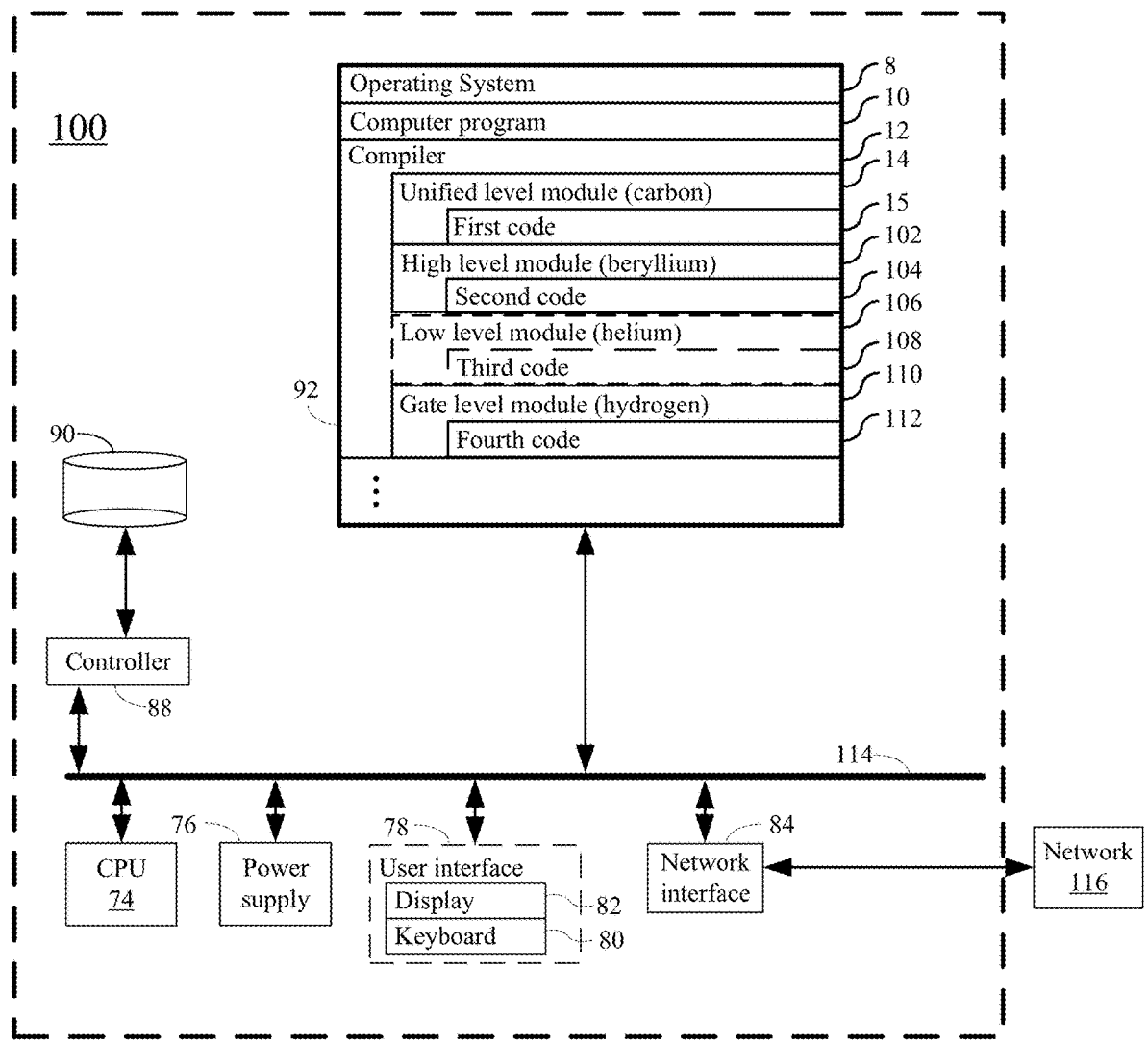
FIG. 2 is a schematic diagram of a digital computer system for compiling unified computing language code into code that can be run on quantum computers and/or digital computers in accordance with an embodiment of the present disclosure, in which optional elements are indicated by dash boxes and/or dash lines.

Turning to FIG. 2 with the foregoing in mind, a compiler computer system 100 comprises one or more processing units (CPU's) 74, a network or other communications interface 84, a user interface 78 (e.g., including an optional display 82 and optional keyboard 80 or, optionally, another form of input device) a memory 92 (e.g., random access memory), one or more magnetic disk storage and/or persistent devices 90 optionally accessed by one or more controllers 88, one or more communication busses 114 for interconnecting the aforementioned components, and a power supply 76 for powering the aforementioned components. Data in memory 92 can be seamlessly shared with non-volatile memory 90 using known computing techniques such as caching. Memory 92 and/or memory 90 can include mass storage that is remotely located with respect to the central processing unit(s) 74. In other words, some data stored in memory 92 and/or memory 90 may in fact be hosted on computers that are external to compiler computer system 100 but that can be electronically accessed by the compiler computer system over an Internet, intranet, or other form of network or electronic cable using network interface 84.

The memory 92 of the compiler computer system 100 stores:
an operating system 8 that includes procedures for handling various basic system services;
a computer program written in a unified language 10; and
a compiler 12 for compiling the computer program that can be run on a target quantum computer, comprising a plurality of qubits, qudits or quantum continuous variables, and/or a digital computer, the compiler including instructions (e.g., in the form of a unified level module 14) for obtaining the computer program 10 written in the unified language and performing refactoring on all or a portion of the computer program to form refactored code and converting the refactored code into a first code (15), instructions (e.g. in the form of a high level module 102) for compiling the first code into a second code 104, where the second code 104 allows for loops, subroutines and flow control instructions, optionally, instructions (e.g., in the form of a low level module 106) that receives the second code 104 and converts the second code 104 to a third code 108 including a series of quantum gate level operations; and instructions (e.g., in the form of a gate level module 110) for compiling the third code 108 into fourth code 112, where the fourth code is expressed in a quantum gate-level language in accordance with the instruction set and gate locality constraints of the target quantum computer 64.

In some implementations, one or more of the above identified data elements or modules of the compiler computer system 100 are stored in one or more of the previously disclosed memory devices, and correspond to a set of instructions for performing a function described above. The above identified data, modules or programs (e.g., sets of instructions) need not be implemented as separate software programs, procedures or modules, and thus various subsets of these modules may be combined or otherwise re-arranged in various implementations. In some implementations, the memory 92 and/or 90 optionally stores a subset of the modules and data structures identified above. Furthermore, in some embodiments the memory 92 and/or 90 stores additional modules and data structures not described above.

While the number of people that make use of quantum algorithms is small, the number of people that have GitHub accounts, and thus can be considered conventional software engineers, is large, on the order of a hundred million people. Efforts to expand the number of workers that make use of quantum algorithms has included opensource quantum development tools. Despite such effort to expand the number of works that make use of quantum algorithms, to date, the number of people that work on quantum algorithms remains small. Further still, there is a paucity of fundamentally new quantum algorithms emerging from the community of quantum algorithm users One of the purposes of the systems and methods of the present disclosure is to address the shortcomings in both the number of workers that make use of quantum algorithms, and the discovery of fundamentally new quantum algorithms.

Figure 31:
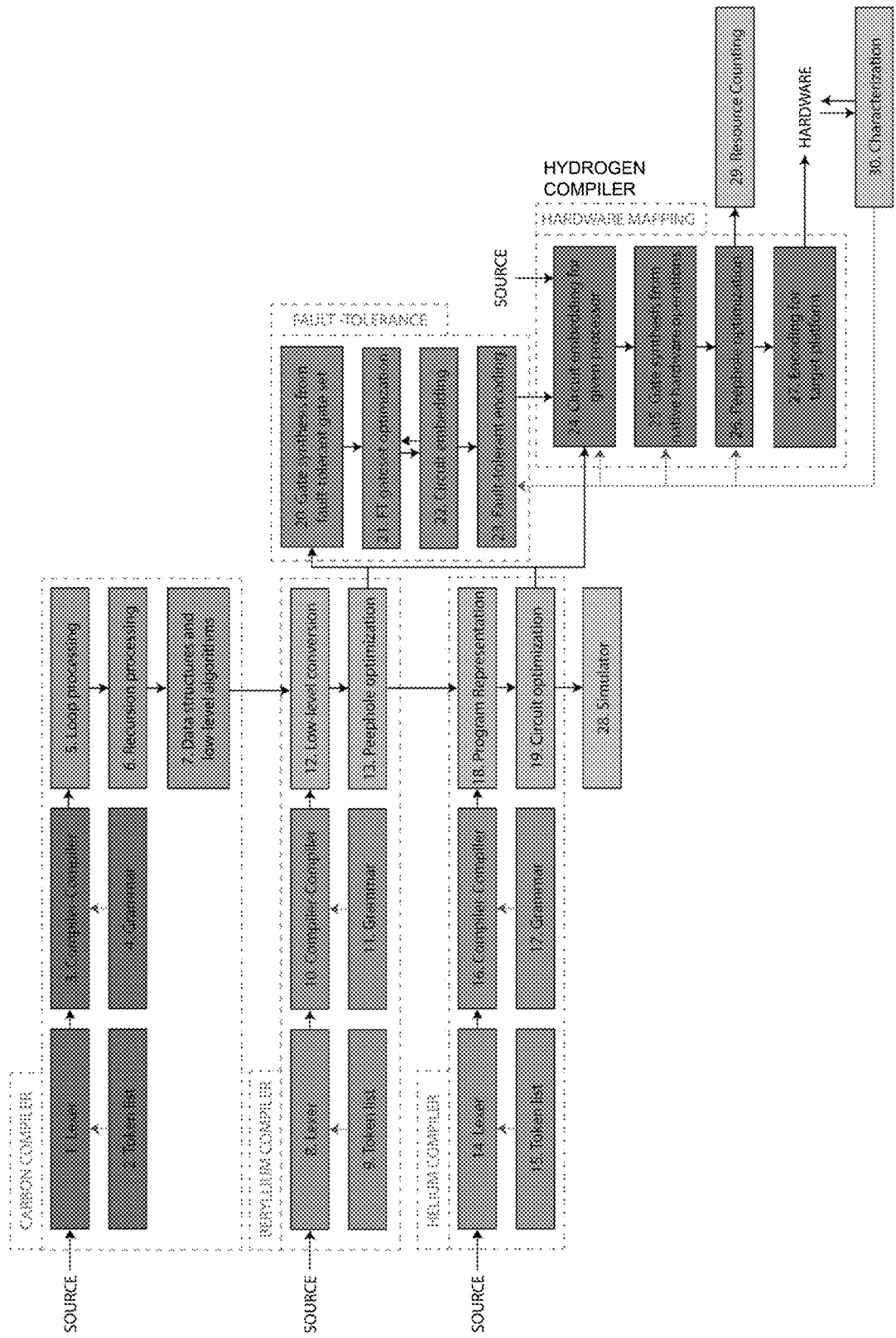
FIG. 31 illustrates a quantum compiler architecture for compiling unified computing language code into code that can be run on quantum computers and/or digital computers in accordance with an embodiment of the present disclosure.

With reference to FIG. 31, the present disclosure provides a novel approach for the compilation of a unified language that can be run on either a digital computer 60 or a target quantum computer 64.

Figure 22:
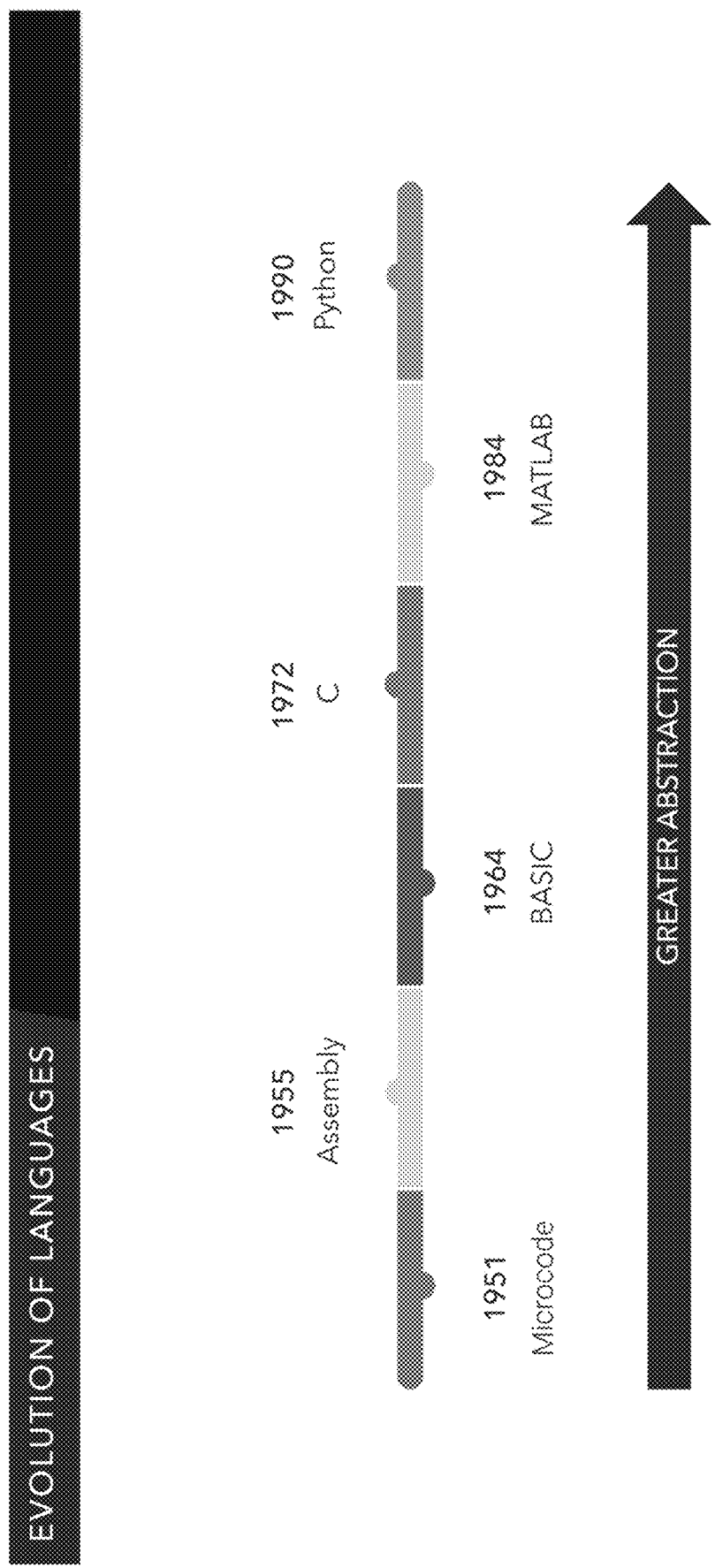
FIG. 22 illustrates evolution of languages in accordance with the prior art.

Referring briefly to FIG. 22, a background for the systems and methods of the present disclosure is provided with consideration of various exemplary milestones in the history of programming languages for digital computers. As time progressed, languages for a digital computer 60, such as BASIC and C, emerged from the microcode and assembly languages previously available to subjects. Each emergence of a novel programming language brought forth increasingly high levels of abstraction for writing computations. Accordingly, a subject writing code for a digital computer 60 using a conventional programming language such as Matlab or Python does not care how the processor(s) of the digital computer 60 operator in order to execute the subject written code. Said otherwise, the subject does not need to consider details regarding the architecture of the digital computer 60 because such considerations are taken care of by an interpreter of the programming language.

Figure 4:
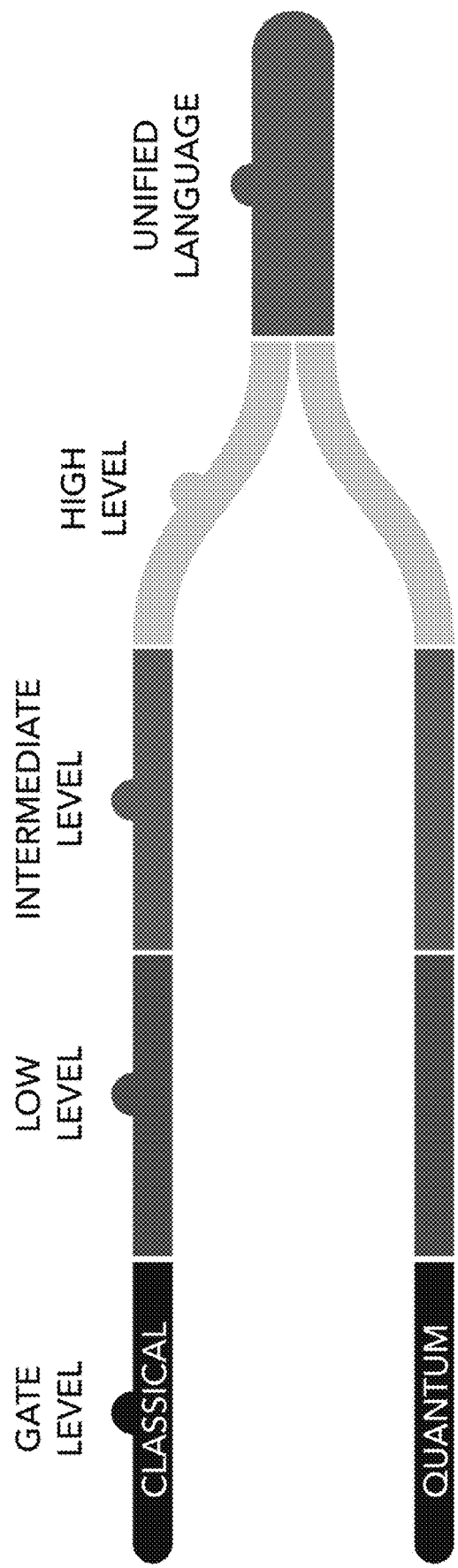
FIG. 4 illustrates the stages of a compiler architecture that compiles unified computing language code into code that can be run on quantum computers and/or digital computers in accordance with an embodiment of the present disclosure.

With reference to FIG. 4, classical, computational languages such as Matlab, Python, and Octave are already considered to be at a sufficiently high level of abstraction that these computational languages can be used by a subject to express what the subject wants to algorithmically accomplish. Accordingly, the code written by the subject, at this level of high abstraction, serves as the basis for a further code that is then compiled by the compiler 12 for use with quantum algorithm techniques run on quantum computers to gain a performance advantage over the same code running on a purely digital computer (e.g., digital computer 60 of FIG. 1).

Figure 5:
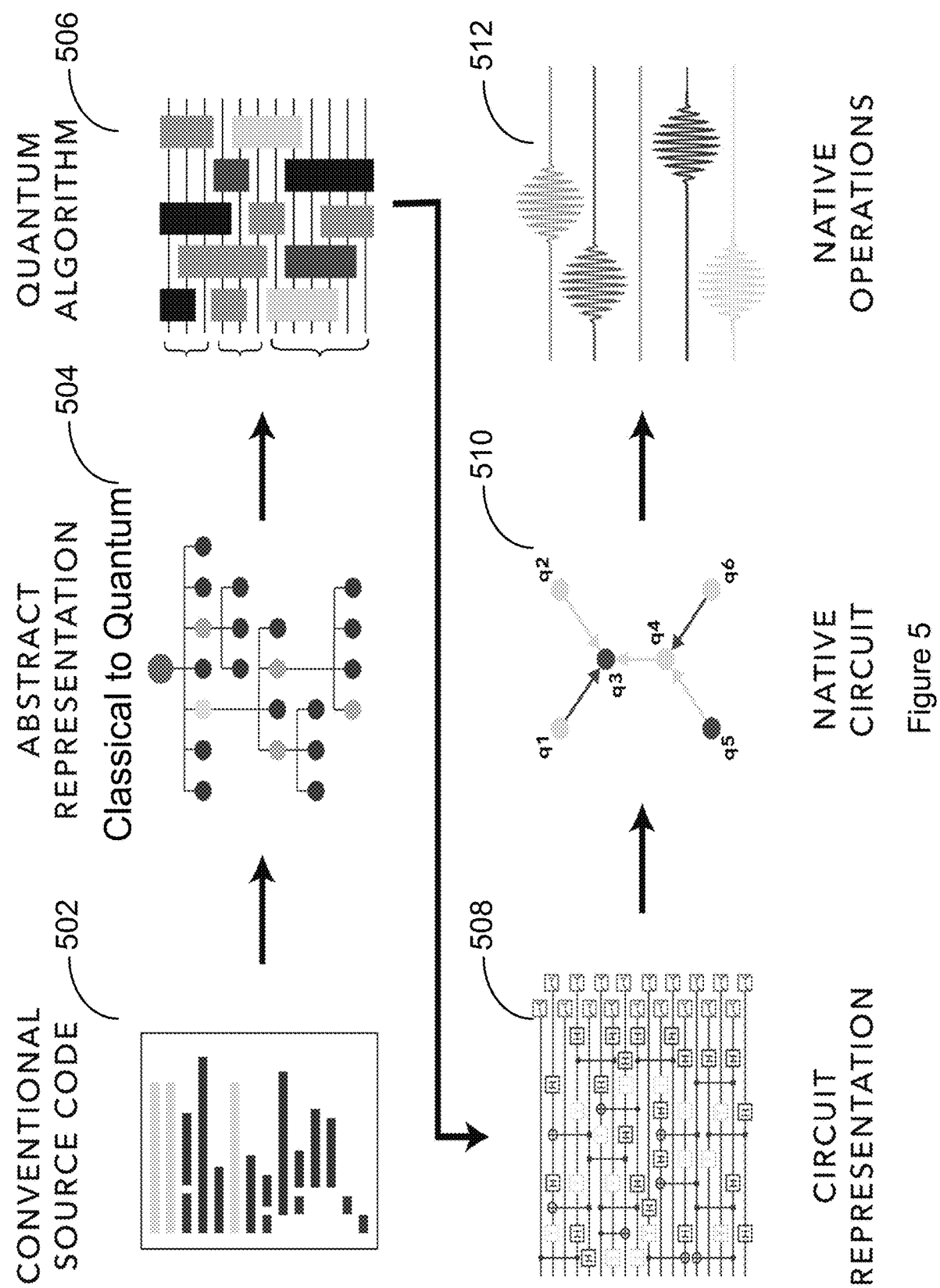
FIG. 5 illustrates the stages of a quantum compiler architecture that compiles unified computing language code into code that can be run on quantum computers in accordance with an embodiment of the present disclosure.

Referring to FIG. 5, systems and methods for accomplishing the various procedures of the compiler 12, in accordance with embodiments of the present disclosure, are provided. Specifically, an input is provided (e.g., through a digital computer 60) by a subject as a conventional source code 502. For instance, in some embodiments, the conventional source code 502 is provided by the subject in a digital computer 60 programming language such as Matlab, Python, Octave, and the like that similarly provides a high level of computational abstraction. Accordingly, the compiler 12 generates a corresponding abstract representation 504 of the inputted conventional source code 502 provided by the subject. In so doing, in some embodiments, a syntax tree is constructed from the conventional source code 502. However, the present disclosure is not limited thereto. From the abstract representation 504, one or more attempts is made to construct a quantum algorithm 506. Accordingly, the quantum algorithm 506 is translated into a circuit representation 508, and this circuit representation 508 is further converted into a native circuit 510 for the target quantum computer 64. Accordingly, in some embodiments, the native circuit 510 is converted by outputting 512 a plurality of operations that is native to the target quantum computer 64. in some embodiments, the outputting 512 of the present disclosure includes outputting into a quantum programming language for the quantum computer 64, such as Quil (Smith et al., 2016), "A Practical Quantum Instruction Set Architecture," arXiv:1608.03355 [quant-ph]) or cQASM (Bertels et al., 2018 May 24, "cQASM v1.0: Towards a Common Quantum Assembly Language," arXiv: 1805.09607v1 [quant-ph]). In other embodiments, the outputting 512 of the compiler 12 includes outputting one or more pulse sequences for the quantum computer 64. However, the present disclosure is not limited thereto. For instance, in some embodiments, the compiler 12 provides for outputting 512 one or more instructions utilized by various control hardware in communication with the quantum computer 64. Specifically, in some embodiments, the compiler 12 provides for outputting 512 the native circuit 510 as one or more instructions that is in a predetermined format utilized to program that various control hardware. Accordingly, the control hardware sends and/or receives signals to the quantum computer 64. By way of example, in some embodiments, the signals sent to and/or received from the quantum computer 64 include a sequencer, an arbitrary waveform generator (e.g., an arbitrary waveform generator), and the like. From this, the compiler 12 allows for implementing various conventional programming language features, such as the "repeat . . . until" loops, in a quantum computer 64 language that otherwise would not otherwise be possible or practical for such implementations, such as QASM. In this way, in some embodiments, the compiler 12 provides a code expressing a finite state machine to be implemented by the control hardware portion of the quantum computer 64. However, the present disclosure is not limited thereto.

Figure 6:
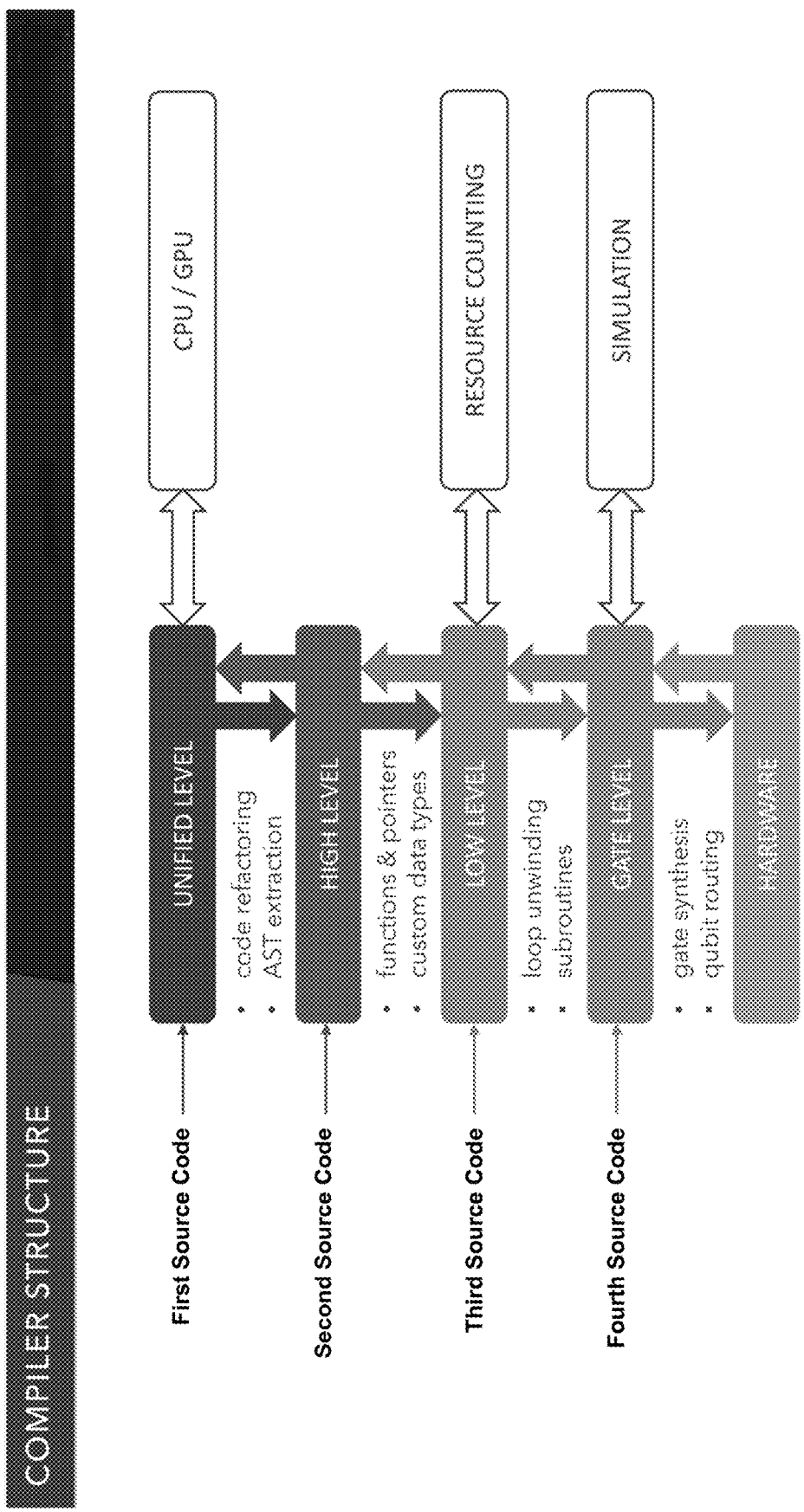
FIG. 6 illustrates the stages of a quantum compiler architecture that compiles unified computing language code into code that can be run on quantum computers, including a unified level, a high level, a low level, and a gate level in accordance with an embodiment of the present disclosure.

Referring to FIG. 6, an exemplary structure of the compiler 12 of the present disclosure is provided. Specifically, the compiler 12 includes a plurality of levels. This plurality of levels preferably include two, three, four, five, or more than five levels of modules. At a highest level(s) of the compiler 12, a classical programming source code (e.g., in a carbon language) can run directly on a central processing unit (CPU) or graphical processing unit (GPU) of a digital computer 60. As the compilation of the compiler 12 progresses to lower level module(s) (e.g., gate level module 110 of FIG. 2), which correlates to downward in the illustrated stack of FIG. 6, languages of the present disclosure are considered "quantum" at decreasing levels of abstraction. For instance, a beryllium module (e.g., beryllium module 102 of FIG. 2) is considered to have a relatively high level of abstraction, for instance supporting one or more functions, one or more classes, one or more data structures, one or more pointers, or a combination thereof, and includes one or more quantum data structures. In some embodiments, the one or more quantum data structures of the beryllium language (e.g., of the high level module 102) is determined by one or more classical data types of the code 15 of the unified level module 14. In some embodiments, the compiler 12 includes a low level module 106 associated with a helium language that supports one or more subroutines and/or loops. By way of example, in some embodiments, the helium language of the low level module 106 allows for resource capturing, e.g., estimating resources for particular algorithms, post-quantum cryptography such as public-key cryptography, and predicting what resource packets for a particular algorithm. Moreover, in some embodiments, the helium language of the low level module 106 allows a subject of the present disclosure to encode the quantum code 62 in a way that does not need to specify instructions at the gate level of the quantum computer 64 but still allows for optimization on the quantum code 62. In this way, in some embodiments, the disclosed compiler (e.g., the example helium language of the example low level module 106 of one embodiment of the disclosed compiler) is utilized for resource counting without having to expand computational resources into a massive number of gates. However, the present disclosure is not limited thereto. The disclosed complier 12, for example through a hydrogen language of a gate level module 110 forming a lowest level of the compiler 12, specifies each quantum gate of the quantum computer 64, what the quantum computer 64 is to do to perform a command specified by the higher level languages (e.g., beryllium language of high level module 102), such as a first command provided through a subject in the unified level module 14. In this way, the compiler (for instance through the example hydrogen module 110) interfaces directly with the quantum computer 64.

Figure 7:
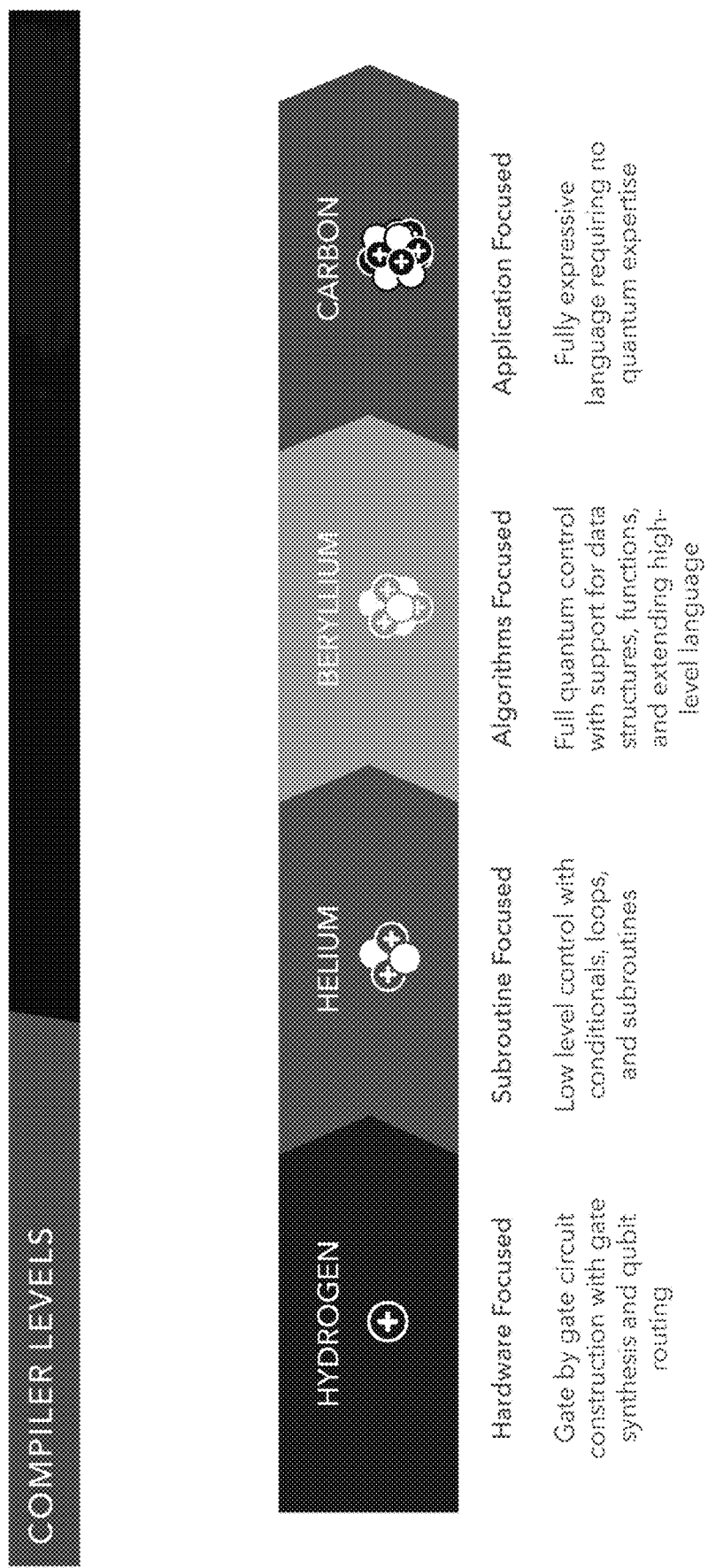
FIG. 7 illustrates the features of each level of a quantum compiler architecture for compiling unified computing language code into code that can be run on quantum computers and/or digital computers in accordance with an embodiment of the present disclosure.

More particularly, referring to FIG. 7, a chart is provided that describes an exemplary implementation of FIG. 6. Specifically, a compiler (e.g., compiler 12 of FIG. 2) is provided that is preferably composed of three (e.g., unified level module 14, high level module 102, gate level module 110) or, optionally, four different levels. At a fourth, or base, of the different levels, there is a gate-level language (hydrogen, fourth code 112 of FIG. 2, gate level module 110 of FIG. 2), referred to as "hydrogen." This hydrogen module 110 level of the present disclosure is gate-focused, in that the fourth code 112 provides a gate-by-gate circuit constriction with gate synthesis and qubit or qudit or quantum continuous variable 102 routing. Moreover, in some embodiments, the compiler 12 utilizes a third level (e.g., third code 108 of FIG. 2, low level module 106 of FIG. 2) known as "helium." This third, low level module helium 106 provides gate level operational control while also providing one or more loops, one or more conditional statements, one or more subroutines, or a combination. Furthermore, the compiler 12 includes a second level (e.g., high level module 102 of FIG. 2, second code 104 of FIG. 2), known as "beryllium," (e.g., beryllium 102 of FIG. 2). The beryllium 102 module provides an ability to generate and coordinate data structures, functions, classes, or a combination thereof. Moreover, the beryllium module 102 provides the second code via a plurality of data elements in one or more quantum data structures determined by the high level module from one or more classical datatypes in the first code. A first, or highest, level (e.g., first code 15 of FIG. 2, unified level module 14 of FIG. 2) of the compiler 12 includes a conventional programming language, or a subset thereof, known as "carbon," (e.g., carbon 14 of FIG. 2). The carbon module 14 is, or includes, a classical programming language that can be provided through and/or run on a digital computer (e.g., digital computer 60 of FIG. 1).

Additional details regarding a compiler 12 illustrated in FIG. 6 will now be presented in reverse order, beginning with a hardware of a quantum computer 64, moving up to a gate level of the compiler 12 (e.g., fourth code 112 of FIG. 2), then, in some embodiments, a low level module of the compiler 12 (e.g., third code 108 of FIG. 2), a high level module of the compiler 12 (e.g., second code 104 of FIG. 2) in a quantum language, and a highest level module of the compiler (e.g., first code 15 of FIG. 2) that provides a conversion of a classical programming code (e.g., conventional source code 502 of FIG. 5) into a quantum code (e.g., quantum code 62 of FIG. 1).

Characterization and Compilation.

Descriptions of characterization and compilation, directed to stage 30 of FIG. 31, "characterization," is provided. Specifically, various characterization routines that produce a profile of a quantum processor of a target quantum computer 64 that is taken into further considered by the modules of the compiler 12 of the systems and methods of the present disclosure are provided.

Figure 23:
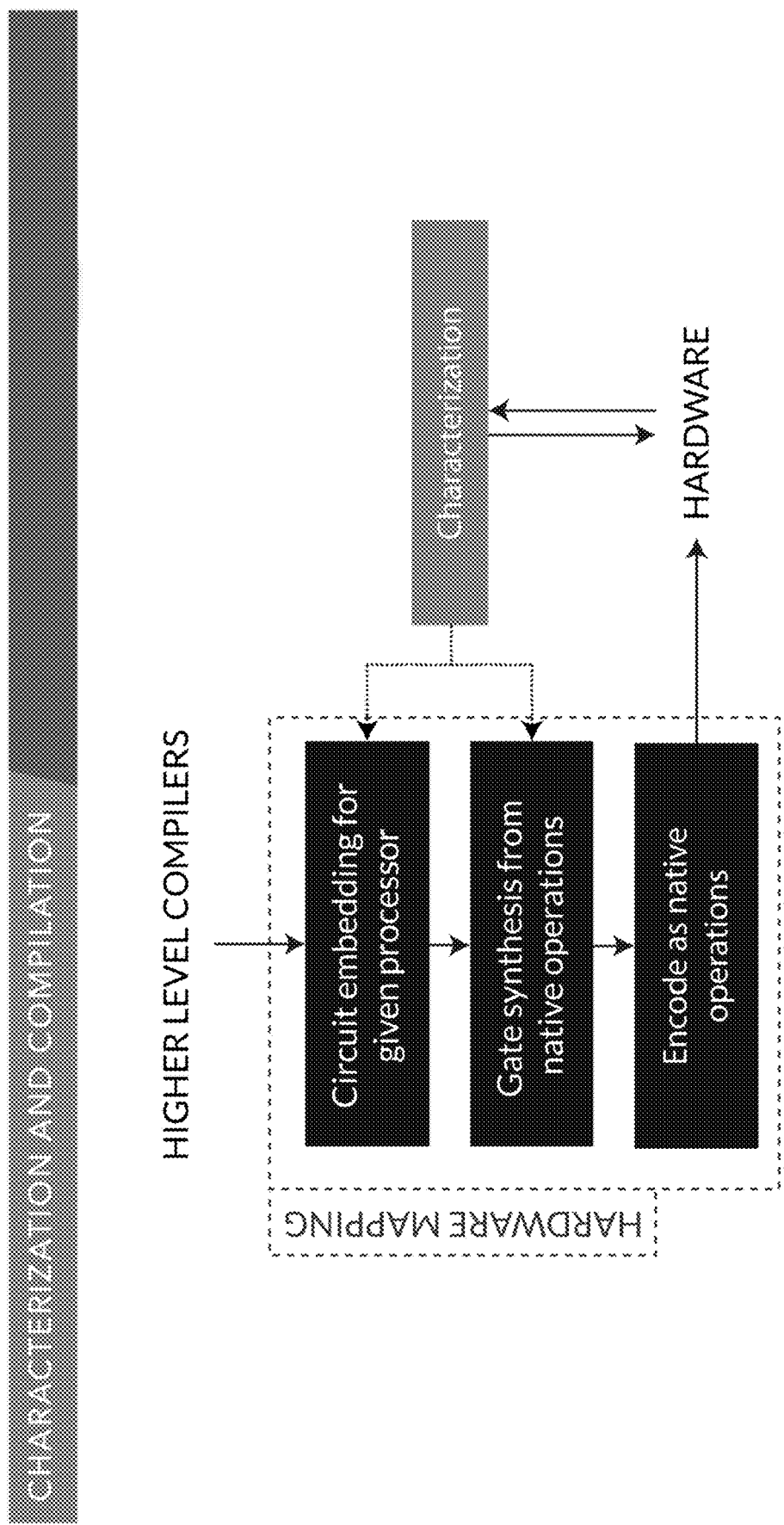
FIG. 23 illustrates characterization of a quantum system in accordance with an embodiment of the present disclosure.

Referring to FIG. 23, the systems and methods of the present disclosure provide a compiler 12 that addresses a hardware and a characterization of a quantum computer 64. Specifically, the compiler 12 addresses the hardware and characterization of the quantum computer 64 since the gates implemented in quantum processors are not ideal, in that the gates of the quantum processors inherently exhibit noise and/or error that must be considered. By way of example, in some embodiments, the noise of the gates of the quantum computer 64 is non-theoretical, in that the noise is not independent and identically distributed (i.i.d.) noise, depolarizing noise, amplitude damping noise, or the like. Accordingly, in order to compile a quantum code 62 that executes properly, one must consider what a target quantum computer 64 is actually producing or outputting.

With respect to the aforementioned error of the quantum processors of the quantum computer 64, one of skill in the art will recognize that there are various kinds of error that exists and can occur in a target quantum computer 64. By way of example, in some embodiments, some or all of the gates applied on a quantum computer 64 are incorrectly or inaccurately calibrated by the quantum computer 64. For instance, in some embodiments, a rotation implemented on the quantum computer 64 as part of a unitary gate is realized as a rotation by a different angle than expected, but is still considered a unitary gate. This unitary gate situation illustrates that a characterization of the quantum computer 64 is immediately helpful to a user of the present disclosure, since, if knowledge of an output of a respective gate implemented in a particular quantum processor of the quantum computer 64, rather than what the respective gate is supposed to output, provides immediate improvement to an output of the compiler 12. Accordingly, the present disclosure provides compilers that make use of characterizations of a quantum computer 64 during quantum compilation processes. This advantageously provides more accurate, efficient, and precise output.

Moreover, with respect to the noise of the gates of the quantum computer 64 described infra, in some embodiments, the noise is non-Markovian. In such instances, some compilers 12 of the present disclosure act to counterbalance the noise of the gates. For instance, in some embodiments, the compiler 12 counterbalances the noise of the gates of the quantum computer 64 by decoupling the noise, for example by calibrating the quantum computer 64 (e.g., to account for some of the broadening that is observed in the spectrum, etc.). Accordingly, the characterization conducted by the compiler 12 allows for the characterization of the gates of the quantum computer 24 to be fed back into the lower level modules of the compiler 12 (e.g., helium language of low level module 106 of FIG. 2, hydrogen language of gate level module 110 of FIG. 2), such that when an attempt is made to embed a circuit into a quantum processor, the quality of the gates can be taken into account by the systems and methods of the present disclosure.

As a non-limiting example, consider that, for a given target quantum computer 64, not all controlled Z gates (CZs) or controlled not gates (CNOTs) are created or considered equal. For instance, a first CZ, in one embodiment, is better than a second CZ such that, in accordance with a determination that gate synthesis is performed, one or more operations is less expensive than other operations in terms of an overall error, or budget for error for a computation. Accordingly, a characterization of the gates of the quantum computer 64 that occurs in accordance with the systems and methods of the present disclosure is designed to consider differences in the gates of the quantum computer 64 when utilizing the compiler 12. Moreover, in some embodiments, the characterization of the gates is utilized to account for unitary errors and produce the most optimal set of one or more operations possible.

Figure 11:
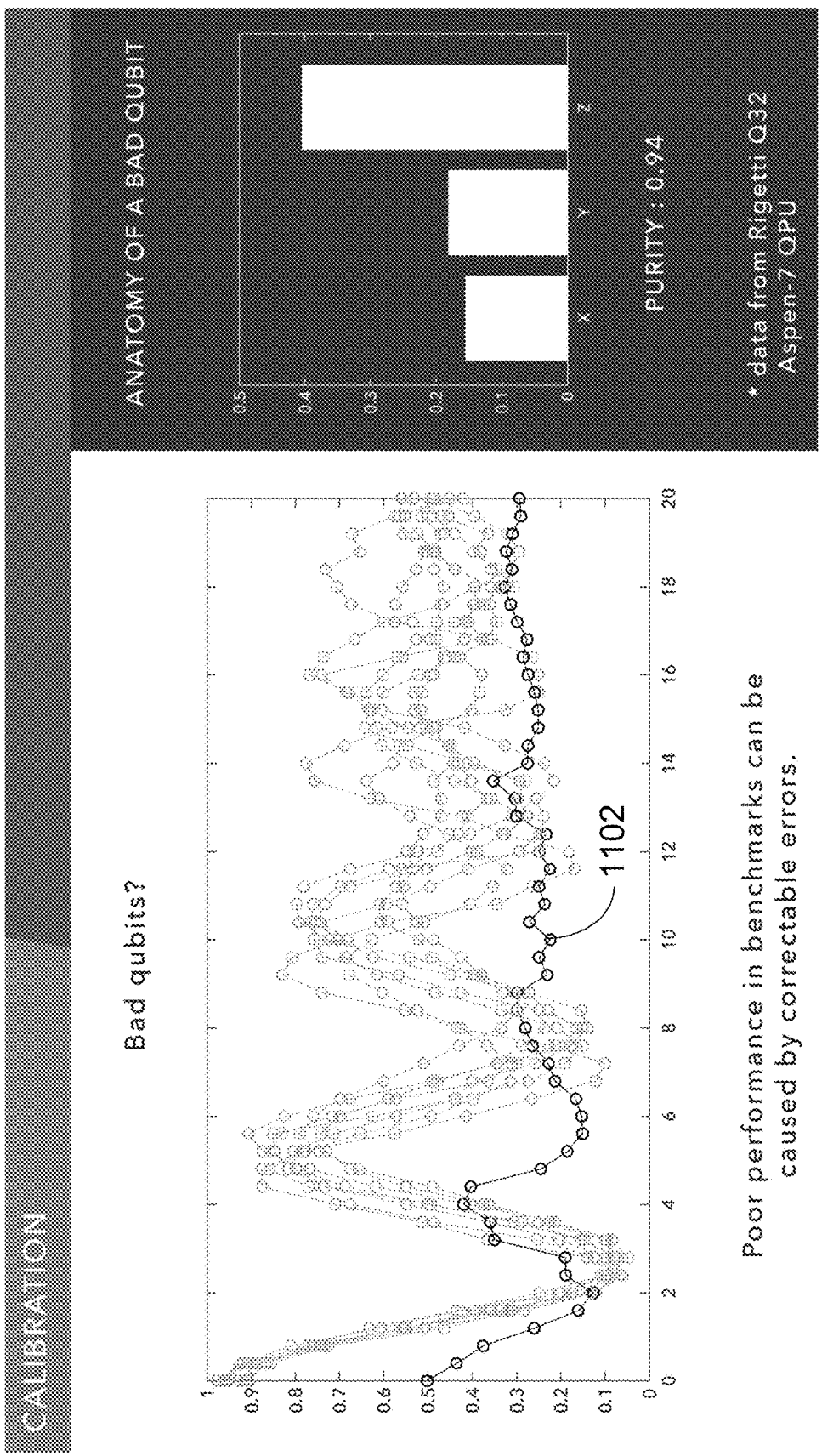
FIG. 11 illustrates how qubits that may be deemed as bad by various metrics, such as randomized benchmarking, can contain correctable errors that can be mitigated by gate synthesis in the gate level module in accordance with an embodiment of the present disclosure.

Referring to FIG. 11, a chart is provided that describes an exemplary calibration of a quantum computer 64. More particularly, the chart illustrates an exemplary calibration of a target quantum computer 64 including a particular 32-qubit (e.g., qubit and/or qudits 102 of FIG. 1) quantum processor. As illustrated by the chart, if Ramsey experiments are done with the qubits 102, one observes a plurality of cosine curves that gradually decay for most of the qubits 102, but there is one qubit (1102), contrasted with the other qubits that are greyed out in FIG. 11, that is not exhibiting the periodic behavior shown by the greyed out qubits. Prior to the present disclosure, the behavior of the qubit 1102 could not be elucidated. However, upon investigation through the characterization of the present disclosure, the qubit 1102 is determined to have a substantially pure state. Accordingly, having the substantially pure state, the qubit 1102 is well initialized, such that that one or more operations conducted on the qubit 1102 itself is not starting at a correct initial stage, and, thus, the one or more operations is outputted incorrectly. That is, a first sequence of operations is being performed using the qubits 102 of the quantum computer 64 even though a second sequence was instructed. This leads to an inaccurate outcome when the compiler 12 lacks consideration of the characterization of the gates.

Figure 24:
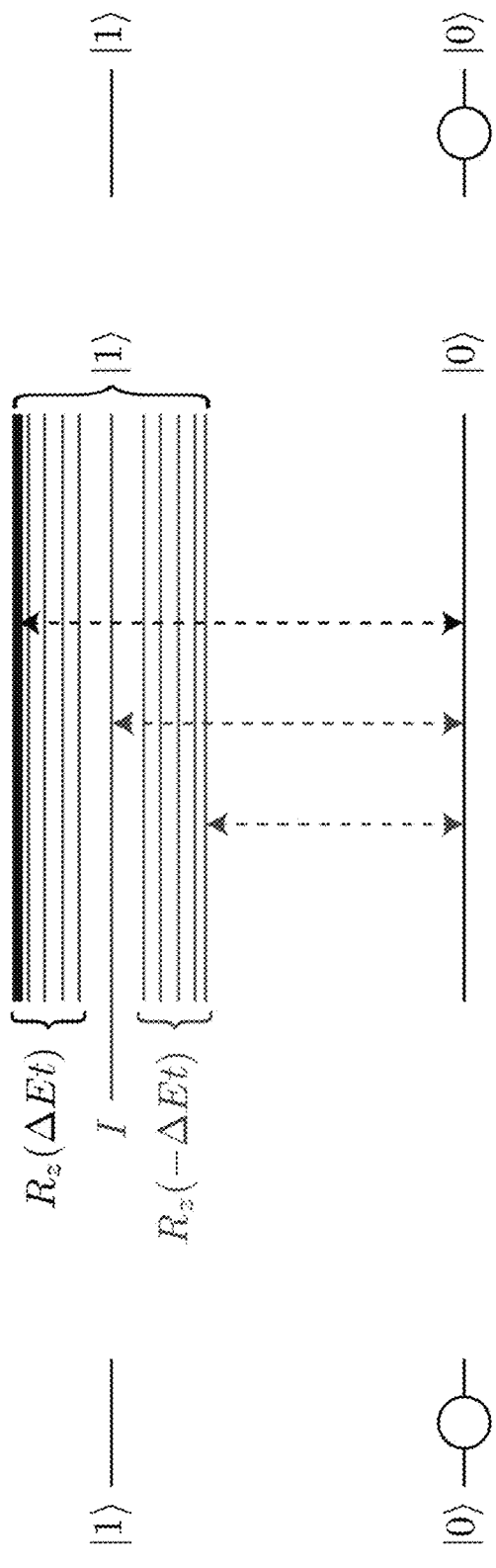
FIG. 24 illustrates shows how unintended couplings between qubits within real devices effectively change the energy gap between the |0> and |1> levels leading to apparent decoherence in accordance with an embodiment of the present disclosure.

Referring to FIG. 24, another example is provided in which stray couplings inside a target quantum computer 64 are mitigated. One of skill in the art will appreciate that superconducting processors of a quantum computer 64 include individual qubits or qudits 102 that are coupled to one another (e.g., with an Ising interaction), which is not ideal. Accordingly, when an interacting neighbor of a respective qubit or qudit 102 is in the $|0\rangle$ state, an energy gap between the respective qubit or qudit 102 $|0\rangle$ and $|1\rangle$ state has some particular value, but if the interacting neighbor is in an excited state ($|1\rangle$), the excited state has an effect of changing a level of operation of the respective qubit or qudit 102. In other words, there is a change in an amount of energy required to change the respective qubit or qudit 102 from the $|0\rangle$ state to the $|1\rangle$ state. Thus, if the interacting neighbor and the respective qubit or qudit 102 are each in their respective $|1\rangle$ states, one extreme of an energy diagram is realized, and if the interacting neighbor and the respective qubit or qudit 102 are each in their respective $|0\rangle$ state, a different extreme of the energy diagram is realized. Moreover, in some embodiments, more than one interacting neighbor exists, such that FIG. 24 provides just an example of an instance in which there is just one interacting neighboring qubit or qudit 102.

In some embodiments, if the qubits or qudits 102 are in an entangled state, then a broadening occurs and there is an undefined gap between states $|0\rangle$ and $|1\rangle$, which presents a problem for a user of a target quantum computer 64. For instance, if the qubit or qudit 102 is put into a $|1\rangle$ state and left alone, the qubit or qudit 102 will start to accrue phase, depending on the state of one or more neighbors of the qubit or qudit 102. In some embodiments, whatever calibration process is done, the compiler 12 assumes the one or more neighbors to be in the $|0\rangle$ basis state. As such, the calibration assumes the one or more neighboring qubits or qudits 102 in the target quantum computer 64 is in the state $|0\rangle$ basis state, and in that case, the x rotations performed, or the y rotations performed, bring the respective qubit or qudit 102 from states $|0\rangle$ to $|1\rangle$. However, as the state of the one or more neighboring qubits or qudits of the respective qubit or qudit 1021 is changed, decoherence arises through the superposition between the states of neighboring qubits or qudits and the respective qubit or qudit 102.

Figure 12:
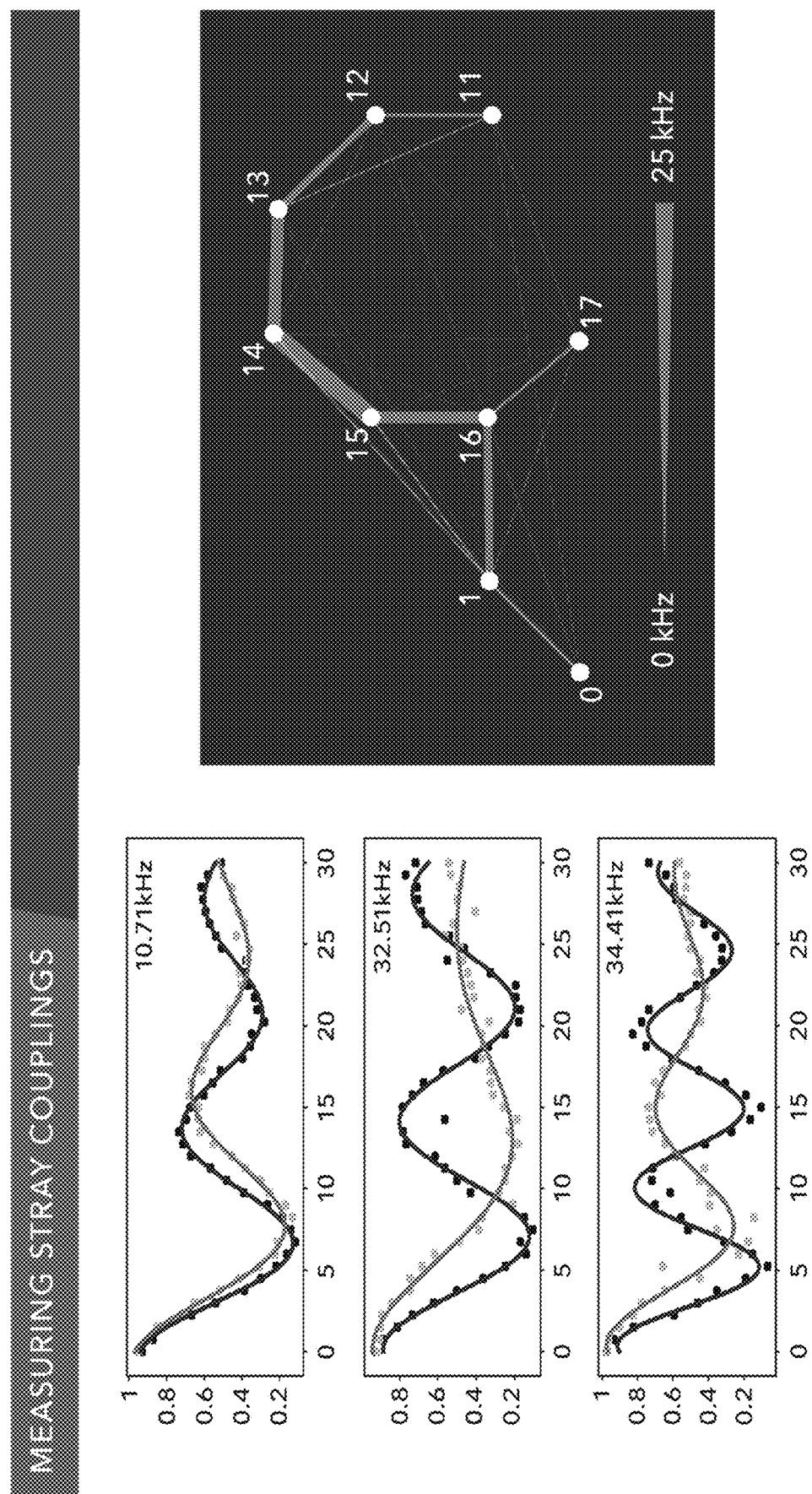
FIG. 12 illustrates determinations of stray coupling measurements in accordance with an embodiment of the present disclosure.

Referring to FIG. 12, a chart providing an example of data taken from a particular quantum processor of a target quantum computer 64 is provided. On the left side of FIG. 12, joint Ramsey experiments are illustrated. A single qubit 102 is prepared in a superposition of $|0\rangle$ and $|1\rangle$ basis states, and the qubit 102 is allowed to process for a certain amount of time, before doing a rotation again. After this, the qubit 102 is expected to be in the computational basis $|0\rangle$ if no phase accrued. However, each of the qubits 102 has some natural frequency, such that some hysteresis occurs. Moreover, for the graphs illustrated in FIG. 12, a rotation has been implemented, such that a pronounced curve is realized. Thus, one of the curves exhibited in each of the plots is performed with a particular neighboring qubit in the $|0\rangle$ basis state and the other curve is with that neighbor in the $|1\rangle$ basis state. Thus, the curves show how the frequency is shifted when the neighboring qubit 102 is in $|0\rangle$ versus $|1\rangle$, and this represents a change in the energy gap. As such, in some embodiments, this change in the energy gap is reasonably small, in the order of a couple of kilohertz (kHz) (e.g., from about 1 kHz to about 3 kHz). In other embodiments, the gap approaches a 35 kilohertz coupling on the certain quantum processors in certain quantum computers 64. For instance, for some quantum processors, up to 150 kilohertz coupling is observed. Moreover, in some embodiments, these gaps are mapped out for a given quantum processor of a target quantum computer 64 as shown on the right-hand side of FIG. 12. The right hand side of FIG. 12 illustrates a culmination of tests between different pairs of qubits 110 on a single quantum processor, to generate a map of the stray couplings. As illustrated in the right panel of FIG. 12, in some embodiments, there are stray couplings between nearest neighbors of qubits or qudits 102. The location of a vertices in FIG. 12 (right side) is where a qubit or qudit 102 is physically on the quantum processor. Moreover, in some embodiments, strong couplings exist between non-nearest neighbors of qubits 102.

Figure 25:
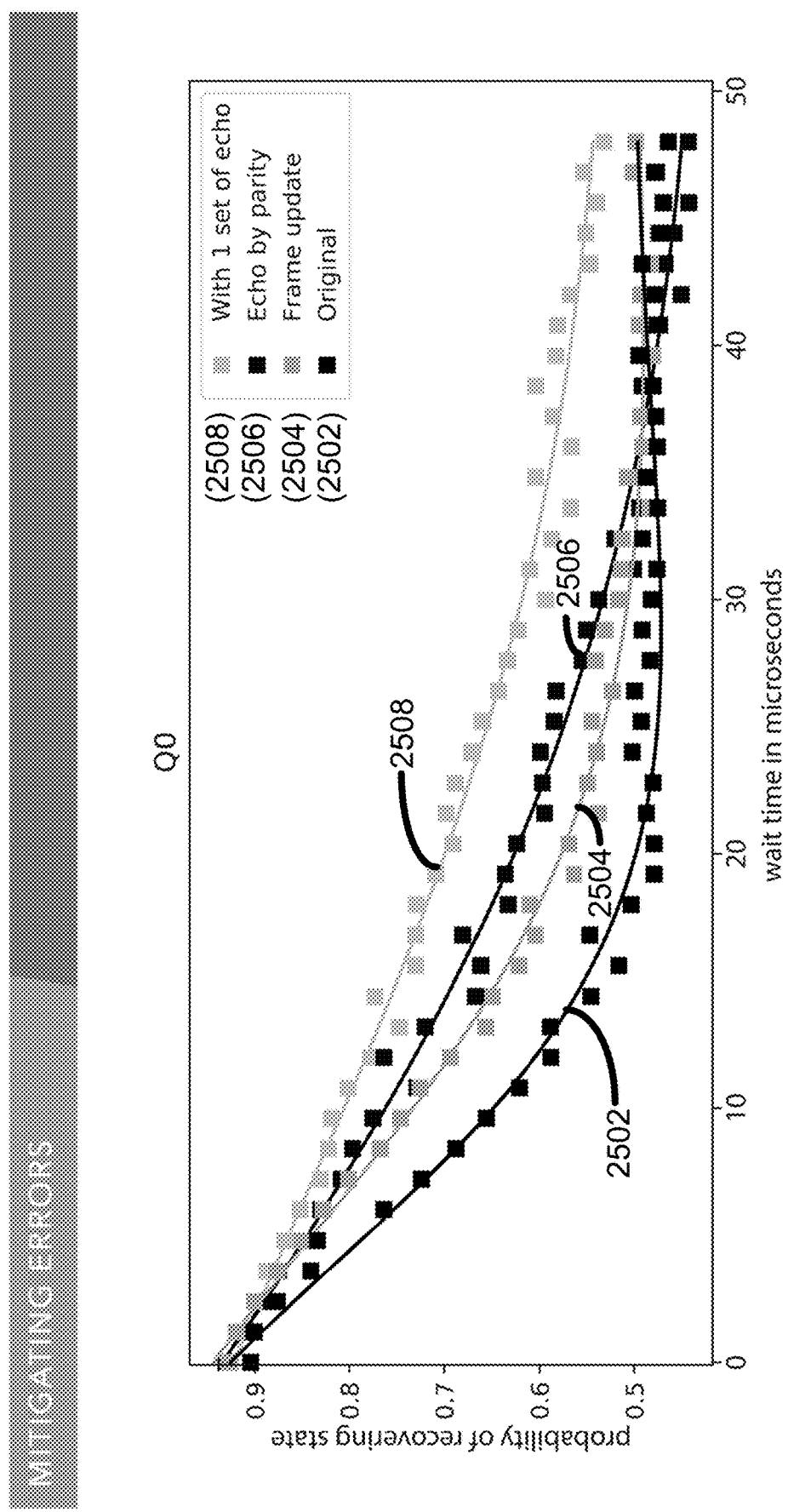
FIG. 25 illustrates an example of various error mitigation techniques on a particular qubit in accordance with an embodiment of the present disclosure.
Figure 26:
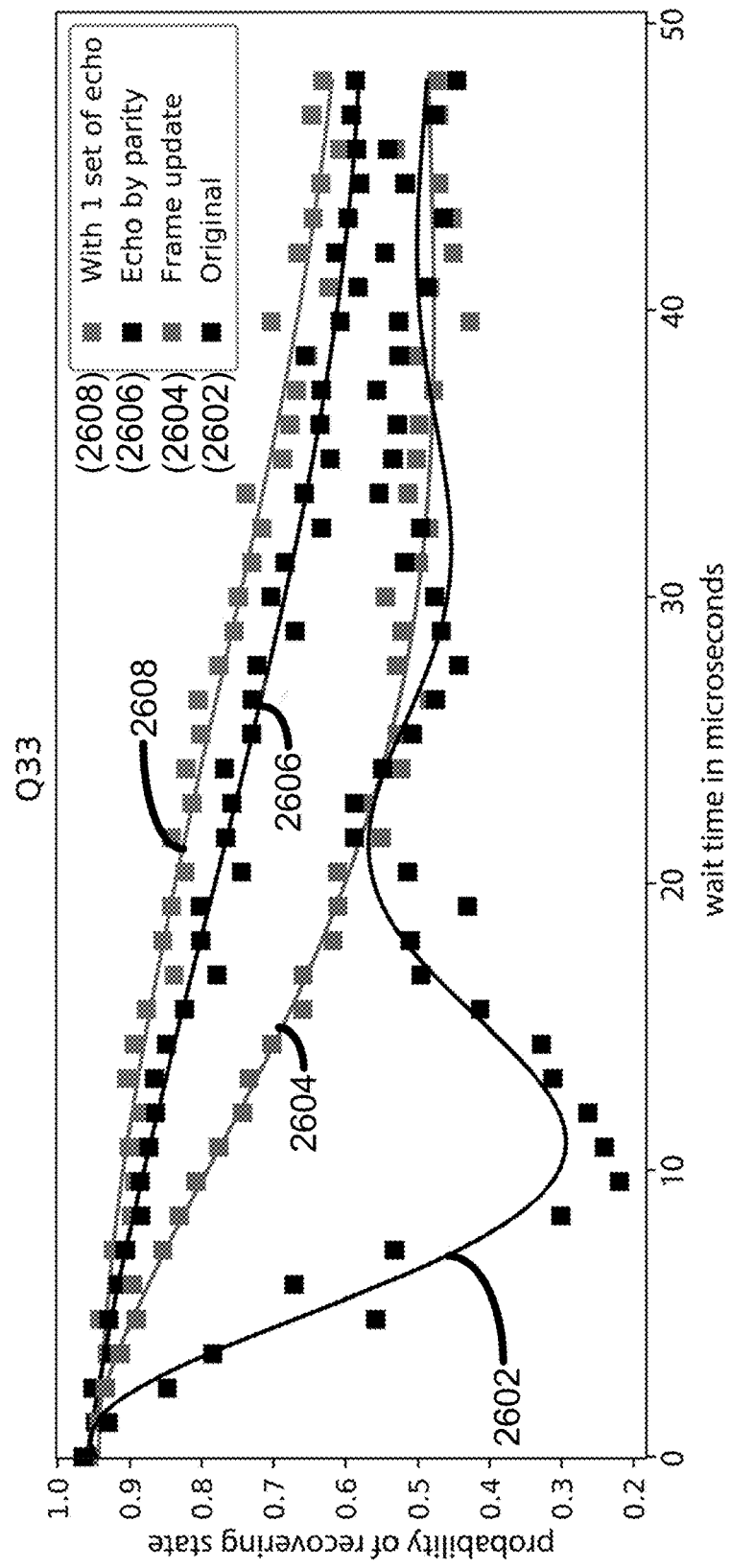
FIG. 26 illustrates an example of various error mitigation techniques on another qubit in accordance with an embodiment of the present disclosure.
Figure 27:
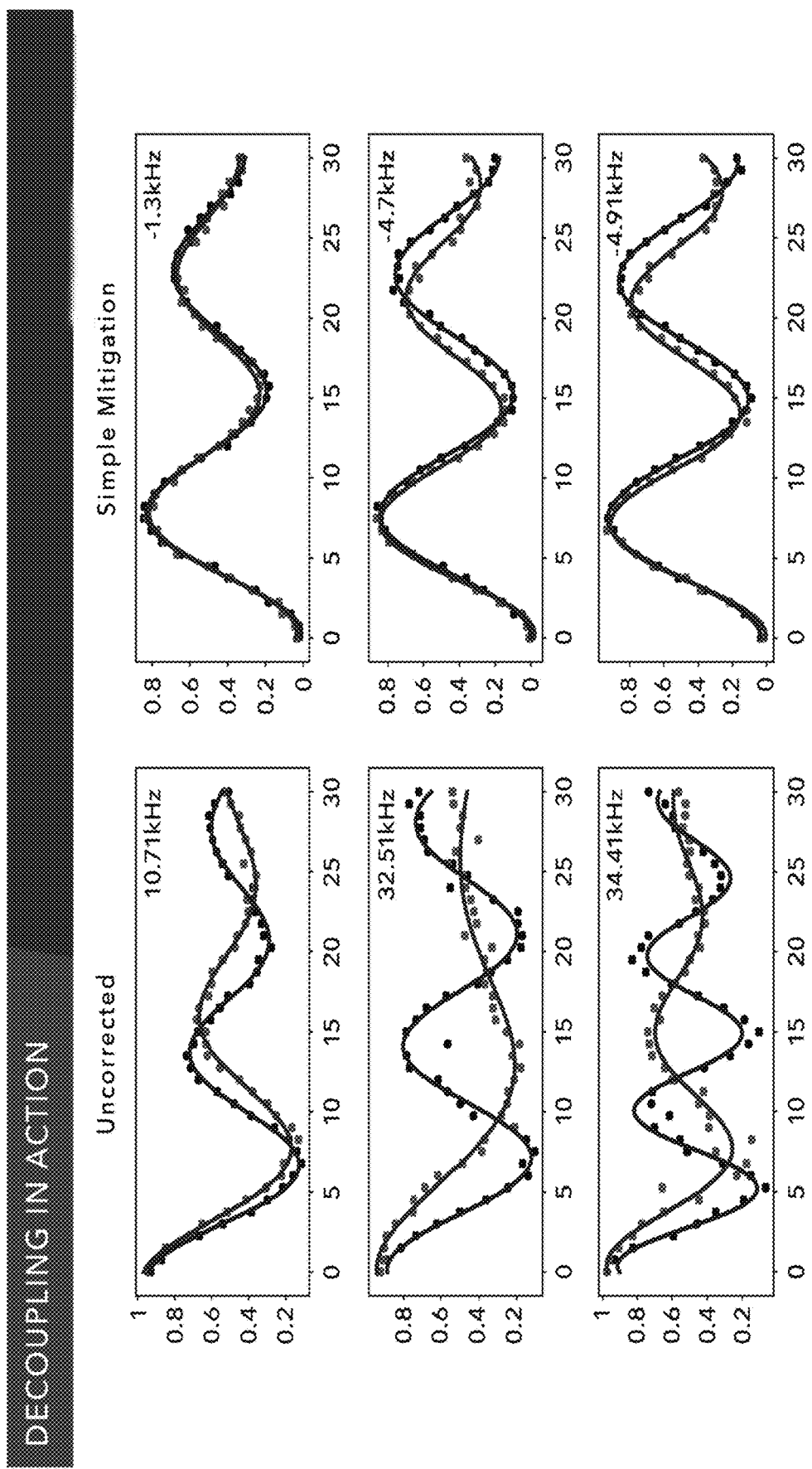
FIG. 27 illustrates an example of various error mitigation techniques in accordance with an embodiment of the present disclosure.

Compiler 12 (e.g., optionally in a module termed the hydrogen module 110) includes is a command wait(time) [addr1, . . . , addrk] and wait(time) that causes the target quantum computer 64 to not apply any gates on the indicated subsystems (qubits or qudits 102 specified by addr1, . . . , addrk) or on all qubits or qudits 102 for a specified period of time (the time parameter in parentheses). As FIGS. 25 and 26 describe below, in a non-ideal quantum computer 64, the quantum computer 64 is not idle during this waiting period, such that the "wait" command does not execute as intended. In some embodiments, quantum computer 64 includes some small Z rotations happening on each qubit or qudit 102, and some small Ising (ZZ) interaction between some pairs of qubits or qudits 102 (the thickness of the lines in the graphs in the right hand portion of FIG. 12 and in FIG. 28 indicate the strength of this unwanted coupling). The plots in FIGS. 25 and 26 show the results of several mitigation strategies that each approximate the equivalent of the hydrogen module 110 command wait(t)[q] for q=0 and q=33 (two different qubits 102 in the a particular representative quantum processor). For FIGS. 25 and 26, the error mitigation techniques are used to ensure that nothing happens to the qubits 102 for some period of time. However, the present disclosure is not limited thereto. For instance, in some embodiments, the same techniques disclosed for FIGS. 25 and 26 can be used during a different operation.

FIG. 25 illustrates an example of performing error mitigation techniques in accordance with the systems and methods of the present disclosure for a particular quantum processors. Curve 2502 is the original qubit 102, and represents the probability of recovering a particular quantum state as a function of time in microseconds. The quantum state is prepared, an amount of time is allowed to elapse, and then an attempt is made to try to recover the original quantum state. However, when attempt is conducted, all of the other qubits 102 in the target quantum computer 64 are put in superposition. Thus, the qubit 102 dephases because of these stray couplings. The present disclosure provides various ways to handle this. A first mechanism of handling this is to update the frame through the compiler 12. As described supra, when target quantum computers 64 are calibrated, they are often calibrated under the assumption that neighboring qubits or qudits 102 are in the |0> basis state. Accordingly, the duration of pulses for the gates of the quantum computer 64 are calibrated based on the assumption that neighboring qubits or qudits 102 are in the |0> basis state. Thus, between the |0> basis state and the |1> basis state, when all of the neighboring qubits or qudits 102 are |0> is substantially similar to the pulses that are actually used. However, if the neighboring qubits or qudits 102 are put in the |1> basis state, the respective qubit or qudit 102 is at another extreme of the energy diagram, as discussed supra in conjunction with FIG. 24, and a relatively large change in energy arises. One approach to address this change in energy is to assume that if all of the qubits 102 on the quantum processor under consideration are utilized for a computation, the qubits 102 are probably entangled with other qubits 102. Thus, one will not know if the qubits 102 are going to be in states |0> or |1>. In such embodiments, an assumption can be made that it is equiprobable or better that the qubits 102 are in |0>-|1> and so it should not be assumed that an observed energy gap is the extreme value achieved by measuring when neighboring qubits or qudits 102 are in the |0> basis state. Rather, an energy gap in the middle of the observed range between when all neighboring qubits 102 are in the |0> basis state and when all neighboring qubits 102 are in the |1> basis state should be selected.

Curve 2504 (frame update) illustrates what happens when this energy gap in the middle of the observed range is selected. In this method, a wait(t)[q] is replaced with rz(w*t)[q]. This involves adding a small amount of time dependent Z rotation to the qubit or qudit 102. Here, this time dependent Z rotation was added through a frame update in the pulse control software on the quantum computer 64 for the illustration of FIG. 25. However, the present disclosure is not limited thereto. In other embodiments, the time dependent Z rotation is added directly at the gate synthesis module (stage 25 of FIG. 31) of compiler 12.

As illustrated by FIG. 25, curve 2504 decays slower than curve 2502 (original). For curve 2504, the dephasing still occurs, but because the pulse sequences have been set with the assumption that the energy gap for the respective qubit 102 is in the middle of the energy range, what is actually observed is a coherent rotation that has not been taken into account. By contrast, curve 2502 dips down and starts to come back up over time because there is effectively a coherent rotation happening on top of the dephasing due to the fact that the pulse sequence for curve 2502 is calibrated at one extreme of the range of the energy gap, rather than being in the center as was the case for curve 2504.

Alternatively, a spin-echo approach can be taken in which the qubit or qudit 102 is allowed evolve for some amount of time, flipped, allowed evolving for the same amount of time again, and then the flip is reversed. This decouples any Ising interactions from the qubit 102, providing curve 2508 which exhibits slower decay. Curve 2506 arises when this decoupling is done, but alternating sets of qubits 102 are flipped. The alternating qubits 102 are flipped to decouple every qubit 102 from every other qubit 102 rather than just one particular qubit 102 from its neighboring qubits 102. If all the qubits 102 are flipped at the same time, all of those couplings stay the same, in that the qubits 102 decouple from the environment but not from each other. Accordingly, dividing the qubit 102 into two groups and deciding which to flip based on which of those sets a qubit 102 is in, yields curve 2506. Thus, in accordance with this second error mitigation technique, a qubit 102 is periodically flipped by injecting an X gate at t/2 and then a second X gate at t. Other decoupling pulses besides this known spin-echo approach can alternative be used by the systems and methods of the present disclosure. The spin-echo approach leads to curves 2506 and 2508 of FIG. 25. Curve 2508 is when only the qubit q is flipped, in accordance with the example code illustrated in FIG. 36. This leads to an improved performance for the targeted qubit 102, but the other qubits 102 do not improve. A more complicated procedure that improves wait(t)[addr1, . . . , addrk] for all address choices rather than just qubit q is to choose subsets of qubits 102 to flip at different points in time. Because the strongest unwanted couplings are between even number qubits 102 and odd numbered qubits 102, in the demonstration for FIG. 25, only the odd numbered qubits 102 have been flipped, leading to curve 2506. The hydrogen code (e.g., fourth code 112 of FIG. 2) for each of the two versions of this error correction technique are illustrated in FIGS. 36 (curve 2508, set echo) and 37 (curve 2506, echo by parity) respectively. In some embodiments, the implementation of any of the error mitigation techniques illustrated in FIG. 25 or equivalents thereof is automatically applied in the gate synthesis module (stage 25 of FIG. 31) of compiler 12 or separately prior to output to a target quantum computer 64. Moreover, while the discussion here has been in relation to a qubit based quantum processor, similar approaches can be used for qudit based quantum processors.

FIG. 25 illustrates a particular qubit 102 on a particular quantum processor of a quantum computer 64, where the qubit 102 has been calibrated at a particular time. However, the qubit 102 of FIG. 25 is not the qubit 102 for which the biggest difference was seen across the various calibration techniques.

FIG. 26 illustrate a typical difference that was seen on the quantum processor of the quantum computer 64 under study in FIG. 25. FIG. 26 is an example of a qubit 102 that does not behave as intended. Here, curve 2602 is the original effect of preparing a qubit 102 in the plus state, leaving the qubit 102 for some amount of time, and then measuring the qubit 102 again, effectively conducting a Hadamard and measuring the qubit. Curve 2602 dips below 50% relatively quickly, but comes back up due to picking up a coherent Z rotation. However, this coherent Z rotation should not arise. It is an undesirable effect of the Ising coupling to other qubits 102 on the quantum computer 64.

Continuing to refer to FIG. 26, the frame update approach yields curve 2604, which provides a significant improvement until around 30 or 40 microseconds at which time decoupling (curves 2606 and 2608) provides improved results. Thus, curve 2606 and curve 2608 are well above either of curves 2602 and 2604. Considering the wait time to get to a 70% chance of recovering the state as a metric for comparison, there is a significant difference between the original strategy (curve 2602) and what happens if either of the decoupling strategies (echo by parity, curve 2606, FIG. 37, or with 1 set of echo, curve 2608, FIG. 36) are employed. Thus, the different approaches significantly change the lifetime of the qubits 102 on the quantum processor of the quantum computer 64.

In the above discussion, the term "Ising" is meant to mean CZ coupling. That is, no particular mechanism for the coupling is intended. Pairwise tomography between qubits 102 for different amounts of time has been observed, such that how each of the terms in a density matrix changes with time has been observed. Such observations show that a significant amount of the coupling is in the form of a ZZ term. Referring briefly to FIG. 12, if qubit 14 is considered, there are contributions from qubits 1, 15 and 13. Moreover, if just qubits 15 and 14 are considered, for example, there is a strong ZZ coupling, but dephasing is also observed, and the coupling to qubit 13 causes part of that dephasing and part of the dephasing is caused by the coupling to qubit 1. If these entries are plotted with time, it is seen that the dephasing is non-Markovian, such that the dephasing falls off more slowly than initially expected, and then picks up speed. This indicates that the coupling between qubits 102 is coherent. However, there is relaxation going on at the same time, and other forms of error, yet the coupling is a significant one. Thus, the use of the decoupling approaches illustrated in FIGS. 25 and 26 improve the lifetime of the qubits 102 for performing quantum operations.

Referring to FIG. 26, another apparent reason that the coupling is Ising is because, when simple spin-echo is performed, in which a qubit 102 is flipped half way through the time sequence and then flipped back, the sequence cancels the coupling with desired results.

Figure 28:
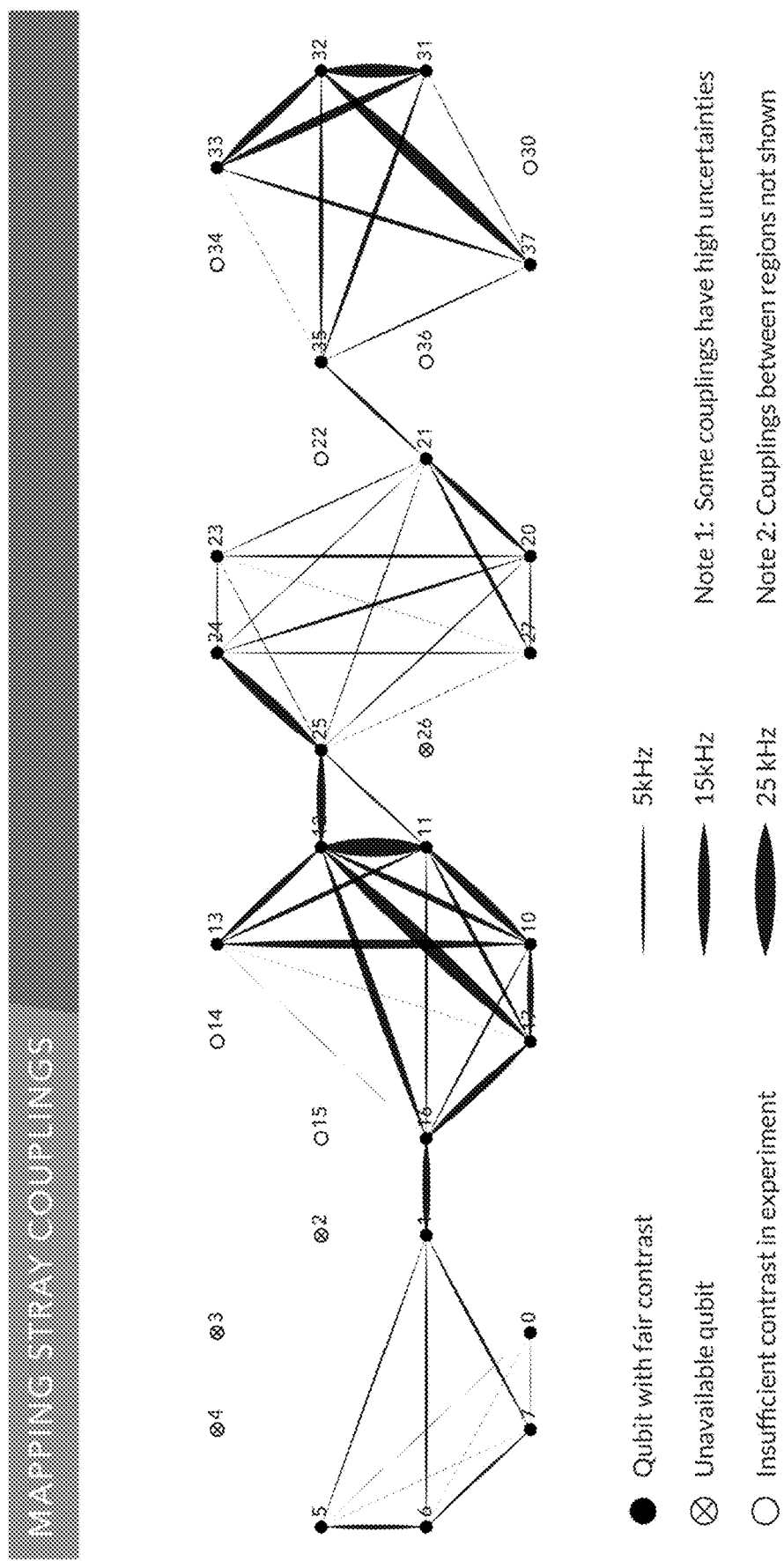
FIG. 28 illustrates the mapping of all of the couplings in a quantum computing processor in accordance with an embodiment of the present disclosure.

To further calibrate quantum computers 64, it is of interest to localize the stray couplings within the quantum computer 64. While it would be desirable to decouple all the qubits or qudits 102 on the quantum computer 64, this approach is not feasible. If one were to run the same decoupling sequence on every qubit or qudit 102, the qubits or qudits would only decouple from the environment. To decouple the qubits or qudits 102 from one another, different sequences would need to be conducted on each respective qubit or qudit 102. However, the gates necessary to achieve such decoupling would take longer than the coherence time (T2). Accordingly, what is needed is to decouple the qubits or qudits 102 using as few gates as possible. To accomplish this, it is helpful to map out the couplings between the qubits or qudits 102 of the quantum processor to determine which qubits or qudits are couples to each other. While one may be tempted to conduct joint Ramsey experiments between every pair of qubits or qudits 102, on real quantum computers 64, to get enough statistics, requires running such experiments continuously for more than a day. And by the time such experiments were conducted they would no longer be accurate because the coupling parameters change and drift with time. Thus, by the time the Ramsey experiments were finished, the measurements would no longer be valid. As such, what is needed is to take all of the measurements within a shortened period of time, update the coupling parameters on the quantum computer 64, update the frames for each qubit or qudit 102, and design and implement the decoupling pulse sequence, such that that this entire sequence from taking measurements to decoupling takes less than a couple of hours. In order to accomplish this approach, there is not sufficient time to do pairwise measurements. Some embodiments of the systems and methods of the present disclosure address the above described problem of decoupling by exciting all of the qubits or qudits 102, exposing the excited qubits or qudits 102 for varying amounts of time to the natural Hamiltonian system, measuring the states of the exposed qubits or qudits 102. From this measuring, the pairwise couplings between all of the qubits and qudits 102 are constructed via reverse engineering. Thus, what would have taken many thousand runs before using conventional approaches can now be drawn down to on the order of seven runs on a quantum processor using the systems and methods of the present disclosure. In some embodiments, a side effect, at least on some commercially available quantum processors for quantum computers 64, is that longer periods of time are required for larger (e.g., greater computational resources) processors because some of the compilation that takes place before it is run, with the effect is that on large processors the process is slower to run for the same number of shots than it is on smaller processors or on a sublattice, which is why the coupling graph illustrated in FIG. 28 appears noisy. In FIG. 28, couplings between unit cells have been left out, for improved visibility. FIG. 28 illustrates observed couplings for a particular quantum processor, in which all the couplings have been mapped out in a couple of shots using the systems and methods of the present disclosure.

With respect to stage 29 of FIG. 31, in some embodiments, the compiler 12 counts the gates, the qudits, qudits 102, or quantum continuous variables, and other resources required for a circuit of a quantum computer 64. In some embodiments, a wall clock time is estimated based on the quantum processor of the quantum computer 64.

Figure 3:
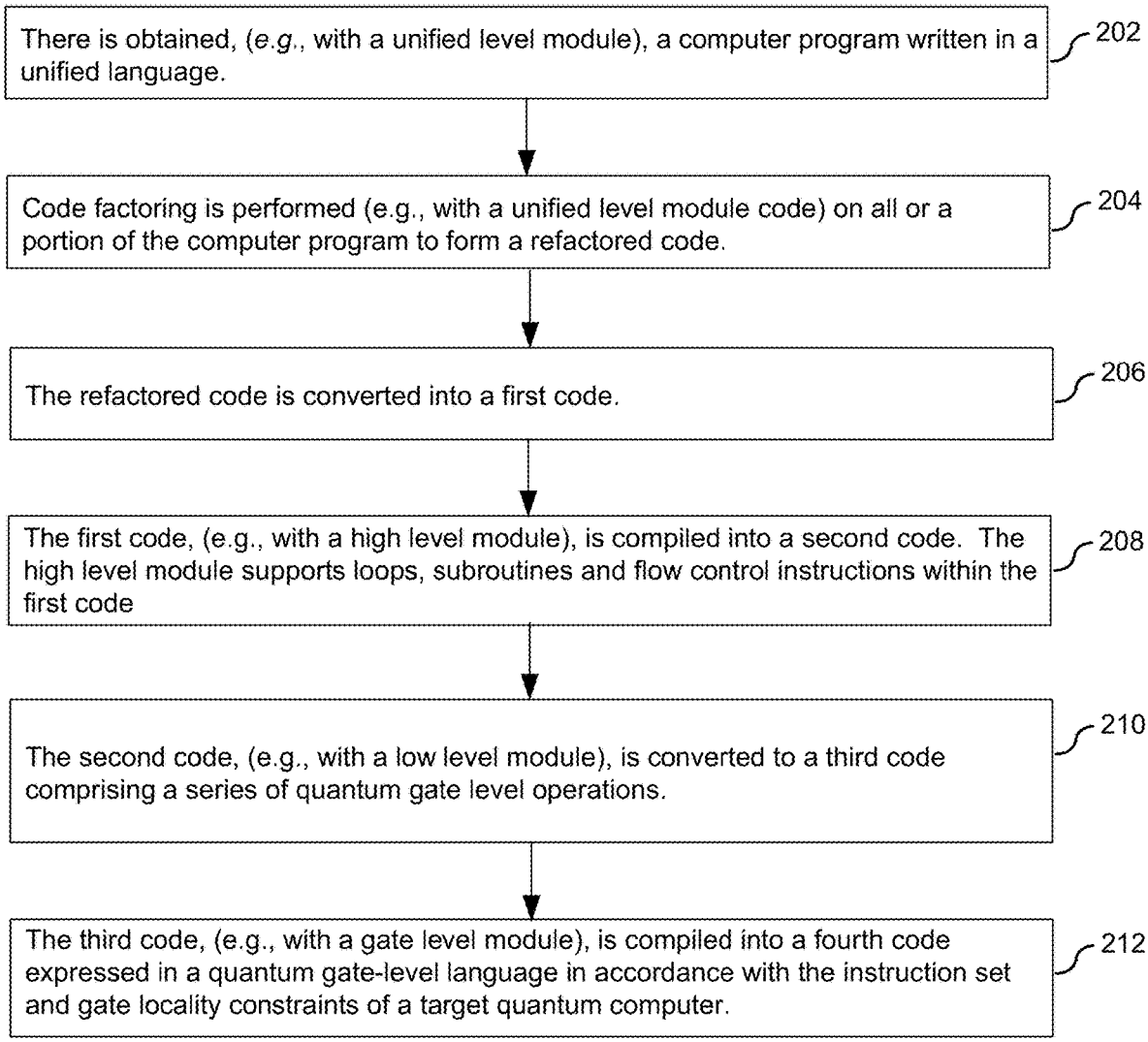
FIG. 3 is a flow chart showing the compilation of unified computing language code into code that is run on quantum computers and/or digital computers in accordance with an embodiment of the present disclosure.

Hydrogen (Element 212 of FIG. 3).

Moving from the hardware level, attention turns to the low-level programming module of the compiler 12 used in stages 20-27 and 29 of FIG. 31 (e.g., fault-tolerance module and/or hydrogen compiler). Referring to FIG. 8, the compiler of the present disclosure provides a gate level module (e.g., hydrogen module 110 of FIG. 110). In some embodiments, the gate level module 110 makes use of a low level programming language or a high level programming language (e.g., third code 108, second code 104 of FIG. 2). However, the present disclosure is not limited thereto. The hydrogen module 110 is a gate-level language in which the quantum operations to be performed and optionally the hardware addresses that these quantum operations are to be performed at are specified. The qubits, qudits, or quantum continuous variables 102 are assigned dynamically. Parameters such as, for example, a rz gate, are specified and then this is compiled into code (e.g., fourth code 112 of FIG. 2) that matches the target quantum computing hardware. The qubits, qudit, or quantum continuous variable 102 assignments are altered if specific hardware addresses for the quantum operations have not been specified to try to find the best assignments, for instance, to minimize a number of swaps that have to be done within the computation.

In some embodiments, the compiler 12 of the systems and methods of the present disclosure includes a fault tolerance module (e.g., stage 20, stage 21, stage 22, stage 23, or a combination thereof of FIG. 31) that is configured to suppress an error rate when utilizing a target quantum system. In some embodiments, the fault tolerance module includes a gate synthesis from fault-tolerant gate set (stage 20). In some embodiments, the fault tolerance module includes a fault tolerance (FT) gate set optimization (stage 21). In some embodiments, the fault tolerance module includes circuit embedding. (stage 22). In some embodiments, the fault tolerance module includes a fault-tolerance encoding (stage 23). Additional details and information regarding fault tolerance of a target quantum system can be found at Whitney et al., 2009, "Practical Fault Tolerance for Quantum Circuits," University of California, Berkeley, print; Linke et al., 2016, "Experimental Demonstration of Quantum Fault Tolerance," arXiv preprint arXiv:1611.06946; Blume-Kohout et al., 2017, Demonstration of Qubit Operations Below a Rigorous Fault Tolerance Threshold with Gate Set Tomography," Nature Communications, 8(1), pg. 1, each of which is hereby incorporated by reference in its entirety.

Figure 9:
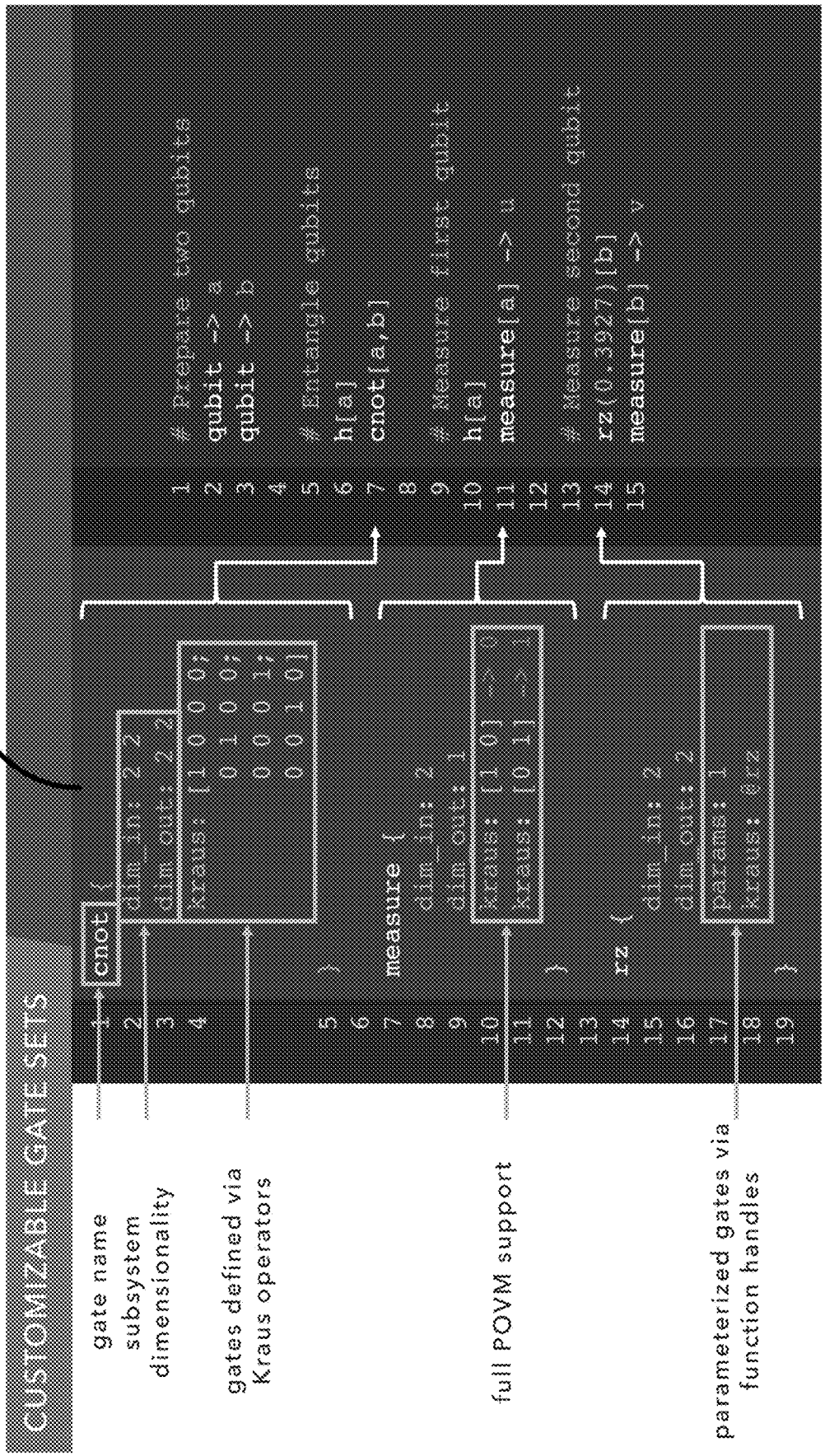
FIG. 9 further illustrates the features of the gate level of a quantum compiler architecture for compiling unified computing language code into code that can be run on quantum computers and/or digital computers in accordance with an embodiment of the present disclosure.

Referring to the right panel of FIG. 9, which provides example hydrogen code (e.g., fourth code 112), the hydrogen programming language is structured. That is, the language is defined by a structured text file. In the exemplary embodiment, an example format is command_name (param1, . . . , paramN)[addr1, . . . , addrM] where "→" indicates that a command returns a value. Qubits are defined in terms of gates. For instance, in some embodiments, each gate is defined in a separate text file that is editable to add new operations, by adding the Kraus operators for the gate. However, the present disclosure is not limited thereto.

For example, with reference to FIG. 9, in the case of defining the CNOT(a, b) gate used at line 7 on the right side of FIG. 9, the CNOT gate is specified in the middle panel of FIG. 9 in a data structure that provides the name of the gate "CNOT", the number of dimensions on the subset systems, and the appropriate Kraus operators. Here, "dim_in: 2 2" means that the first subsystem is of dimension two (i.e. a qubit), and the second subsystem is of dimension two. To define how the CNOT gate interacts with a qubit 102, the appropriate Kraus operators for the CNOT operation are specified: [1 0 0 0; 0 1 0 0; 0 0 0 1; 0 0 1 0].

As another example, line 10 of the code 112 on the right portion of FIG. 9, calls for h[a]. In some embodiments, h[a] is defined in a separate data structure as:

h {
  dim_in: 2
    dim_out: 2
    kraus: [0.7071067811865475 0.7071067811865475;
      0.7071067811865475 −0.7071067811865475]
}

That is, the name of the data structure is "h," the dimensions are specified ("dim_in:2"; "dim_out 2"), and the Kraus operators are defined for h[a].

Turning to the "measure" example at line 11 of the code on the right side of FIG. 9, the compiler 12 supports general positive operator-valued measures (POVMs). Therefore, any set of Kraus operators corresponding to digital outputs can be specified. In the measure example at line 11 of the right portion of FIG. 9, the name of the gate ("measure"), the number of dimensions ("dim_in: 2"; "dim_out: 1") and the Kraus operators for the measure gate ("Kraus: [1 0]→0"; "Kraus [0 1]→1") are specified in a separate data structure illustrated in the middle panel of FIG. 9.

Moreover, referring to line 14 of the code on the right hand side of FIG. 9, the compiler 12 supports parameterized gates where the Kraus operators are given by function handles. This produces the Kraus operator when passed a value for the parameter and allows the compiler 12 to implement arbitrary parameterized gates. Thus, the code rz (0.3927) [b] passes the parameter value 0.3927 to the rz gate that is defined in the middle panel of FIG. 9. In some embodiments, the compiler 12 calls these function handles to generate the Kraus operators (e.g., on the fly) for whatever parameters have been specified by the gate.

FIGS. 32A, 32B, and 32C illustrate the definition of an example of a gate set. Any of the gates specified in FIGS. 32A, 32B, and 32C can be called by the hydrogen code 112 in order to implement desired gates as part of a quantum algorithm. Moreover, FIG. 32 illustrates how new gates can easily be defined and added using the general format:

instruction {
  dim_in: subsysdim1 subsysdim2 . . . subsysdimM
  dim_out: subsysdim1 subsysdim2 . . . subsysdimM
  kraus: kraus1 (→output)
  . . .
  kraus: krausN (→outputN)
}

Figure 10:
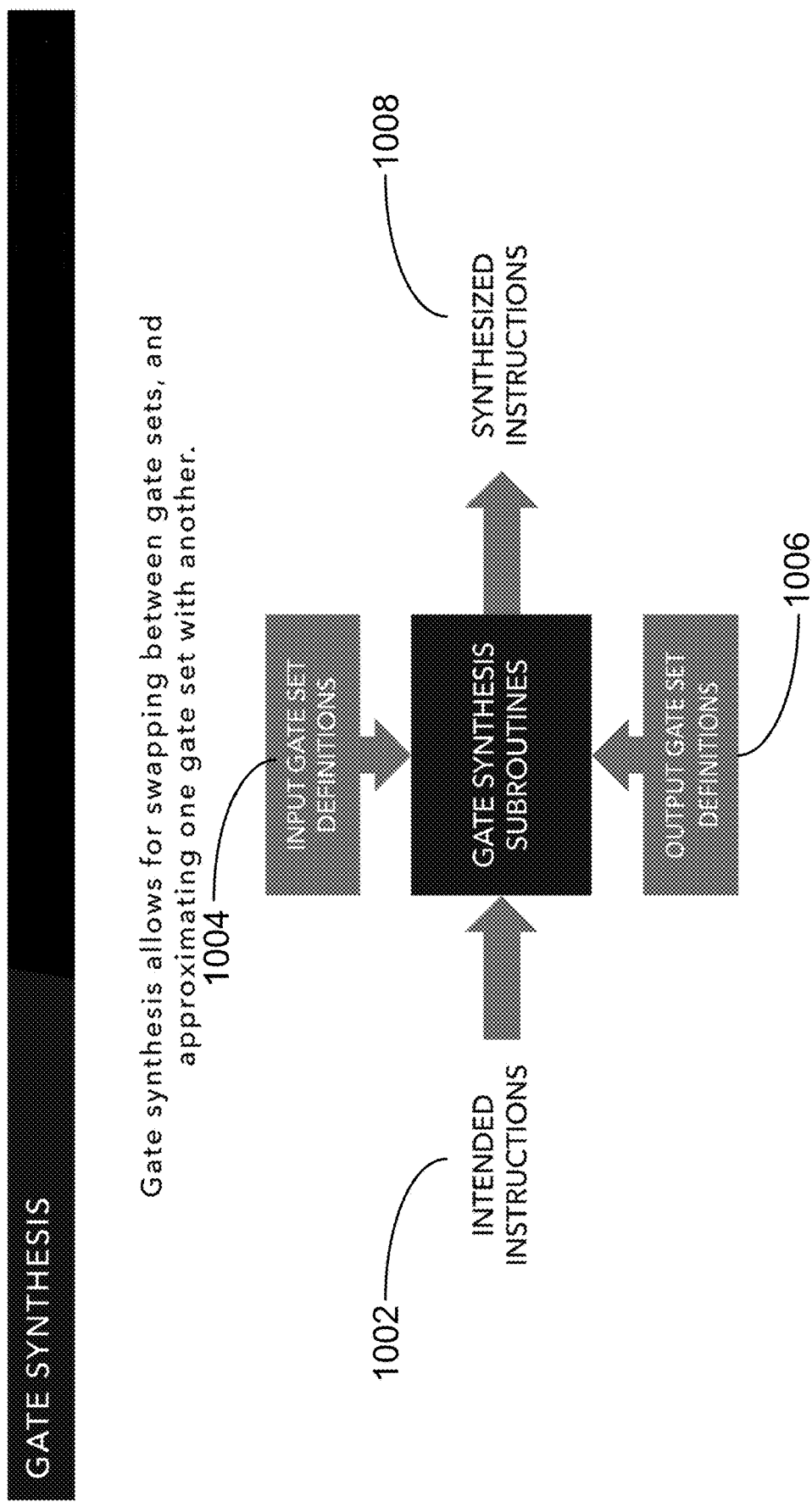
FIG. 10 further illustrates the features of the gate level of a quantum compiler architecture for compiling unified computing language code into code that can be run on quantum computers and/or digital computers in accordance with an embodiment of the present disclosure.

Referring to FIG. 10, one advantage of the use of function handles is to more readily allow for change between quantum hardware instruction sets associated with different quantum computers 64. This change is represented by element 25 of FIG. 31. This is useful since the set of natural gates varies from one quantum computer 64-1 to another. For instance, ion traps with their Molmer-Sorensen gates are different from Kraus reference gates in superconducting qubits 102, which are different from Knill-Laflamme-Milburn (KLM) gates in optical systems. To illustrate, a different language file can be defined (e.g., as illustrated in panel 902 of FIG. 9) for each instruction set of each quantum system that will be used by the quantum program.

For instance, panel 902 of FIG. 9 illustrates a subset of the standard set of gates found in Nielsen and Chuang,*Quantum Computation and Quantum Information*, 2010, Cambridge University Press, New York, which is hereby incorporated by reference. These gates are defined in one embodiment of the present disclosure because they are intuitive to work with. Then, beyond the standard gates, the hydrogen module 110 can be used to define additional gates that are associated with a particular target quantum computer 64. Moreover, the calibration techniques discussed in the calibration section supra can be used to fill in the Kraus operators for each operation that is available on the quantum computer 64. Thus, instead of having the Kraus operator associated with the ideal operation at the physical level, some embodiments of the systems and methods of the present disclosure utilize the calibration techniques discussed above, that consider what is happening physically within the target quantum computer 64, to build the Kraus operators. In some instances, this results in one set of instructions that refer to ideal gates, such as CNOT, that are desired, whereas another set of instructions refer to the actual counterpart of the ideal gate that takes into account the characterization of a specific target quantum system. Thus, in some embodiments, when the quantum code calls for a CNOT instruction on a target quantum processor, the actual quantum gate that is implemented on the target quantum processor has different parameters than an ideal CNOT gate in view of the characterization of the target quantum system. One advantage to having these different instruction sets, e.g. the ability to specify different instruction sets for different target quantum systems, is that this approach allows for exploration of different types of quantum processors, not just qubits 102. Moreover, this approach supports development of novel gates or gates that are hardware specific. Moreover, this approach allows for conversion of instruction sets (e.g., from one type of quantum computer 64 to another type of quantum computer 64) using gate synthesis.

Thus, with the hydrogen module 110, there are ideal gates that the user wants to perform, and for each respective ideal gate, there is a corresponding gate that a particular quantum processor will actually perform when the ideal gate is called. As such, the hydrogen module 110 converts the sequence of ideal gates to the corresponding sequence of gates specific to a particular quantum processor, in view of the characterization of the quantum processor described above, to yield the same outcome or as high fidelity an outcome as possible to achieve the sequence of ideal gates (or an approximation thereof). Thus, the hydrogen module 110 provides the ability to support different gates and define them (e.g., in a structured text file) and, thus allows for the ability to readily work with different instruction sets and to convert between them.

The following provides an example of swapping gate sets in accordance with stage 25 of FIG. 31. Consider the example program written in helium code:

```
#This is a comment
qubit→1
qubit→2
h[1]
cnot[1,2]
rz(0.3)[1]
measure[1]→1
measure[2]→2
```

This code serves as the instructions 1002 of FIG. 10 that the hydrogen level of the compiler 12 compiles. However, the present disclosure is not limited thereto. For instance, in some embodiments, the second code 104 of the beryllium module 102 serves as instructions that the hydrogen level of the compiler 12 compiles.

FIG. 34 illustrates gate synthesis where the target quantum computer 64 is a quantum system with a parameterized gate. Thus, the code of element 1004 of FIG. 34 corresponds to element 1004 of FIG. 10 and provides the input gate set of definitions 1004 based on the instructions 1002 provided above. The code of element 1006 of FIG. 34 corresponds to element 1006 of FIG. 10 and provides the output gate set of definitions 1006 for the target quantum system that includes a parameterized gate.

The code of element 1008 of FIG. 34 corresponds to element 1008 of FIG. 10 and provides the synthesized instructions 1008 for the target quantum system that includes the parameterized gate based on the intended instructions 1002 above and the output gate set definitions 1006 of FIG. 34.

FIG. 35 illustrates gate synthesis where the target quantum computer 64 is a discrete variable quantum system. The setting for FIG. 35 is precisely the same as FIG. 34, the only difference being for FIG. 35 is the use of a gate set where there is a discrete entangling gate, whereas in FIG. 34 there is a parameterized entangling gate. As such, FIGS. 34 and 35 are just two examples of gate synthesis with different target gate sets that differ in the types of entangling gates they support.

The code of element 1004 of FIG. 35 corresponds to element 1004 of FIG. 10 and provides the input gate set of definitions 1004 based on the instructions 1002 provided above. The input gate set of definitions 1004 of FIG. 35 is the same as those for FIG. 34 because the input gate set of definitions 1004 has not taken into account the gates that the target quantum system can efficiently handle or natively supports. The code of element 1006 of FIG. 35 corresponds to element 1006 of FIG. 10 and provides the output gate set of definitions 1006 for the target discrete variable quantum system. The output gate set of definitions 1006 of FIG. 35 for the target discrete variable quantum system differ, with respect to certain gates or gate parameters, relative to the output gate set of definitions 1006 of FIG. 34 because the output gate set of definitions 1006 takes into consideration the gates, or the characterization of gates, that the target quantum system natively supports or efficiently handles. The code of element 1008 of FIG. 35 corresponds to element 1008 of FIG. 10 and provides the synthesized instructions 1008 for the target discrete variable quantum system based on the intended instructions 1002 above and the output gate set definitions 1006 of FIG. 35. Like the output gate set definitions 1006, the synthesized instructions 1008 of FIG. 35 differ from those of FIG. 34 even though they both implement the same intended instructions 1002. FIGS. 34 and 35 illustrate the ability of the gate level module 110 to convert between gate sets when the target quantum system changes.

In gate synthesis (stage 25 of FIG. 31), the compiler 12 can convert between one instruction set and another automatically based on a description of the individual operations. This can be used to address systematic errors of the target quantum computer 64. For example, consider a circuit "C" expressed using ideal (textbook) operations. For example:

```
qubit→1
qubit→2
h[1]
cnot[1,2]
```

This code should generate a maximally entangled state if run on an ideal quantum computer 64. However, the quantum computer 64 is typically non-ideal, such that if the quantum computer 64 were instructed to follow the exact input circuit, it would not produce exactly the correct state, due to small errors in each operation when implemented on the quantum computer 64. What can be done is to characterize the target quantum computer 64 to obtain a description of the quantum channel that is applied to the quantum system when it is sent a particular command. For example, in some embodiments, if the target quantum system is sent the command h[1], some other operation h' is actually applied to the target quantum system. Because this operation differs between each qubit or qudit 102 (while the ideal gate does not), the real operation applied is termed h1 when the intended operation is a Hadamard (h) on the first qubit or qudit 102, and h2 when the intended operation is a Hadamard on the second qubit or qudit 102 of the target quantum system. Similarly, consider the case in which cnot12 is the real (imperfect) operation applied when a cnot command is sent to the target quantum system between qubits 1 and 2, and rz1(theta) and rz2(theta) are the real (imperfect) operations applied when the target quantum system is instructed to implement a Z rotation through an angle theta on qubits 1 and 2 respectively. The goal is to use a sequence of the operations rz1, rz2, h1, h2 and cnot12 to approximate "C" as closely as possible. In general, this optimization problem can be solved.

Referring to stage 24 of FIG. 31, in some embodiments, program representation is processed in accordance with locality constraints of the quantum processor, optionally taking into account quality of the 2-subsystem (e.g. 2-qubit) gates. In some instances, in accordance with the circuit embedding procedure 24 of FIG. 31, when qubits or qudits 102 are routed around a target quantum processor, the quality of the two-qubit 102 gates can be taken into account with bad qubit/qudit couplings minimized.

Stages 24, 25 and 26 of FIG. 31 can be reordered. With respect to stage 25 of FIG. 31, in some embodiments, there is conversion between the instruction set used in the low level language/internal representation and the instruction set used by hardware, using gate synthesis techniques. Referring to stage 26 of FIG. 31, in some embodiments, the code is scanned for opportunities to reduce the instruction count (or improve another user specified metric) within circuit fragments.

Helium (Element 210 of FIG. 3).

Figure 13:
FIG. 13 illustrates the features of a low level of a quantum compiler architecture for compiling unified computing language code into code that can be run on quantum computers and/or digital computers in accordance with an embodiment of the present disclosure.

Referring to FIG. 13 as well as stages 14-19 of FIG. 31, in some embodiments, another module in compiler 12 makes use of a programming language nominally referred to herein as helium. For instance, in some embodiments, the low level module 106 of compiler 12 supports the helium language. In some embodiments, the low level module 106 parses a helium source file (e.g., second code 104 of FIG. 2) to create a parse tree and extract an abstract syntax tree. However, the present disclosure is not limited thereto.

As illustrated by the example helium code of FIG. 13, the helium module 106 can be used to create a new qubit, qudit, or quantum continuous variable 102, or a register with a fixed number of qubits, qudits, or quantum continuous variables 102 using the general form qubit→variable. Lines 1-3 of the example helium code of FIG. 13 provides examples of this approach.

As illustrated by the example helium code of FIG. 13, the helium module 106 has the same instructions as a gate-level language but the instructions of the helium module 106 are augmented with conditionals. For example, referring to lines 5-7 of the example helium code of FIG. 13, the helium module 106 supports an "if" loop. The "if" loop can place control on a qubit or qudit 102 using an "if" statement. Moreover, the helium module 106 can also condition on a classical variable using stylistically similar syntax. For classical controls, the control hardware must support this functionality or allow custom control code. Another example of an "if" loop supported by helium is:

if [a]
 cnot[b,c]
 end

As illustrated by lines 9-11 of the helium code of FIG. 13, the helium module 106 supports repetitions, in which an action is repeated until a predetermined condition (e.g., a classical measurement outcome) is achieved. Thus, lines 9-11 of the code of FIG. 13 is a "repeat" loop monitored on a measurement outcome in which, effectively, a "while" loop continues to execute until a condition defined by getting a particular measurement outcome is met. This cannot be compiled to a circuit and will result in a program that needs to implement control flow logic on the classical hardware controlling the quantum computation (e.g. the FPGAs sequencing pulses and processing readout). The "repeat until" loop monitored on a measurement outcome has the general form:

repeat
 operation
 until [measurement outcome]

Another example of this form of repeat loop is:

repeat
 h[b]
 rz(u)[c]
 h[c]
 until [a]

As illustrated by lines 13-18 of the example helium code of FIG. 13, the helium module 106 also supports subroutines. Subroutines can be defined separately as self-contained blocks of code. Accordingly, each subroutine is then called in the main program. The general form of a subroutine definition is:

sub SubName
 Operation 1
 Operation 2
 endsub

One of skill in the art will recognize that the systems and methods of the present disclosure are not limited thereto. For instance, in some embodiments, a respective subroutine includes at least three operations (e.g., three operations, four operations, five operations, six operations, ten operations, fifteen operations, a hundred operations, etc.). More generally, the subroutines vary in length as they are written by the user. The compiler handles subroutines of any length.

As illustrated by line 10 of the example helium code of FIG. 13, to call a subroutine in the main program the syntax "gosub SubName" is used in some exemplary embodiments. Lines 9-11 of the code of FIG. 13 repeatedly calls the subroutine defined by lines 13-18 of the example helium code until the measurement outcome [a] is realized.

The helium module 106 of the compiler 12 also supports a form of simple loop, termed herein an "increment loop," on the basis that a variable is incremented from "one" to some particular integer value. For instance, referring briefly to FIG. 13, an integer "increment k to 8" is provided in which there is an integer increment K to 8. In the first time (instance) through the loop that starts at line 14 of the code of FIG. 13, K has a value one. The next time (instance) through the loop K have a value of two, then three, then four, . . . , up to a value of eight. This command increments over values of a classical variable, executing a gate that depends on this variable for each pass through the loop. The general form of this loop has the syntax:

increment k to LoopSize
 gate1(k)[target qubit]
 gate2(parameter)[k]
 . . .
 next Another example of an increment loop in helium is:

increment k to 12
 h[k]
 cnot[k,6]
 t[k]
 rz(k)[k]
 next

In some embodiments, the increment loop command provides a "for" loop that is unrollable when executed by the compiler 12. Accordingly, a conditional that, in accordance with a determination that the increment loop is exited, is evaluated from static analysis of the quantum code 62. Moreover, this command does not rely on a measurement outcome or the state of any quantum system of the quantum computer 64.

The helium module 106 also supports "read out." For instance, measurement of a single quantum system/qubit/quantum continuous variable at a time can be executed via a command having the general form:

measure[qubit name]→variable

An example of this is measure[a]→v.

FIG. 33A illustrates another example helium program, in which qubits "a", "b", and "c" are defined and then an increment loop is called that performs a series of gates. Finally qubit "a" is measured. FIG. 33B illustrates another example helium program, in which qubits "a", "b", and "c" are defined. The variable "u" is then set to 9. Then an increment loop is performed with the gate h[k]. Then, qubit "a" is measured and the result of this measurement is placed in variable "v". Next, the subroutine "test" is performed and then the subroutine "test2" is performed. Each of these subroutines performs specified gates. The example programs in FIGS. 33A and 33B illustrate the support of comments using the #symbol. The compiler 12 does not parse comments. It will be appreciated that any symbol or combination of symbols can be used to indicate a comment and that the #symbol is merely exemplary.

What is distinctive about the helium language is its focus on the quantum processor and its controlled hardware. The helium language is not focused on the digital computer 60. Helium is unlike IBM Qiskit where loops are run in Python to construct a circuit. Rather, helium is focused on what should happen on the quantum processor. For instance, loops are not run on a quantum processor, so the compiler of the present disclosure unrolls them to allow for optimization within loops. For instance, if there is a loop that is going to be called many times, it allows an optimization subroutine of the disclosed compiler to be called to run on the current program with the loop to try to optimize what is going on within a loop, such that the loop does not have to done very many times when it is unrolled. For instance, such optimization, before unrolling, can determine if certain actions within the loop can just be done a single time rather than each time the loop is entered on an increment. This leads to an advantage. For instance, if the quantum program has a lot of gates and the optimization identifies certain actions within the loop that only need to be performed the first time in through the loop, the entire loop does not need to be unrolled. Thus, the low level module 106 of the compiler 12 that supports the helium code looks just within conditional blocks, just within repeat loops, etc., and within these increment loops and optimizes within them, before unrolling in order to reduce the complexity of the unrolled circuit. This is an example of optimizing code within the conditional to form an optimized conditional, in which an iteration of a code sequence specified by the optimized conditional has fewer instructions than an iteration of a code sequence specified by the conditional, prior to unrolling the optimized conditional into a series of quantum gates. However, the present disclosure is not limited thereto.

The "repeat until" feature of the helium language allows for quantum programs that have an indefinite run time. For example, the quantum programs do not necessarily have to terminate after a set, predetermined, number of gates. In some embodiments, the quantum programs run for longer depending on a plurality of measurement outcomes. For instance, in some embodiments, an example quantum program executes a first set of gates, performs one or more measurements and, based on one possible outcome of these one or more measurements, executes a second set of gates and, based on another possible outcome of these one or more measurements terminates or executes a third set of gates. The "repeat until" construct of the helium language allows for quantum programs of this nature.

Figure 14:
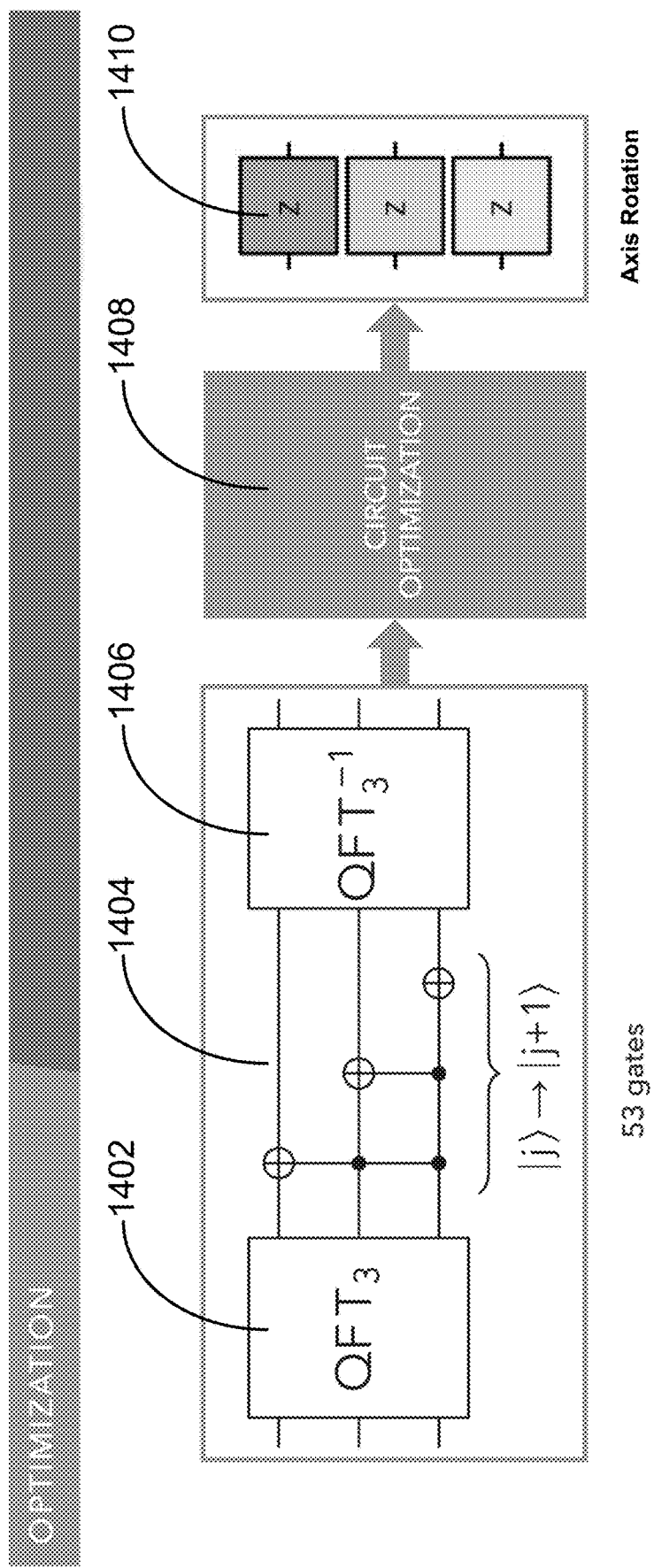
FIG. 14 further illustrates the features of the low level of a compiler architecture for compiling unified computing language code into code that can be run on quantum computers and/or digital computers, in which the Z gates indicated on the right of this figure are not actually Z gates but rotations about the Z axis by an angle indicated by their color, in accordance with an embodiment of the present disclosure.

FIG. 14 provides an example of some of the optimization subroutines used in some embodiments of the low level module that supports helium source code. FIG. 14 implements a quantum Fourier transform (QFT) 1402, an incrementer 1404, and then an inverse QFT 1406 for a total of 53 gates. When this is encoded in helium and compiled by the low level module of the compiler of the present disclosure, because of the circuit optimization subroutine 1408 of the low level module, the 53 quantum gates are reduced to just three quantum gates 1410. In FIG. 14, the Z gates indicated on the right of this figure are not actually Z gates. Rather, they are rotations about the Z axis by an angle indicated by their color.

Figure 29:
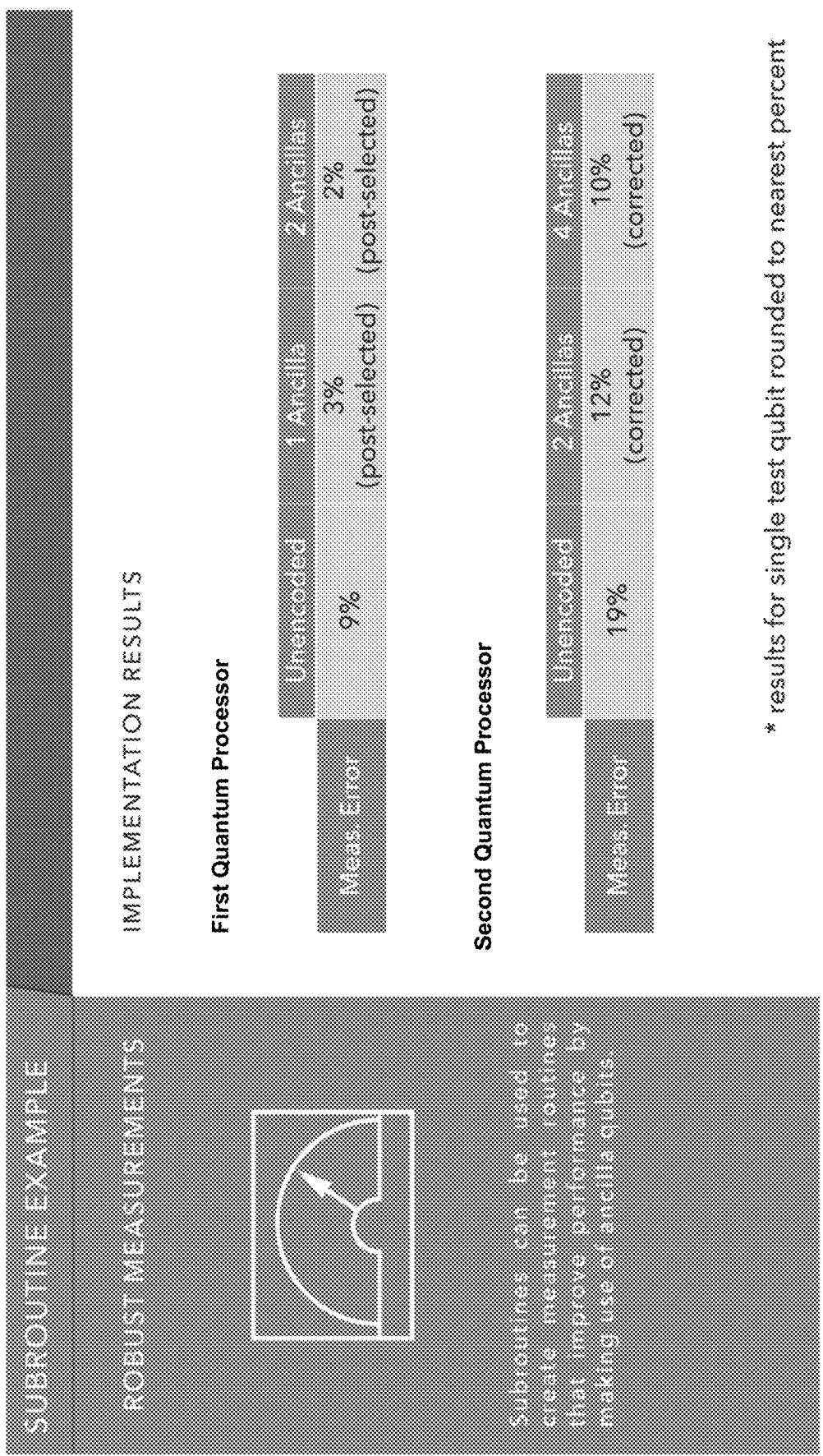
FIG. 29 illustrates improvement in measurement error in two different quantum computing chips by making use of ancillas in accordance with an embodiment of the present disclosure.

Referring to FIG. 29, in some embodiments, the helium codes and its associated low level module 106 supports subroutines. For instance, in some embodiments, it is useful to define measurement subroutines. For single qubit or qudit 102 experiments, for example, or two qubit experiments, it is often the case that there are many extra qubits 102 on many target quantum processors, whether these are superconducting processors, ion trap, or the like. When this is the case, the measurement subroutine can be made more accurate by making use of these extra, unused qubits or qudits 102 for the measurement subroutine. For instance, the unused qubits or qudits 102 can be used as ancillas when doing the aforementioned measurement. Therefore, instead of measuring a single target qubit 102, a fanout from the qubit 102 with CNOTS onto some ancilla qubits 102 is enacted, and then those ancilla qubits 102 are measured together with the single target qubit 102. Error correction can then be applied to see if they all give the same result or, alternatively, error correction can be used to, for example, take the majority vote from the initial qubit and the ancilla qubits 102.

Specifically, FIG. 29 top panel compares the performance of using no ancillas (unencoded), 1 ancilla, and 2 ancillas a particular quantum processor. The particular qubit 102 used had an unencoded error rate of 9%, which is a reasonably high measurement error. CNOTs also have high error, but some of the errors that occur are a form of dephasing error on the control qubit 102, for example, that does not affect measurement outcome because that dephasing ultimately commutes with the measurement of that qubit 102. Ultimately, the result illustrates the ability to use fan out a couple of times. Therefore, on the quantum processor under study for FIG. 29, one pseudo copy was made and the results compared. If a zero-zero or one-one was obtained, this was compared to what state that qubit was actually in. In this way, it is seen that an improvement from 9% on average to 3% on average for post-selection is achieved if one ancilla is used, and if two ancillas are used, an improvement to 2% with post-selection is achieved. Therefore, this form of measurement subroutine supported by helium is useful. With it, each time and experiment is run, measurements that are more robust can be made without having to implement the fan-out details each time. Rather, the measurement subroutine takes care of these fan-out details.

Similarly, referring to the lower portion of FIG. 29, the same measurements was made with a different commercially available quantum processor. The qubits on this quantum processor had an unencoded error rate of 19%. Using two ancillas, and using majority vote error correction, such that there was no discarding of results, and no post-selection, improved this error rate from 19% to 12%. Using four ancillas improved the error rate from 19% to 10%. This suggests that there is a diminishing return as the number of ancillas is increased, because ultimately, if enough CNOTs are not performed, the error rate is elevated rather than suppressed. However, consistent with FIG. 29, at least a factor of two performance gain is exhibited from most of these quantum systems and in some cases more.

Referring to stage 18 of FIG. 31, here, in some embodiments, the program written in helium is converted into a set of quantum circuit fragments (expressible in hydrogen) together with classical control flow (not generally expressible as a quantum circuit) that dictates how these circuit fragments are combined when run on hardware based on measurement results obtained during the computation. Such a representation is useful for general quantum computation, although there are many instances where this will simply amount to a single quantum circuit. The ultimate output of the compiler 12 is a finite state machine to govern the behavior of the control systems that determine the signals they send to quantum computing hardware. However, there are many cases where classical (digital) control logic is avoided and just output a quantum circuit or pulse sequence in a suitable instruction set (though the full finite state machine is necessary for the most general form of computation). Referring to stage 19 of FIG. 31, at this point the code can be optionally scanned for opportunities to reduce the instruction count (or improve another user specified metric) within circuit fragments. Referring to stage 28 of FIG. 31, the output of the low level module 106 can be run on a simulator rather than a quantum processor.

However, as described supra, one of skill in the art of quantum computing will appreciate that the helium code and associated low level module 106 of the compiler 12 are not required to utilize the systems and methods of the present disclosure.

Beryllium (Element 208 of FIG. 3).

Referring to FIG. 15 and stages 8-13 of FIG. 31, a description of the high level module 102 and the beryllium language of the compiler 12 is further provided. The high level module 102 parses the beryllium source file (first code 15 of FIG. 2) to create a parse tree and extracts an abstract syntax tree. Moreover, the high level module 102 forms the second code 104 that includes a plurality of data elements in one or more quantum data structures. The one or more quantum data structures of the second code 104 is determined by the high level module 102 from one or more digital data types in the first code 15 of the unified language module 14. Additionally, beryllium has access to the gate level commands, but this language of the high level module 102 also supports the definition of functions and/or data structures, and also allows breakable loops that cannot be unrolled. An example of a breakable loop is a "for" loop in which, in accordance with a determination that a plurality of conditions is satisfied, there is a break. In this instance, the compiler 12 cannot determine ahead of time how many times the loop needs to be conducted before the break is initiated. A sample embodiment includes one in which it is desired to coherently break out of a first loop, meaning to traverse the first loop some number of times, exit that first loop, go into another second loop some number of times, come out of that second loop, and then perform a measurement at the end of this described sequence. In this instance, a total run time is known but what is not known is how many times the first loop and/or the second loop was traversed. There is a superposition of different possible numbers of times through each of the first loop and the second loop, as long as the total run time is fixed.

Additionally, the beryllium language of the high level module 102 supports pointers. FIG. 16 provides one example where this support of pointers is particularly useful. Referring to FIG. 16, in some embodiments, instead of passing a specific parameter to a gate, for instance a digital parameter such as an angle, an address range or a set of addresses is passed. From this, the code will look at the value stored in that address range and implement the gate based on that stored value. For instance, in some embodiments, if the parameter is an angle, the angle is passed to the gate as an address range. However, the present disclosure is not limited thereto. The angle is read from the address range and the gate is implemented with the rotation specified by the address range. Accordingly, FIG. 16 illustrates a line of beryllium code, in which qubits "A" and "B" specify an angle a Z rotation (an RZ gate) that is to be performed on qubit "C." This requires a relatively large number of gates to set up and implement, which is difficult to accomplish. This operation is a key component in the HHL algorithm and can be difficult to implement as a set of quantum gated because the gate sequence is difficult to arrange. See Harrow et al. 2009, "Quantum algorithm for solving linear systems of equations," Phys. Rev. Lett. 15, 150502, which is hereby incorporated by reference in its entirety With beryllium language of the high level module 102 of the present disclosure, this approach can be done "on the fly" for any gate. For instance, as a non-limiting example, given a function specifying a plurality of Kraus operators for a particular unitary gate, and a range for which a parameter should take on, and a number of qubits or qudits 102 read (e.g., as a set of addresses) the high level module 102 can automatically generate a circuit (set of gates) that implements that controlled rotation. In this way, in some embodiments, the supported pointers are encoded on qubits or on qudits 102 and used in the functions, loops that cannot be unrolled, recursion, data structure definitions, class object definitions located in the first code 15, or a combination thereof.

Figure 30:
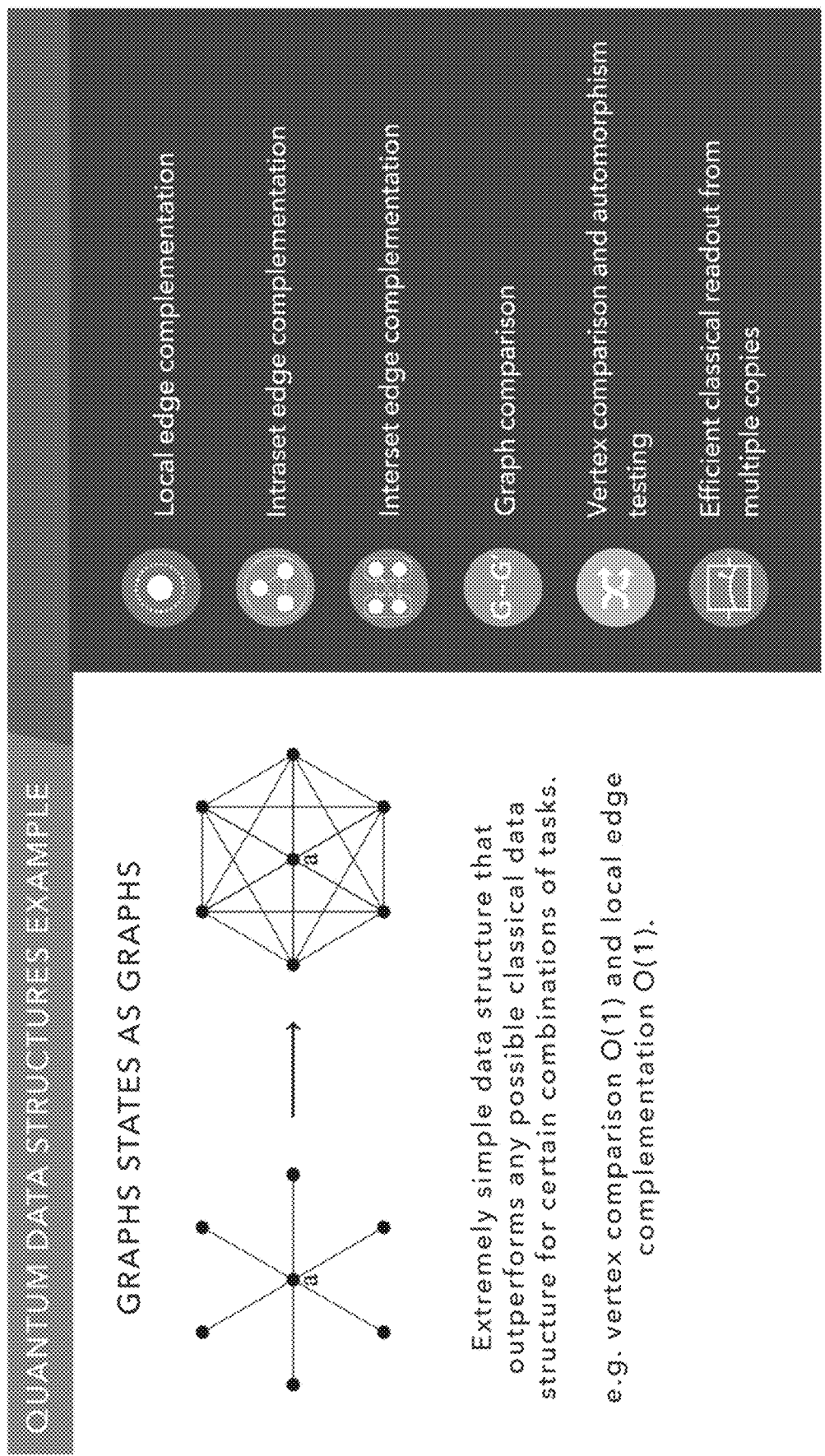
FIG. 30 illustrates implementing quantum data structures, such as a graph structure.

Referring to FIG. 30, one embodiment for utilizing the high level programming language beryllium of the compiler 12 is to support the implementation of quantum data structures. In other words, in some embodiments, the beryllium language implements various data types that make use of quantum states to store the data types. One of skill in the art will appreciate that different data types that make use of quantum mechanics can outperform comparable digital implementations of such data types in many instances. Thus, the beryllium language of the high level module 102 of the present disclosure provides tools for designing how data is structured. By using quantum structures, sometimes novel ones, to solve a computational problem, the associated algorithm can be simplified. To illustrate an extreme example of the utility of using quantum data structures, rather than using a complex algorithm (e.g., a complex set of gates) to solve a given computational problem, in some embodiments, the given computational problem is solved by defining a particular quantum data structure and coupling the data structure with a simple instruction that applies a particular manipulation of the quantum data structure. A nonlimiting example quantum data structure for a graph is the encoding of the graph as multiple copies of the corresponding graph state. By contrast, a nonlimiting example of a classical data structure for a graph is an adjacency matrix (or alternatively an edge list).

In some embodiments, the beryllium language of the high level module 102 defines a plurality of data types. In some embodiments, the plurality of data types defined by the beryllium module 102 is used in coordination with the carbon language of the unified level module 14. However, the present disclosure is not limited thereto. According, by defining the plurality of data types, the compiler 12 utilizes one or more quantum mechanisms to implement the plurality of data types. In some embodiments, the one or more quantum mechanism utilized to implement the plurality of data types includes using a plurality of quantum states to store data or manipulating a plurality of digital data structures using one or more quantum algorithms. As a non-limiting example, consider a plurality of matrix operations performed on a digital computer 60. In some embodiments, the high level module 102 implements the plurality of matrix operations in a quantum manner, as opposed to being performed on the digital computer 60, allowing for better performance than is possible if utilizing the digital computer 60 based on a consideration of performance between one or more operations for the data types supported by the present disclosure. For matrix algebra, this implementation is conducted by storing a procedure to generate the (i,j)-$^{th}$ entry of the matrix, and then defining a plurality of quantum procedures to perform one or more matrix operations based on this entry. Additional details and information regarding a matrix algebra procedure is found in Zhao et al., 2019, "Compiling Basic Linear Algebra Subroutines for Quantum Computers," arXiv:1902.10394, which is hereby incorporated by reference in its entirety.

Accordingly, in some embodiments, the languages of the present disclosure are used to define a quantum data structure in accordance with a type of a digital data structure. One example of a digital data structure is a vector. One example of using the languages of the present disclosure to define a quantum data structure in accordance with a type of a digital data structure is to use vectors to store the state vector of a system. State vectors are, for example, the basis of HHL type algorithms. In the HHL algorithm, the quantum computer 64 manipulates a real-valued vector. That is, the real-valued vector is loaded into a computational register, where the elements of the vector are encoded in the amplitudes of a quantum state. As quantum states are normalized, these amplitudes will be the elements of the vector scaled by the normal of the vector. See Dervovic et al., arXiv: 1802.08227v1 [quant-ph] 22 Feb. 2018, which is hereby incorporated by reference. It will be appreciated that, beyond the above example of using state vectors of a quantum system to represent digital vectors, other quantum structures could be used to store digital vectors and, conversely, state vectors of a quantum system could be used to represent other forms of digital data structures.

Another example of using the languages of the present disclosure to define a quantum data structure in accordance with a type of a digital data structure is to store a graph using copies of the corresponding graph state. This allows a designer to directly perform local edge complementation (e.g., as illustrated in FIG. 30), where, for a particular vertex a, in accordance with a determination that no edge between the neighbors one is drawn, and if there is an edge, the edge is removed. Using this data structure, this operation can be done around individual vertices in O(1). In some embodiments, storage of the graph as a graph data structure allows for intraset edge complementation to be performed. If a subset of vertices is picked, all of the edges between the subset of vertices can be complement in linear time. By contrast, in common classical graph representations, this would require quadratic time. However, a quantum data structure can be constructed that allows this to be done in O(1). See Zhao et al., 2016, Fast Graph Operations in Quantum Computations,"

In some embodiments, the quantum data structure provides for intersect edge complementation. By way of example, in some embodiments, given two different sets in a graph, all the edges between the two different sets in the graph is complemented in linear time using one or more quantum data structures. In yet a further embodiment, the quantum data structure provides for a graph comparison in which at least two graphs are compared with a constant probability of success independent of a graph size, in linear time. In some embodiments, the quantum data structure provides for vertex comparison in O(1). However, the present disclosure is not limited thereto.

In some embodiments, automorphism testing is conducted in which a particular operation is tested to determine if the particular operation is an automorphism on the graph. In some embodiments, this determination is performed with constant success probability in the time it takes to implement the automorphism. For instance, if there are 2n copies of these, they can read out digitally to output the graph. However, only O(n), where n is the number of vertices, qubits or qudits 102 is needed to store this data. Accordingly, less qubits or qudits 102 is required in comparison to storing the adjacency matrix, in which a linear number of copies is needed for a recovery. In such embodiments, a digital data structure does not provide the same performance of this for certain pairs of operations, for instance vertex comparison in O(1), and local edge complementation in O(1). While a digital data structure that allows either one of these instances to happen in O(1), a digital data structure does not exist that allows one of skill in the art to do both in O(1). The best one can achieve with a digital data structure results in an average of the complexity of vertex comparison with the complexity of the local edge complementation being O(n) basic operations. The above provides an example of how the beryllium language of the high level module 102 supports data structures and classes such that various different kinds of quantum data types that make use of quantum mechanics, rather than digital computing, are used.

Referring to stage 13 of FIG. 31, here, in the compiler 12 workflow, the code can, optionally, be scanned for one or more opportunities to reduce an instruction count (or improve another user specified metric) by making local changes within the program. However, the present disclosure is not limited thereto.

Carbon (Element 202 Through 206 of FIG. 3).

Figure 17:
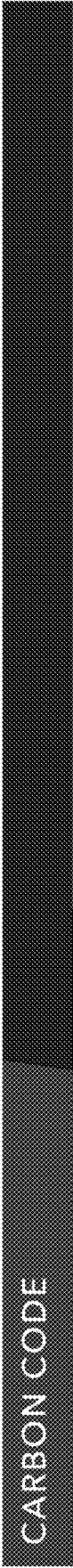
FIG. 17 illustrates the features of a unified level of a quantum compiler architecture for compiling unified computing language code into code that can be run on quantum computers and/or digital computers in accordance with an embodiment of the present disclosure.

Referring to FIG. 17 as well as stages 1-7 of FIG. 31, attention now turns to the unified level module 14 and the carbon language that the unified level module 14 of compiler 12 supports. In some embodiments, the unified level module 14 parses a carbon source file to create a parse tree and extracts an abstract syntax tree. In some embodiments, the carbon language provides a subset of Matlab functionality, a subset of Python functionality, a subset of Octave functionality, a subset of C/C++, or a combination thereof functionality. However, the present disclosure is not limited thereto. As a non-limiting example, in some embodiments, the carbon language provides subset of functionality of a digital numerical analysis application (e.g., FreeMat, Perl, etc.). One of skill in the art of the present disclosure will appreciate that other functionality provided by the carbon language of the unified level module 14 of the compiler 12 is within the scope of the present disclosure. Referring briefly to the left-hand side of FIG. 17, a non-limiting example of a carbon code (e.g., first code 15 of FIG. 2) is provided. The carbon language of the unified level module 14 allows a subject to write digital code in order solve a quantum problem, such as in a form of a script written in the carbon language of the high level module 14. In some embodiments, the compiler 12 compiles the carbon code to a high level quantum language (beryllium language of a high level module 102 of FIG. 2), then to a lower level (a helium language of a low level module 106 of FIG. 2, a hydrogen language of a gate level module 110 of FIG. 2, or a sequence of gates of a quantum computer 64). However, the present disclosure is not limited thereto. For instance, in some embodiments, the compiler 12 compiles directly to a low level (e.g., helium language, hydrogen language, or a sequence of gates). In other embodiments, the compiler 12 compiles the carbon code to a high level quantum language (e.g., beryllium language of high level module 102 of FIG. 2) then to a gate level quantum language (e.g., hydrogen language of gate level module 110 of FIG. 2. In some embodiments, a component of compiler 12 illustrated by stage 12 of FIG. 31 handles such a conversion.

In some embodiments, a goal of the compiler 12 is to take a digital code (e.g., conventional source code 502 of FIG. 5) and, ultimately, using the unified level module 14, high level module 102, and gate level module 110 of the compiler 12, turn the digital code into a set of quantum gates that accomplishes a quantum task in an optimized manner. In some embodiments, the optimized manner accomplished by the quantum task includes fewer operations than would be specified by conventional quantum computing processes. In other embodiments, the optimized manner accomplished by the quantum task includes fewer operations than would be specified by conventional digital computing processes. However, the present disclosure is not limited thereto. For instance, in some embodiments, the compiler 12 takes the digital code and, ultimately, using the unified level module 14, the high level module 102, the low level module 106, and the gate level module 110 of the compiler 12, turns the digital code into a set of quantum gates that accomplishes the quantum task in an optimized manner. However, the present disclosure is not limited thereto. In other embodiments, the compiler 12 takes the digital code and, ultimately, using the unified level module 14, the high level module 102, and the gate level module 110 of the compiler 12, turn the digital code into a set of quantum gates that accomplishes the quantum task in an optimized manner.

Figure 18:
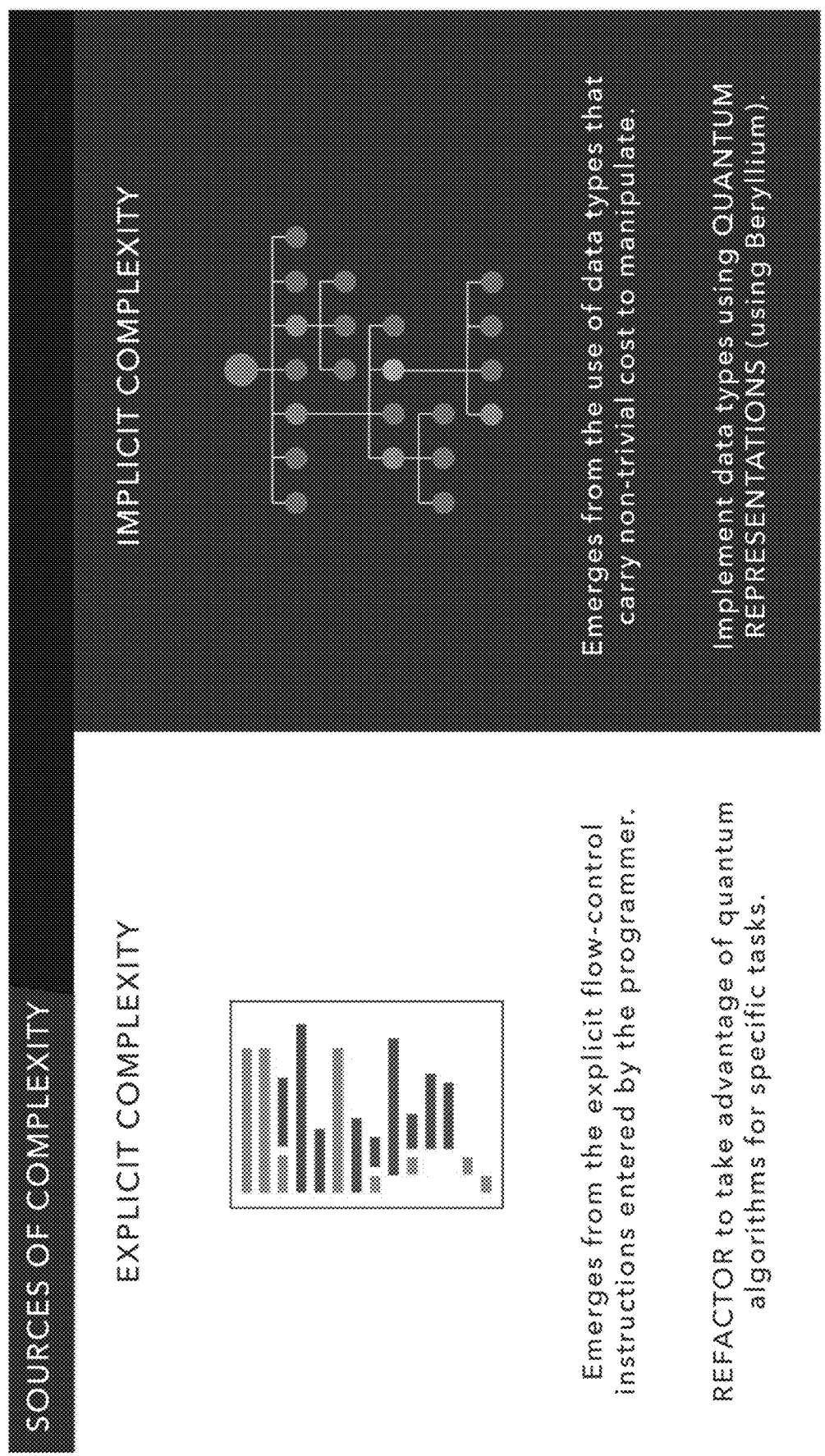
FIG. 18 illustrates sources of complexity that arise in a unified computing language code in accordance with an embodiment of the present disclosure, and how they are processed by the compiler.

FIG. 18 illustrates an approach that is taken to produce a set of quantum gates that accomplishes a task with fewer operations than would be specified by conventional quantum computing processes. Here, consider that two elements markedly slow down processing of a quantum code (e.g., quantum code 62 of FIG. 1): explicit complexity and implicit complexity in the quantum code. As such, the compiler 12 provides a set of tools to address this explicit complexity and implicit complexity in the quantum code 62 in order to produce the set of quantum gates that accomplishes a task with fewer operations.

As used herein, the term "explicit complexity" refers to one or more steps hard coded by the programmer into the code that are necessarily slow to process. An example of this explicit complexity is a code specifying that a loop be repeated a million times. The loop in such a situation is repeated a million times because the programmer has instructed the digital computer 60 to do the loop a million times. Another example of explicit complexity is a situation in which a recursive algorithm that is a certain number of levels deep. Accordingly, each level of the recursion is going to be performed until the requested number of levels of recursion have been performed.

Yet another feature that generates complexity is an implicit cost of computational operations, for example, operations that multiply matrices together when performed using classical code. While a single line of classical code can be written in a program like Matlab or carbon language of a unified level module 14 to multiply matrices together, the complexity of the resulting matrix multiplication scales effectively with the cube of the size of the matrix.

In some embodiments, an approach taken with the compiler 12 is to, if possible, refactor the code that is causing such explicit complexity in a way that no longer includes the explicit complexity. One such approach is to covert the explicit complexity into implicit complexity, and then to optimize the implicit complexity by using better implementations of various data types. For example, by using quantum algorithms to optimize one or more of the functions that arise by converting the explicit complexity into implicit complexity. FIG. 19 illustrates an example of this approach of complexity conversion. Specifically, FIG. 19 illustrates example Matlab code. Lines 1-7 of the code recursively defines a particular matrix. Thus, in lines 3-7, each i-j$^{th}$ entry of the matrix is defined. Lines 9-11 of the code defines and sets a plurality of constants. Next, lines 13-19 of the code defines a loop that finds a hottest location in a heat map matrix that was defined by lines 1-7 of the code. Finally, lines 24-28 of the code defines another loop that moves along a diagonal in the array until a value on the diagonal exceeds five, at which point process control breaks out of the loop.

When the compiler 12 compiles the code illustrated in FIG. 19, the compiler 12 pulls apart the loops in an attempt to simplify them. FIG. 20 illustrates an embodiment of such simplified loops from the code of FIG. 19. The compiler 12 breaks apart the complex loops to form a plurality of simpler loops. Thus, instead of the complex loop defined by lines 13-19 of the code of FIG. 19, the compiler 12 provides two simpler loops, lines 13-15 and lines 17-22 in FIG. 20. This simplification is opposite of how one would optimize using a conventional compiler for digital computing on a digital computer 60. For instance, the conventional compiler typically synthetizes small loops together such that less branch conditions exists, which in turn allows for a lower chance of making an incorrect branch prediction.

Turning back to FIG. 20, beyond complex loops being rearranged into simpler loops, in some embodiments, the optimization provided by the compiler 12 includes a reordering of a plurality of comparisons and/or if statements in the code. For instance, in some embodiments, from the reordering, the compiler 12 further classifies the loops. As such, referring to FIG. 21, the first loop, loop 2102, recursively defines the i-j$^{th}$ entry of a matrix. In some embodiments, utilizing HHL (Harrow et al. 2009, "Quantum algorithm for solving linear systems of equations," Phys. Rev. Lett. 15, 150502) is desirable, if possible, such that the matrix is stored not with an explicit store of each of the values of the matrix, but rather with an oracle that returns the i-j$^{th}$ element when given i-j. That is, instead of having the loop 2102, a function is provided that, given i-j, provides the i-j$^{th}$ entry of a heat map. This can be accomplished without ever going through the "for" loops. As such, in some embodiments, a closed form expression is found by the compiler 12 that computes the i-j$^{th}$ entry of the heat map without having to go through the recursion, by realizing that there is a closed form way to arrive at a solution.

Next, referring to element 2104 of FIG. 21, again, in some embodiments, there is a relation that is found for a second loop, and it is analytically solved. However, the present disclosure is not limited thereto.

Referring to some embodiments, the compiler 12 compiles a loop as a quantum extremal value search, such as a quantum maximum value search. By way of example, loop 2106 of FIG. 21 can be coded as a quantum maximum value search. From this, the loop seeks an extremal value.

Loop 2108 of FIG. 21 is an example of a sequential search. In the illustrated example, none of the searches include Grover searches. However, in some embodiments, a maximum value search 2106 and a sequential search 2108 is constructed using amplitude amplification-based computation, which is a form of quantum computation. The loop that is analytically solved (e.g., element 2104 of FIG. 21), because of a data type of matrices, yields a faster processing time taking log time instead of linear time, because the loop 2104 is classically run twice, would conduct in 9998 squared steps. Thus, as implemented by the compiler 12, a solution is performed in the log of 9998. The two searches 2106 and 2108, as implemented by the compiler 12, thus provide quadratic speedup. Accordingly, the net result is that the compiler 12 produces a quantum algorithm and a quantum circuit that has effectively 300,000 times fewer operations at an algorithmic level (e.g., assuming that the quantum computer 64 is noiseless and without considering full tolerant overhead). This shows that the compiler 12, being able to go from digital code to a quantum algorithm, accomplishes an optimization of the computing problem. Here, this optimization occurs with fewer operations. However, the present disclosure is not limited thereto. In some embodiments, in which the quantum algorithm does not speed up the code because there is a satisfactory or better digital solution, the compiler 12 then compiles to a digital processor of a digital computer 60, rather than a quantum process of a quantum processor 64. For example, in some embodiments, if the source code is computing priority, there is already a sufficient classical algorithm to compute priority and an improved quantum algorithm is not needed (or similarly the improved quantum algorithm is not available). This is but one example where a quantum algorithm or a quantum data structure will not be able to speed up a computational problem, and, consequently, a priority computation is relegated to a digital processor of a digital computer 60.

The processing of a complex looped defined by lines 13-19 of the code of FIG. 19 is an example of stage 5 of the compiler 12. In some embodiments, a plurality of loops is refactored, simplified, classified, replaced, (or a combination of any of these steps) by the compiler 12, such as by replacing the plurality of loops with an object constructor call. By way of example, a plurality of loops is processed by the compiler 12 to identify one or more independent instructions and to separate the one or more independent instructions into a collection of simpler loops. The compiler further classifies this collection of simpler loops 12 based on an effect: if the collection (plurality) of simpler loops have an effect only in accordance with a determination that a particular condition is met, if the plurality of simpler loops is a recursive definition, etc. From this, the loops are then replaced by a different procedure that achieves the same result more efficiently. One of skill in the art in view of the present disclosure will appreciate that a wide variety of such loop classes exists. In some embodiments, one or more loop classes is replaced with one or more quantum procedures, such as max-value searches, recursive array/matrix definitions, sequential searches. In some embodiments, one or more loop classes is accelerated using purely digital processing via a digital computer 60.

The processing of the code of FIG. 19 also highlights the function of stage 6 of compiler 12 recursive processing. In some embodiments, one or more recursive functions is refactored, simplified, classified and replaced. A similar treatment is applied by the compiler 12 to various recursive functions and function calls, by refactoring the recursive functions and function calls into a corresponding sequence of simpler function calls. From this, the compiler 12 further classifies each function call in the corresponding sequence of simpler function calls and replaces each function call with a more efficient procedure that achieves the same result, or substantially the same result.

The processing of the code of FIG. 19 by the compiler 12 further illustrates an aspect of a function of stage 7 of the compiler 12, various quantum data structures, and low-level algorithms. Where possible, a plurality of data types is implemented using quantum processing. In some embodiments, the plurality of data types include one or more vectors, one or more arrays, one or more matrices, one or more graphs, one or more queues, etc., or a combination thereof, which implemented using quantum states and quantum algorithms for processing, which provides better performance considerations for operations than are possible if utilizing a digital computer 60.

Stage 5 of the compiler 12 associated with loop processing, stage 6 of the compiler 12 associated with recursion procession, and stage 7 of the compiler 12 associated with data structures operate in any order to construct quantum algorithms. For instance, any one or more of the loop processing (stage 5), the recursion processing (stage 6), and the data structures (stage 7) of the compiler 12 is used to construct such quantum algorithms and these fundamental techniques (loop processing, recursion processing, and data structures) are used in any order to produce such quantum algorithms. As used herein, the term "quantum algorithm" is any algorithm that specifies one or more gate sequences to be performed on a target quantum processor of a quantum computer 64.

While the compiler 12 of the present disclosure utilizes the carbon language of the unified language module 14 as a top level language, the present disclosure is not so limited. By way of example, the compiler 12 analyzes loops, recursion, and data types, as described above. Accordingly, in some embodiments, the compiler 12 is used to compile code written in any digital programming language that makes use of loops, recursion, data types (e.g., C, C++, Python, Ruby), or a combination thereof into a code that can be simulated using a quantum simulator or that can be directly run on a target quantum processor of a quantum computer 64.

Referring back to FIG. 19, one of skill in the art will recognize that, if the digital code had been written more efficiently, it is quite possible that a problem addressed by the code of FIG. 19 could be handled in a more efficient manner by a digital computer 60. As a non-limiting example, given an input code in a carbon language of a unified language module 14, the compiler 12 determines whether the input code can be converted to a quantum code 62 that takes significantly less time to run than if the input code were compiled and run on a digital computer 60.

In some embodiments, an architecture of a target quantum system is determined in accordance with an implementation of the target quantum system. For instance, in some embodiments, the quantum code 62 does not provide a dramatic speedup in processing in comparison to the digital computer 60. For instance, considerations of a full tolerance, an overhead from the full tolerance might reduce an algorithmic level speedup. Moreover, whether there is a quantum speedup is dependent on the nature of the quantum target processor that will ultimately run the code. For instance, in some embodiments, a nearest neighbor quantum architecture is not as fast as fully connected quantum architectures for a plurality of operations. Moreover, limitations exist on quantum architectures that are supposed be fully connected, such as ion traps. Accordingly, in some embodiments, a connectivity graph beyond a certain size does not necessarily need to be planar. This is particularly true for quantum systems such as optical quantum systems. In such quantum systems, every qubit 102 is only able to interact with a constant number of other qubits 102, but the qubits 102 used for a quantum operation in such quantum systems can be at any physical address of the quantum system. Therefore, in some embodiments, one or more interaction graphs are derived for such quantum systems that are much better suited to long-range communication, while still having a constant degree in terms of a number of neighbors of each qubit or qudit 102. However, the present disclosure is not limited thereto.

One of skill in the art of the present disclosure will appreciate that different quantum processors for a quantum computer 64 have comparatively different performances if handling quantum RAM (qRAM). qRAM is described in Dervovic et al., arXiv:1802.08227v1 [quant-ph] 22 Feb. 2018, which is hereby incorporated by reference. One background feature when performing a HHL type operation for matrix data structures, for example, or tensor data structures is a use of qRAM. However, some quantum processors do not utilize qRAM. In such instances, to perform a quantum algorithm that typically needs qRAM to run on a quantum processor that does not natively support qRAM, the compiler 12 determines whether a performance gain over a digital computer 60 is still achieved if qRAM is synthesized from the instructions that are available on the quantum computer 64. For instance, in some embodiments, to synthesize qRAM on a quantum processor that does not natively support qRAM, an address register and a return register is built out of gates within the quantum computer 64, such that a set of qubits or qudits 102 is assigned to be a pointer register that points to an address in the memory, and another set of qubits or qudits 102 to be its return, and then a sequence can be constructed out of a series of Fredkin gates (Fredkin and Toffoli, 1982, "Conservative Logic," International Journal of Theoretical Physics. 21(3-4), pp. 219-253, which is hereby incorporated by reference) or an analogous mechanism that will perform the function of qRAM. However, the noise from such a complex set of gates is likely to make the performance of the set of gates worse than the digital equivalent. In addition, such a process is a linear chain and so incurs a linear overhead. On the other hand, if the code calls for an operation that is not a linear chain, like a square lattice, then the compiler 12, in some embodiments, speeds up the quantum implementation over a digital implementation. In some embodiments, the speedup is an exponential speedup that is realized with the HHL type algorithms. However, the present disclosure is not limited thereto. In some embodiments, the speedup realized by the compiler 12 for the quantum implementation over the classical implementation is a square root speedup, due to overhead. For instance, in some embodiments, the speedup for the quantum implementation over the classical implementation by compiler 12 is a square root speedup, such as for QRAM type queries rather than O(n) or logarithmic time. In some embodiments, square root is not as much of a speedup, yet a square root event is still less than the linear speed that would be required on a digital computer 60 for various computational operations. Moreover, in such embodiments of a three dimensional array, a quantum implementation by the compiler 12 is a cubic root event or comparable, depending on a connectivity between qubits or qudits 102, which is dependent on a quantum computer 64.

One of skill in the art in view of the present disclosure will appreciate that digital algorithms exists that the disclosed compiler 12 cannot optimize or speed up beyond the all-digital equivalent. In some such embodiments, the compiler 12 will take the code that is written and determine a set of algorithms or instructions for optimization. In some embodiments, the set of algorithms or instructions include a first plurality of algorithms or instructions that is computed efficiently on a digital computer 60 and/or a second plurality of algorithms or instructions that is computed efficiently on a quantum computer 64. Accordingly, the compiler 12 communicates the first plurality of algorithms or instructions to a digital processor of the digital computer 60 and/or communicates the second plurality of algorithms or instructions to a quantum processor of the quantum computer 64.

In some embodiments, the compiler 12 compiles function by function in accordance with a determination that such compiling is possible, to build up a tree of elements that depend on one another, and determine within that tree, up to what level is provided to what quantum processor of a quantum computer 64. If a number of different quantum processors are available to the compiler 12, the compiler 12 determines how to split one or more tasks between the quantum processors of the quantum computer 64, which of the tree of elements are best suited for which quantum processor, which of the tree of elements are not sped up quantum mechanically and should be computed on a digital computer 60, which should be implemented on a graphical processing units (GPUs) of the digital computer 60 versus done on digital central processing units (CPUs) of the digital computer 60, or a combination thereof. Moreover, the compiler further considers, in some embodiments, parallelization. For instance, if an element in the tree of elements can be parallelized and there are a plurality of digital target processors to use, using multiple target processors.

The compiler 12 provides different languages for each of levels of modules (e.g., unified level module 14 of FIG. 2, high level module 102 of FIG. 2, gate level module 110 of FIG. 2) of the compiler 12 in order to handle different use cases. By way of example, the gate level language hydrogen 110 is provided because a gate level language is needed to facilitate gate control at a quantum computer 64. Rather than using conventional gate level language such as Quill, cQASM, or Qsharp, the compiler 12 utilizes a novel gate level language (e.g., hydrogen language of gate level module 110 of FIG. 2) that yields complete, or substantially complete, control over its expansion. Moreover, significantly inconsistent results are realized during compilation when using conventional lower level languages. In some embodiments, the hydrogen language of a gate level module 110, and, optionally, the helium language of the low level module 106, is of most use to those skilled in the art of quantum computing. For instance, to perform quantum experiments, in which one or more circuits is being developed and there is a desire to try different circuits and quantum processors of a quantum computer 64 and experiment at a low level or a gate level in which a subject specifies gates. In some embodiments, at an optional, higher level of the compiler 12, the helium language of the low level module 106 allows for optimization, such as defining various subroutines and related structures. Therefore, in some embodiments, the helium language is considered a more powerful language than the hydrogen language of the gate level module 110 for such kind of low level programming. However, the present disclosure is not limited thereto. The helium language of the low level module 106 is useful in doing characterization type experiments on quantum computers 64, and determining various simple quantum algorithms, variational algorithms, etc. at an advanced gate level. In some embodiments, the helium language of the low level module, like the hydrogen language of the low level module 106, is a language that one skilled in the art of the present disclosure would utilize if conducting computational analysis. Thus, various gate level to hardware level features of the compiler 12 are aimed at specific hardware characterization and related subject matter.

In some embodiments, the higher level language, beryllium, of the high level module 102 is particularly useful to those skilled in the art of quantum algorithms or quantum data structures. Using the beryllium language of the high level module 102, such artisans are able to implement various quantum algorithms, determine how the various quantum algorithms perform on a quantum processor of a target quantum computer 64 and/or a target digital processor of a target digital computer 60, and determine a plurality of resources required for the quantum algorithms. Moreover, in some embodiments, a designer can use the beryllium language to conduct the various quantum algorithms in simulation. This simulation is particularly advantageous. For instance, going from a published quantum algorithm (e.g., in a literature citation) to actual implementation of the quantum algorithm in a language like Quill or cQASM is difficult. A non-limiting example is HHL. HHL based analysis is difficult to implement in a conventional gate level language because of the complex arithmetic needed to implement it, and the controlled rotations based off of values stored in a plurality of qubits or qudits 102 need to be done, as well as various round type queries. The beryllium language of the high level module 102 replaces all of these complex details with a few of lines of code because the beryllium language provides support, such as pointers, to take care of such considerations automatically. Moreover, one of skill in the art of the present disclosure will recognize that some operations in published quantum computing papers that lack detail and state that such operations can be done in kind of linear time. However, many such operations are tedious to bring to realization. To address this problem, the beryllium language of the high level module 102 provides a plurality of tools to define various non-trivial quantum data structures. This is highly advantageous because, as discussed above, non-trivial quantum data structures can serve to simplify algorithms that make use of them to solve many computational problems. Accordingly, the beryllium language of the high level module 102 allows a designer to further explore various quantum data structures by making the various quantum data structures far less tedious to set up on a target quantum processor of a target quantum computer 64.

As such, the beryllium language of the high level module 102 allows a designer to define new data structures and new data classes, such that that these new data structures/data classes can be called in source code at a higher level (e.g., a carbon language of unified level module 14 of FIG. 2).

The beryllium language of the high level module 102 is capable of writing libraries that can be programmed using digital constructs. Accordingly, an aspect of the beryllium language of the high level module is to build software tools such that a quantum computer 64 is more easily programmable, and to allow a wider audience to do useful quantum computing programming. Because of the support provided by the beryllium, carbon, hydrogen language, and, optionally, helium language of compiler 12, a designer is able to build software that is more complex. Moreover, the beryllium language of the high level module and the carbon language of the low level module allow for accessible quantum computing by abstracting away various quantum mechanics aspects of a quantum computation. Therefore, the systems and methods of the present disclosure allow for one skilled in the art of digital computer 60 programming to produce meaningful code and computations utilizing a quantum computer 64.

CONCLUSION AND REFERENCES CITED

All references cited herein are incorporated herein by reference in their entirety and for all purposes to the same extent as if each individual publication or patent or patent application was specifically and individually indicated to be incorporated by reference in its entirety for all purposes.

The present invention can be implemented as a computer program product that comprises a computer program mechanism embedded in a non-transitory computer readable storage medium. For instance, the computer program product could contain the program modules shown in any combination of FIG. 1 or 2 or described in FIGS. 3 through 37B. These program modules can be stored on a CD-ROM, DVD, magnetic disk storage product, USB key, or any other non-transitory computer readable data or program storage product.

The foregoing description, for purpose of explanation, has been described with reference to specific implementations. However, the illustrative discussions above are not intended to be exhaustive or to limit the invention to the precise forms disclosed. Many modifications and variations are possible in view of the above teachings. The implementations described herein were chosen and described in order to best explain the principles of the invention and its practical applications, to thereby enable others skilled in the art to best utilize the invention and various implementations with various modifications as are suited to the particular use contemplated.

What is claimed is:

1. A digital computer system for compiling a computer program for a target quantum processor comprising a plurality of qubits, qudits, or quantum continuous variables, the computer system comprising:
   one or more digital processors;
   a memory; and
   one or more programs in the form of a compiler, wherein the compiler comprises:
   (A) instructions for obtaining a computer program written in a unified language and performing code refactoring on all or a portion of the computer program to form a refactored code and converting the refactored code into a first code;
   (B) instructions for compiling the first code into a second code, wherein the second code comprises a plurality of data elements in one or more quantum data structures determined by the compiler from one or more digital datatypes determined by the compiler from one or more digital datatypes in the first code; and
   (C) instructions for compiling the second code into a third code expressed in a quantum gate-level language in accordance with an instruction set and one or more gate locality constraints of the target quantum processor, wherein the quantum gate-level language uses a plurality of different gates, wherein each respective gate in the plurality of different gates is defined in a different data structure that includes a name of the respective gate, a dimension of the respective gate in terms of number of qubits or qudits, and a corresponding plurality of Kraus operators for the respective gate.

2. The computer system of claim 1, wherein the compiler further comprises instructions for converting the second code to a fourth code comprising a series of quantum gate level operations, and wherein the instructions for compiling the second code into the third code further includes instructions for compiling the fourth code into the third code.

3. The computer system of claim 2, wherein the fourth code supports general positive operator-valued measures of one or more qubits, qudits, or quantum continuous variables in the plurality of qubits, qudits, or quantum continuous variables.

4. The computer system of claim 2, wherein the compiler compiles the fourth code into the third code at least in part by performing gate synthesis in which a sequence of ideal gates, which implement at least a portion of the fourth code, are swapped with a sequence of gates that differ from the sequence of ideal gates but will perform the function, or substantially the same function, of the sequence of ideal gates on the target quantum processor.

5. The computer system of claim 4, wherein the sequence of gates that differ from the sequence of ideal gates are identified by a stored hardware characterization of the target quantum processor.

6. The computer system according to claim 1, wherein the compiler performs code refactoring at least in part by replacing a source loop in the computer program written in the unified language with a plurality of loops that collectively accomplish a result of the source loop, and wherein a complexity of each loop in the plurality of loops is less than that of the source loop, and the compiler performs code refactoring at least in part by analytically solving a loop in the plurality of loops.

7. The computer system of claim 1, wherein the compiler:
provides access to quantum gate level commands specified in the first code, and
supports pointers that are encoded on qubits, qudits, or quantum continuous variables in the plurality of qubits, qudits or quantum continuous variables, functions, loops that cannot be unrolled, recursion, pointers, data structure definitions, class object definitions located in the first code, or a combination thereof.

8. The computer system of claim 1, wherein the first code defines a quantum data structure.

9. The computer system of claim 8, wherein the quantum data structure is a graph data structure or a matrix.

10. The computer system of claim 1, wherein the unified language is limited to digital instructions.

11. The computer system of claim 1, wherein the second code is written in a gate level language that is augmented with a conditional and wherein the second code includes a conditional.

12. The computer system of claim 11, wherein the conditional is an if condition or repeat condition in which an action is repeated until a predetermined condition is achieved.

13. The computer system of claim 12, wherein the predetermined condition is a digital measurement outcome for one or more qubits, qudits, or quantum continuous variables defined by the second code.

14. The computer system of claim 12, wherein the gate level language is augmented with support for a subroutine, in which one portion of the second code is repeatedly called by another portion of the second code until a predetermined outcome is achieved.

15. The computer system of claim 14, wherein the subroutine is a measurement subroutine.

16. The computer system of claim 15, wherein the plurality of qubits, qudits, or quantum continuous variables is a plurality of qubits or qudits and the measurement subroutine makes use of ancilla qubits or qudits in the plurality of qubits or qudits to improve a measurement outcome.

17. The computer system of claim 14, wherein the predetermined outcome is a measurement outcome for one or more qubits or qudits defined by the second code.

18. The computer system of claim 11, wherein the conditional is a parameter of an increment loop.

19. The computer system of claim 11, wherein the compiler converts the second code to the third code at least in part by optimizing a quantum operation that serves to perform a portion of the second code, thereby reducing a number of gates, a number of qubits, a number of qudits, or a number of quantum continuous variables in the third code that are needed to perform the quantum operation.

20. The computer system of claim 11, wherein the gate level language supports qubit, qudit, or quantum continuous variable measurement.

21. The computer system of claim 1, wherein the second code defines a qubit, qudit, or quantum continuous variable within the target quantum processor.

22. The computer system of claim 1, wherein the second code defines a register of qubits or a register of qudits within the target quantum processor.

23. The computer system of claim 1, wherein a subset of Kraus operators in the corresponding plurality of Kraus operators for the respective gate is specified by a function handle.

24. The computer system of claim 1, wherein the compiler further comprises instructions for counting a number of gates, qubits, qudits, quantum continuous variables or wall clock time needed to implement the computer program on the target quantum processor.

25. The computer system of claim 1, wherein the compiler further comprises instructions for implementing a first portion of the computer program on the target quantum processor and a second portion of the computer program on a digital central processing unit or a graphical processing unit of a digital computer system.

26. The computer system of claim 1, wherein the compiler further comprises instructions for simulating quantum code generated by the compiler on a digital central processing unit or a graphical processing unit of a digital computer system.

27. A digital computer system for compiling a computer program for a target quantum processor comprising a plurality of qubits, qudits, or quantum continuous variables, the computer system comprising:
one or more digital processors;
a memory; and
one or more programs in the form of a compiler, wherein the compiler comprises:
(A) instructions for obtaining a computer program written in a unified language and performing code refactoring on all or a portion of the computer program to form a refactored code and converting the refactored code into a first code;
(B) instructions for compiling the first code into a second code, wherein the second code comprises a plurality of data elements in one or more quantum data structures determined by the compiler from one or more digital datatypes determined by the compiler from one or more digital datatypes in the first code; and
(C) instructions for compiling the second code into a third code expressed in a quantum gate-level language in accordance with an instruction set and one or more gate locality constraints of the target quantum processor, wherein
the compiler performs code refactoring at least in part by replacing a source loop in the computer program written in the unified language with a plurality of loops that collectively accomplish a result of the source loop, and wherein a complexity of each loop in the plurality of loops is less than that of the source loop, and
the compiler performs code refactoring at least in part by replacing a loop in the plurality of loops with an object constructor call.

28. A digital computer system for compiling a computer program for a target quantum processor comprising a plurality of qubits, qudits, or quantum continuous variables, the computer system comprising:
one or more digital processors;
a memory; and
one or more programs in the form of a compiler, wherein the compiler comprises:
(A) instructions for obtaining a computer program written in a unified language and performing code refactoring on all or a portion of the computer program to form a refactored code and converting the refactored code into a first code;
(B) instructions for compiling the first code into a second code, wherein the second code comprises a plurality of data elements in one or more quantum data structures determined by the compiler from one or more digital datatypes determined by the compiler from one or more digital datatypes in the first code; and (C) instructions for compiling the second code into a third code expressed in a quantum gate-level language in accordance with an instruction set and one or more gate locality constraints of the target quantum processor; wherein the compiler performs code refactoring by encoding a portion of the computer program written in the unified language to perform a quantum algorithm that performs a function of the portion of the computer program; and the quantum algorithm is an amplitude amplification-based quantum algorithm.

29. A digital computer system for compiling a computer program for a target quantum processor comprising a plurality of qubits, qudits, or quantum continuous variables, the computer system comprising:

one or more digital processors;

a memory; and one or more programs in the form of a compiler, wherein the compiler comprises:

(A) instructions for obtaining a computer program written in a unified language and performing code refactoring on all or a portion of the computer program to form a refactored code and converting the refactored code into a first code;

(B) instructions for compiling the first code into a second code, wherein the second code comprises a plurality of data elements in one or more quantum data structures determined by the compiler from one or more digital datatypes determined by the compiler from one or more digital datatypes in the first code; and (C) instructions for compiling the second code into a third code expressed in a quantum gate-level language in accordance with an instruction set and one or more gate locality constraints of the target quantum processor, wherein the second code is written in a gate level language that is augmented with a conditional and wherein the second code includes a conditional, and the compiler converts the second code to the third code at least in part by:
  optimizing code within the conditional to form an optimized conditional, wherein an iteration of a code sequence specified by the optimized conditional has fewer instructions than an iteration of a code sequence specified by the conditional,
  unrolling the optimized conditional into a series of quantum gates, and
  incorporating the series of quantum gates into the third code.

30. A digital computer system for compiling a computer program for a target quantum processor comprising a plurality of qubits, qudits, or quantum continuous variables, the computer system comprising:

one or more digital processors;

a memory; and one or more programs in the form of a compiler, wherein the compiler comprises:

(A) instructions for obtaining a computer program written in a unified language and performing code refactoring on all or a portion of the computer program to form a refactored code and converting the refactored code into a first code;

(B) instructions for compiling the first code into a second code, wherein the second code comprises a plurality of data elements in one or more quantum data structures determined by the compiler from one or more digital datatypes determined by the compiler from one or more digital datatypes in the first code; and (C) instructions for compiling the second code into a third code expressed in a quantum gate-level language in accordance with an instruction set and one or more gate locality constraints of the target quantum processor, wherein the compiler further comprises instructions for circuit embedding of the third code in accordance with one or more locality constraints of the target quantum processor, and the instructions for circuit embedding of the third code in accordance with the one or more locality constraints of the target quantum processor comprises taking into account a determined quality of the target quantum processor at performing 2-qubit gates or 2-qudit gates.

31. A method for compiling a computer program that can be run on a target quantum processor, the target quantum processor comprising a plurality of qubits, qudits, or quantum continuous variables, the method comprising:

at a digital computer system comprising one or more digital processors and a memory, the memory comprising non-transitory instructions configured to perform a procedure using the one or more digital processors, the procedure comprising:

(A) obtaining a computer program written in a unified language;

(B) performing code refactoring on all or a portion of the computer program to form a refactored code;

(C) converting the refactored code into a first code;

(D) compiling the first code into a second code, wherein the second code comprises a plurality of data elements in one or more quantum data structures determined by a compiler from one or more digital datatypes in the first code; and (E) compiling the second code into a third code expressed in a quantum gate-level language in accordance with an instruction set and one or more gate locality constraints of the target quantum processor, wherein the quantum gate-level language uses a plurality of different gates, wherein each respective gate in the plurality of different gates is defined in a different data structure that includes a name of the respective gate, a dimension of the respective gate in terms of number of qubits or qudits, and a corresponding plurality of Kraus operators for the respective gate.

32. A non-transitory computer readable storage medium storing one or more programs, the one or more programs comprising instructions, which when executed by a digital computer system with one or more digital processors, cause the digital computer system to:

(A) obtain a computer program written in a unified language;

(B) perform code refactoring on all or a portion of the computer program to form a refactored code;

(C) convert the refactored code into a first code;

(D) compile the first code into a second code, wherein the second code comprises a plurality of data elements in one or more quantum data structures determined by a high level module from one or more digital datatypes in the first code; and (E) compiling the second code into a third code expressed in a quantum gate-level language in accordance with an instruction set and one or more gate locality constraints of a target quantum processor, wherein the quantum gate-level language uses a plurality of different gates, wherein each respective gate in the plurality of different gates is defined in a different data structure that includes a name of the respective gate, a dimension of the respective gate in terms of number of qubits or qudits, and a corresponding plurality of Kraus operators for the respective gate.

* * * * *